(12) United States Patent
Naganuma et al.

(10) Patent No.: US 8,759,687 B2
(45) Date of Patent: Jun. 24, 2014

(54) FLEX-RIGID WIRING BOARD AND METHOD FOR MANUFACTURING THE SAME

(75) Inventors: Nobuyuki Naganuma, Ogaki (JP); Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 634 days.

(21) Appl. No.: 12/948,882

(22) Filed: Nov. 18, 2010

(65) Prior Publication Data

US 2011/0198111 A1 Aug. 18, 2011

Related U.S. Application Data

(60) Provisional application No. 61/304,186, filed on Feb. 12, 2010.

(51) Int. Cl.
*H05K 1/03* (2006.01)

(52) U.S. Cl.
USPC .......................................... 174/255

(58) Field of Classification Search
USPC .......................................... 29/829
See application file for complete search history.

(56) References Cited

U.S. PATENT DOCUMENTS

| | | | |
|---|---|---|---|
| 7,815,441 B2 * | 10/2010 | Kobayashi et al. | 439/67 |
| 2004/0112632 A1 | 6/2004 | Michiwaki et al. | |
| 2006/0019075 A1 | 1/2006 | Myoung et al. | |
| 2008/0093118 A1 * | 4/2008 | Takahashi et al. | 174/264 |
| 2008/0099230 A1 | 5/2008 | Takahashi et al. | |

FOREIGN PATENT DOCUMENTS

| | | |
|---|---|---|
| CN | 1507312 A | 6/2004 |
| CN | 101583237 A | 11/2009 |
| JP | 07-058424 | 3/1995 |
| JP | 2004-319962 | 11/2004 |
| JP | 2005-101430 A | 4/2005 |
| JP | 2005-244024 | 9/2005 |
| JP | 2006-32644 A | 2/2006 |
| JP | 2006-156502 | 6/2006 |
| JP | 2006-202891 A | 8/2006 |
| JP | 4021472 B1 | 10/2007 |

OTHER PUBLICATIONS

U.S. Appl. No. 12/873,944, filed Sep. 1, 2010, Naganuma, et al.
U.S. Appl. No. 12/894,777, filed Sep. 30, 2010, Naganuma, et al.
U.S. Appl. No. 12/949,078, filed Nov. 18, 2010, Naganuma, et al.

* cited by examiner

*Primary Examiner* — Ishwarbhai B Patel
(74) *Attorney, Agent, or Firm* — Oblon, Spivak, McClelland, Maier & Neustadt, L.L.P.

(57) ABSTRACT

A flex-rigid wiring board includes an insulative substrate, a flexible wiring board positioned beside the insulative substrate, and an insulation layer positioned over the insulative substrate and the flexible wiring board and exposing at least a portion of the flexible wiring board. The flexible wiring board has a tapered portion which is made thinner toward the insulative substrate at an end portion of the flexible wiring board positioned beside the insulative substrate.

44 Claims, 54 Drawing Sheets

ND METHOD
FLEX-RIGID WIRING BOARD AND METHOD FOR MANUFACTURING THE SAME

CROSS-REFERENCE TO RELATED APPLICATIONS

The present application claims the benefits of priority to U.S. Application No. 61/304,186, filed Feb. 12, 2010. The contents of that application are incorporated herein by reference in their entirety.

BACKGROUND OF THE INVENTION

1. Field of the Invention

The present invention relates to a bendable wiring board structured partly with a flexible substrate and to a method for manufacturing such a wiring board.

2. Discussion of the Background

In Japanese Laid-Open Patent Application No. 2004-319962, a flex-rigid wiring board is described where a flexible section and rigid sections are integrated by coating a resin sheet on both surfaces of rigid substrates. The photosensitive resin sheet forming the flexible section is removed by using a photolithographic technique. In Japanese Laid-Open Patent Application No. H7-58424, a flex-rigid wiring board is described where an adhesive sheet and rigid material are laminated in that order on both surfaces of a flexible wiring board. Cover film is positioned on a conductive pattern (wiring layer) of the flexible wiring board. In Japanese Laid-Open Patent Application No. 2005-244024, a flex-rigid wiring board having a bent flexible wiring board is described. The conductive pattern on the flexible wiring board is bent and coats rigid sections. In Japanese Laid-Open Patent Application No. 2006-156502, a flex-rigid wiring board is described where a bent conductive pattern is arranged from a flexible section through rigid sections. In Japanese Patent Publication No. 4021472, a flex-rigid wiring board is described where a wiring pattern is positioned near the boundary between a rigid section and a flexible section.

The contents of Japanese Laid-Open Patent Application Nos. 2004-319962, H7-58424, 2005-244024 and 2006-156502, and Japanese Patent Publication No. 4021472 are incorporated herein by reference in their entirety in the present application.

SUMMARY OF THE INVENTION

According to one aspect of the present invention, a flex-rigid wiring board includes an insulative substrate, a flexible wiring board positioned beside the insulative substrate, and an insulation layer positioned over the insulative substrate and the flexible wiring board and exposing at least a portion of the flexible wiring board. The flexible wiring board has a tapered portion which is made thinner toward the insulative substrate at an end portion of the flexible wiring board positioned beside the insulative substrate.

According to another aspect of the present invention, a method for manufacturing a flex-rigid wiring board includes providing a flexible wiring board having a flexible substrate, a first wiring layer on one surface of the flexible substrate, a second wiring layer on the opposite surface of the flexible substrate, a first coverlay on the first wiring layer and a second coverlay on the second wiring layer, the flexible wiring board having an end portion which does not have the first wiring layer between the flexible substrate and the first coverlay and does not have the second wiring layer between the flexible substrate and the second coverlay, forming a laminated body including an insulative substrate, a flexible wiring board and an insulation layer such that the tapered portion of the flexible wiring board and an end portion of the insulative substrate are positioned side by side, that the insulation layer is positioned over the insulative substrate and the flexible wiring board and that at least a portion of the flexible wiring board is exposed by the insulation layer, and pressing the laminated body such that the insulative substrate, the flexible wiring board and the insulation layer are integrated while a thickness of the flexible wiring board at the end portion of the flexible wiring board beside the insulative substrate is reduced.

According to yet another embodiment of the present invention, a method for manufacturing a flex-rigid wiring board includes providing a flexible wiring board having a tapered portion which is made thinner at an end portion of the flexible wiring board, forming a laminated body including an insulative substrate, the flexible wiring board and an insulation layer such that the tapered portion of the flexible wiring board and an end portion of the insulative substrate are positioned side by side, that the insulation layer is positioned over the insulative substrate and the flexible wiring board and that at least a portion of the flexible wiring board is exposed by the insulation layer, and pressing the laminated body such that the insulative substrate, the flexible wiring board and the insulation layer are integrated.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 43A is a view showing a first alternative example of a horizontal cross-sectional shape of a connection conductor or the like;

FIG. 43B is a view showing a second alternative example of a horizontal cross-sectional shape of a connection conductor or the like;

FIG. 43C is a view showing a third alternative example of a horizontal cross-sectional shape of a connection conductor or the like;

DETAILED DESCRIPTION OF THE EMBODIMENTS

Figure 1:
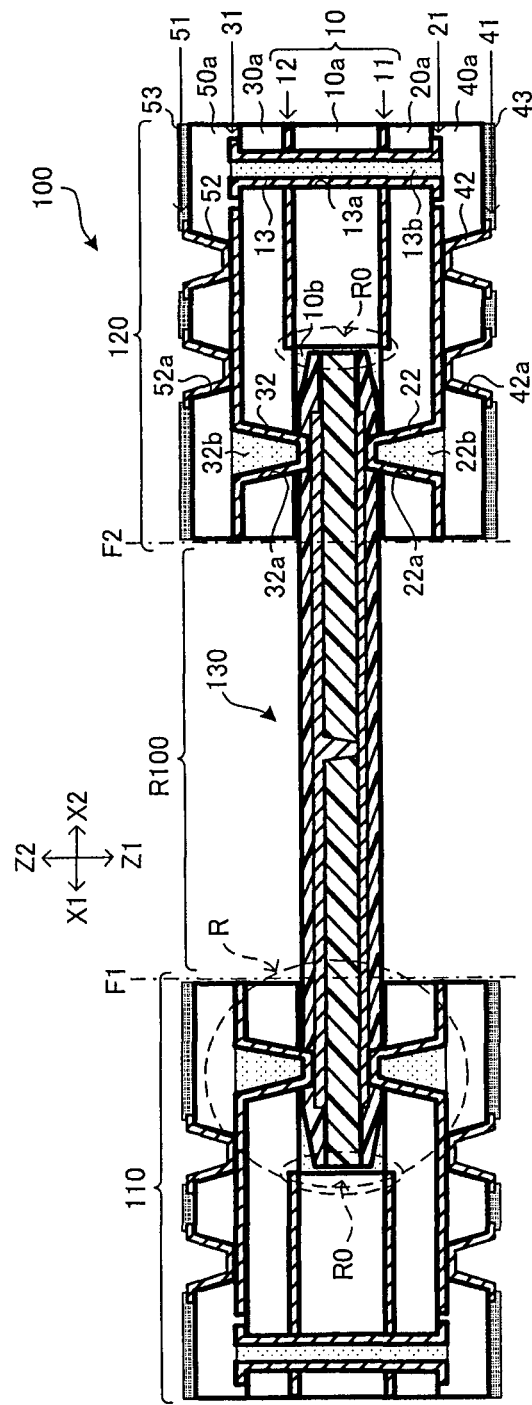
FIG. 1 is a cross-sectional view of a flex-rigid wiring board according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Also, side surfaces of a wiring board are on the X-Z plane or the Y-Z plane.

Regarding connection conductors and their holes, a cross section perpendicular to directions Z (X-Y plane) is referred to as a horizontal cross section. Also, a cross section parallel to directions Z (X-Z plane or Y-Z plane) is referred to as a vertical cross section.

In the present embodiments, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or the inner-layer side), and the side farther away from the core is referred to as an upper layer (or the outer-layer side).

Aside from a layer including a conductive pattern that functions as wiring such as circuits (including ground), a layer with only a plain pattern is also referred to as a wiring layer. Among the conductors formed inside holes, the conductive film formed on wall surfaces (side and bottom surfaces) of a hole is referred to as a conformal conductor, and the conductor that is filled in a hole is referred to as a filled conductor. Wiring layers may also include lands of connection conductors or the like along with the above conductive patterns.

Plating indicates depositing conductors (such as metal) to form layers on the surfaces of metal, resin or the like, as well as the deposited conductive layers (such as metal layers). Other than wet plating such as electrolytic plating and electroless plating, plating also includes dry plating such as PVD (physical vapor deposition) and CVD (chemical vapor deposition).

Unless specifically indicated, the "width" of a hole or a cylinder (protruding portion) indicates the diameter if it is a circle, and $2\sqrt{(\text{cross sectional area}/\pi)}$ if it is other than a circle. If a hole or a cylinder (protruding portion) tapers, whether "widths" in two or more holes or protruding portions are the same or not the same may be determined by comparing the values, average values, maximum values or the like of corresponding portions. Regarding a line pattern formed on a surface, among the directions perpendicular to the line, the measurement in a direction parallel to the surface on which the line is formed is referred to as "width," and the measurement in a direction perpendicular to the surface on which the line is formed is referred to as "height" or "thickness." In addition, the measurement from one end of the line to the other end is referred to as "length." However, measurements are not limited to the above definitions if they are clearly indicated otherwise.

First Embodiment

Figure 2:
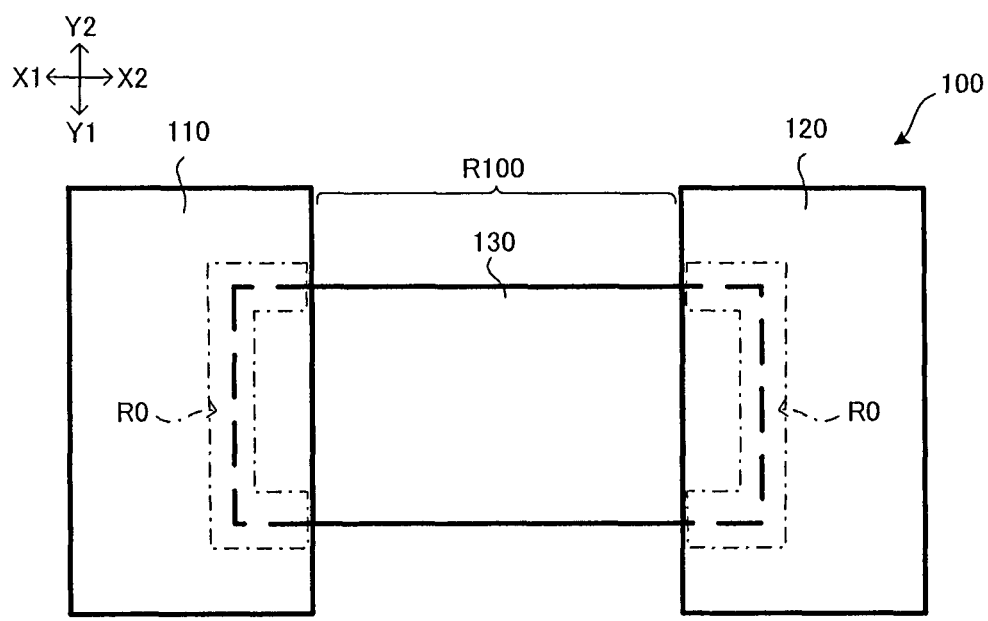
FIG. 2 is a plan view of the flex-rigid wiring board according to the first embodiment of the present invention.

Flex-rigid wiring board 100 of the present embodiment is a printed wiring board. As shown in FIG. 1 (cross-sectional view) and FIG. 2 (plan view), flex-rigid wiring board 100 has rigid sections (110, 120) and flexible wiring board 130. Rigid section 110 and rigid section 120 are connected to each other by means of flexible wiring board 130. Namely, rigid section 110 and rigid section 120 face each other by sandwiching flexible wiring board 130. Specifically, both end portions of flexible wiring board 130 enter rigid sections (110, 120). Then, rigid sections (110, 120) and flexible wiring board 130 are connected to each other in the entered portions. In the drawing, F-R boundary surface (F1) is the surface corresponding to the boundary between rigid section 110 and flexible section (R100), and F-R boundary surface (F2) is the surface corresponding to the boundary between rigid section 120 and flexible section (R100). Also, flexible section (R100) is the flexible section sandwiched between rigid section 110 and rigid section 120, namely, part of flexible wiring board 130 exposed between F-R boundary surface (F1) and F-R boundary surface (F2).

Rigid sections (110, 120) have substrate 10, insulation layers (20a, 30a, 40a, 50a), wiring layers (21, 31, 41, 51), connection conductors (13, 22, 32, 42, 52) and solder-resist layers (43, 53). Substrate 10 is positioned beside (in direction X) flexible wiring board 130. Space may or may not exist between substrate 10 and flexible wiring board 130. Substrate 10 and insulation layers (such as 20a, 30a) on both of its sides correspond to the core section. Insulation layers or the like positioned as upper layers of the core section correspond to built-up sections.

Substrate 10 (core substrate of flex-rigid wiring board 100) has insulation layer (10a) and wiring layers (11, 12).

Insulation layer (10a) is an insulative substrate. The thickness of insulation layer (10a) is 100 μm, for example. The insulative substrate is an insulative material to be used when manufacturing a printed wiring board. Insulation layer (10a) may be formed by impregnating glass cloth or paper with insulative phenol resin, epoxy resin, polyimide, BT resin or the like. Also, insulation layer (10a) may be formed by combining inorganic filler with phenol resin, epoxy resin, polyimide, BT resin or the like. In the present embodiment, insulation layer (10a) is made of epoxy resin. The epoxy resin is preferred to contain a reinforcing material made of inorganic material such as glass fiber (glass fabric or glass non-woven fabric, for example) and aramid fiber (aramid non-woven fabric, for example) impregnated with resin, for example. Such a reinforcing material has a smaller thermal expansion coefficient than the primary material (epoxy resin in the present embodiment).

Figure 3:
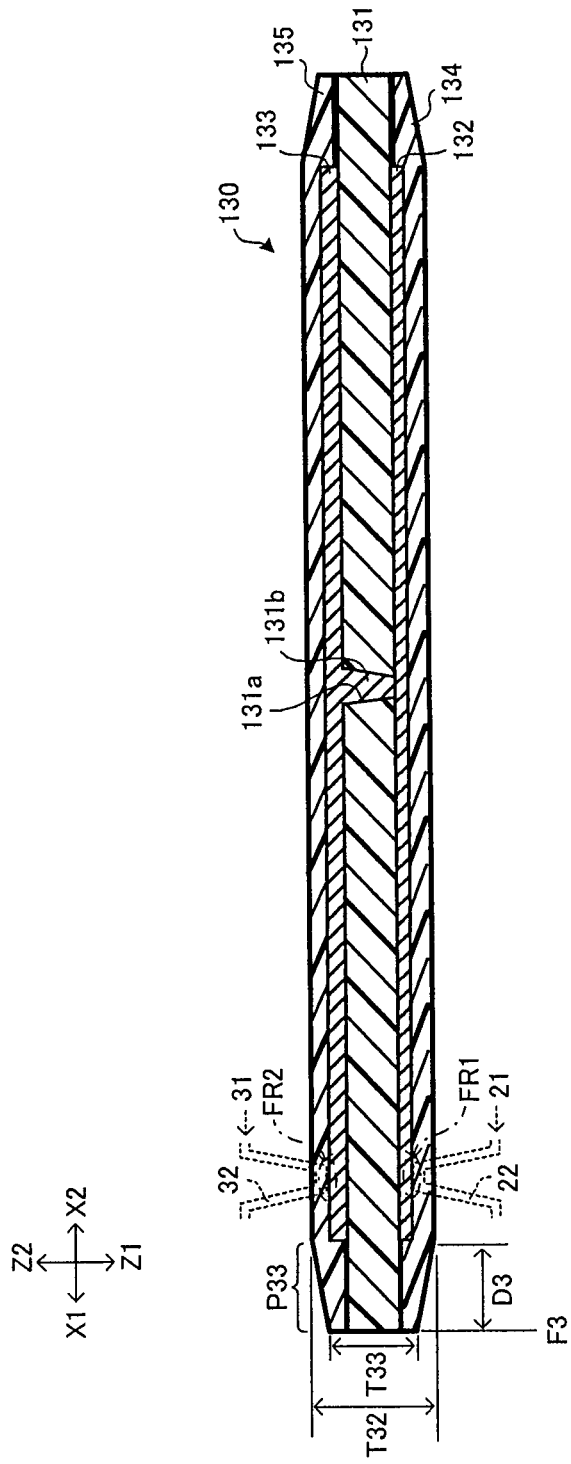
FIG. 3 is a cross-sectional view of a flexible wiring board according to the first embodiment.

Flexible wiring board 130 has flexible substrate 131 (the core substrate of flexible wiring board 130), wiring layers (132, 133) and inner coverlays (134, 135) as shown in FIG. 3, for example.

Flexible wiring board 130 is divided into non-tapered portion (P32) and tapered portion (P33) in lengthwise directions (directions X).

Non-tapered portion (P32) corresponds to a connection portion where conductive patterns (wiring layers 21, 31) on insulation layers (20a, 30a) and flexible wiring board 130 are electrically connected. Namely, later-described F-R connection sections (FR1, FR2) (see FIG. 4) are positioned at non-tapered portions (P32). Thickness (T32) of non-tapered portion (P32) is set to be the sum of flexible substrate 131 and inner coverlays (134, 135), for example, set at 100 μm.

Tapered portion (P33) is arranged on both end portions of flexible wiring board 130. Those end portions are each positioned near insulative substrate (10a) (see FIG. 1). Tapered portion (P33) tapers in such a way that the thickness of flexible wiring board 130 decreases toward an end surface (beside insulative substrate 10a). Namely, the thickness of flexible wiring board 130 changes continuously or intermittently in tapered portion (P33). In the present embodiment, only the thickness of inner coverlays (134, 135) decreases. In addition, as shown in FIG. 3, the thickness of flexible wiring board 130 at tapered portion (P33) changes continuously, more specifically, changes in a straight line. Namely, the first surface and the second surface of tapered portion (P33) are slopes. The gradient of such slopes is not limited specifically. In the present embodiment, the gradient of the slopes is relatively gentle, and the thickness of flexible wiring board 130 at tapered portion (P33) changes gradually. However, the present invention is not limited to such, and the thickness of flexible wiring board 130 at tapered portion (P33) may decrease on a curved line (see later-described FIGS. 37A, 38A). Alternatively, instead of changing continuously, the thickness of flexible wiring board 130 may change intermittently in tapered portion (P33) (see FIGS. 37B, 38B). Yet alternatively, not only inner coverlays (134, 135), but also flexible substrate 131 may become thinner at an end portion of flexible wiring board 130 (see FIGS. 38A, 38B). Yet alternatively, tapered portion (P33) may be arranged only on one end portion of flexible wiring board 130 (see FIG. 69).

Thickness (T33) at the thinnest end surface (F3) in tapered portion (P33) is 90 μm, for example. Length (D3) of tapered portion (P33) is 300 μm, for example.

In the present embodiment, the thinner portion of flexible wiring board 130 (tapered portion P33) is made thinner than a connection portion (non-tapered portion P32) where conductive patterns (wiring layers 21, 31) on insulation layers (20a, 30a) and flexible wiring board 130 are electrically connected. Therefore, the adhered area increases between flexible wiring board 130 and rigid sections (110, 120). Accordingly, it is thought that both end portions of flexible wiring board 130 are firmly connected to rigid sections (110, 120). Also, as a result, it is thought that the connection reliability of F-R connection sections is enhanced.

The thickness (average value) of tapered portion (P33) is preferred to be set at 90% or less of the thickness of non-tapered portion (P32). For example, it is preferred that the thickness of tapered portion (P32) be 90 μm and the thickness of non-tapered portion (P32) be 100 μm. In such a structure, it is thought that effects such as enhancing the above-mentioned connection reliability or the like is expected to be better.

Flexible substrate 131 is made of insulative polyimide or liquid-crystal polymer, for example. The thickness of flexible substrate 131 is set at 20-50 μm, for example, preferably at approximately 25 μm.

Wiring layer 132 is formed on the first surface of flexible substrate 131, and wiring layer 133 is formed on the second surface of flexible substrate 131. Wiring layers (132, 133) include striped wiring which connects the wiring of rigid section 110 and the wiring of rigid section 120 to each other, for example. Wiring layers (132, 133) are made of copper, for example. In the present embodiment, wiring layer 133 is thicker than wiring layer 132. However, the present invention is not limited to such; for example, the thickness of wiring layer 132 and the thickness of wiring layer 133 may be set to be the same (see later-described FIG. 59A).

Inner coverlays (134, 135) are formed on flexible substrate 131. Inner coverlays (134, 135) coat wiring layers (132, 133) respectively and insulate them from the outside. Inner coverlays (134, 135) are made of polyimide, for example.

Flexible substrate 131 has connection conductor (131b). In particular, hole (131a) is formed in flexible substrate 131. Connection conductor (131b) is formed by filling copper plating in hole (131a). Wiring layer 132 and wiring layer 133 are electrically connected by means of connection conductor (131b).

As shown in FIG. 1, insulation layers (20a, 30a) are positioned on boundary portion (R0) between insulation layer (10a) and flexible wiring board 130 respectively, and expose flexible section (R100). Among them, insulation layer (20a) is laminated on the first-surface side of an end portion in flexible wiring board 130 and of insulation layer (10a). Specifically, insulation layer (20a) of rigid section 110 is laminated on the first-surface side of the X1-side end portion of flexible wiring board 130, and insulation layer (20a) of rigid section 120 is laminated on the first-surface side of the X2-side end portion of flexible wiring board 130. Meanwhile, insulation layer (30a) is laminated on the second-surface side of an end portion in flexible wiring board 130 and of insulation layer (10a). Specifically, insulation layer (30a) of rigid section 110 is laminated on the second-surface side of the X1-side end portion of flexible wiring board 130, and insulation layer (30a) of rigid section 120 is laminated on the second-surface side of the X2-side end portion of flexible wiring board 130.

Hole (22a) is formed in insulation layer (20a), and hole (32a) is formed in insulation layer (30a). Connection conductors (22, 32) made of copper plating, for example, are formed on the wall surfaces of holes (22a, 32a) respectively, and insulative bodies (22b, 32b) are filled inside. Connection conductors (22, 32) are conformal conductors. However, connection conductors (22, 32) are not limited to such, and they may be filled conductors, for example (see later-described FIG. 39A).

Through hole (13a) is formed in insulation layers (10a, 20a, 30a). Connection conductor 13 made of copper plating, for example, is formed on the wall surface of through hole (13a), and insulative body (13b) is filled inside. Connection conductor 13 is a conformal conductor. However, connection conductor 13 is not limited to such, and it may be a filled conductor, for example. Wiring layer 21 and wiring layer 31 are electrically connected to each other by means of connection conductor 13.

Figure 4:
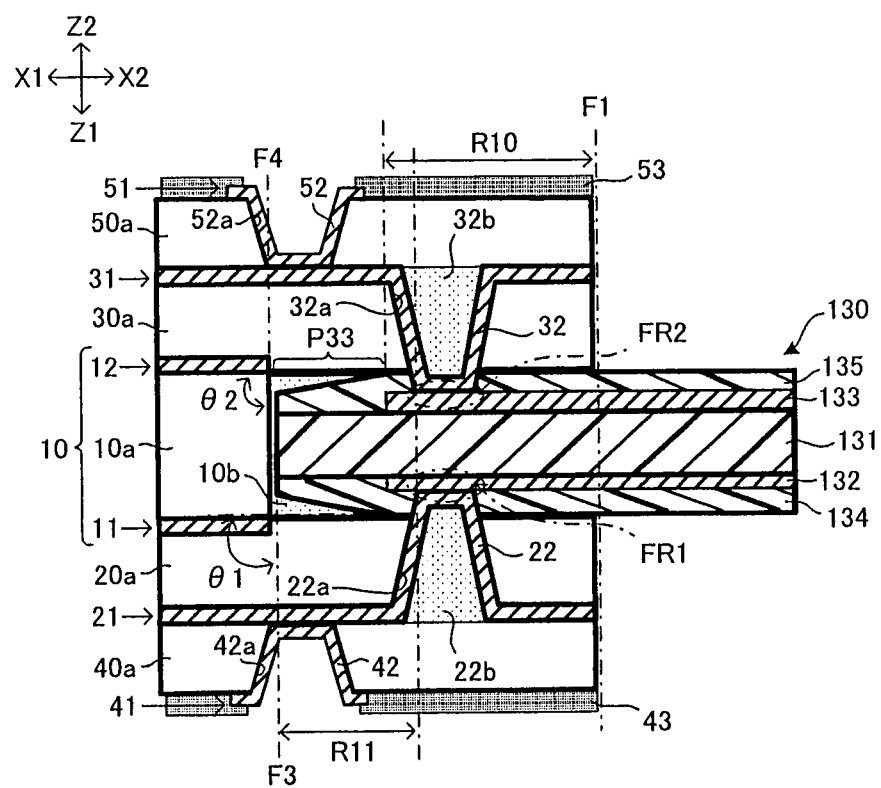
FIG. 4 is a magnified cross-sectional view showing part of a region in FIG. 1.

FIG. 4 is a magnified view of region "R" in FIG. 1 (connection section between rigid section 110 and flexible wiring board 130). The structure of the connection section between rigid section 120 and flexible wiring board 130 is the same as the structure of the connection section between rigid section 110 and flexible wiring board 130. Hereinafter, the connection sections between flexible wiring board 130 and rigid sections (110, 120) are referred to as F-R connection sections.

As shown in FIG. 4, flexible wiring board 130 is positioned beside insulation layer (10a) (direction X). The thickness of insulation layer (10a) and the thickness of flexible wiring board 130 are set to be substantially the same. In the space partitioned by flexible wiring board 130 and insulation layers (10a, 20a, 30a) (the clearance among such members), resin (10b) is filled. Resin (10b) is flowed from the surrounding insulation layers (such as insulation layers 20a, 30a) by pressing, for example, and is cured to be integrated with the surrounding insulation layers. Insulation layers (20a, 30a) sandwich the end portion of flexible wiring board 130 and are laminated and connected to inner coverlays (134, 135) in region (R10).

As described previously, connection conductor 22 is formed in insulation layer (20a), and connection conductor 32 is formed in insulation layer (30a). Connection conductor 22 is connected to both wiring layer 132 and wiring layer 21, and connection conductor 32 is connected to both wiring layer 133 and wiring layer 31. Accordingly, wiring layer 21 is electrically connected to wiring layer 132 included in flexible wiring board 130 by means of connection conductor 22 in insulation layer (20a). Also, wiring layer 31 is electrically connected to wiring layer 133 included in flexible wiring board 130 by means of connection conductor 32 in insulation layer (30a).

In flex-rigid wiring board 100 of the present embodiment, rigid sections (110, 120) and flexible wiring board 130 are electrically connected without using connectors. Thus, even if the impact of being dropped or the like is received, connection failure due to detached connectors does not occur.

By the end portions of flexible wiring board 130 entered (embedded) into rigid sections (110, 120) respectively, rigid section 110 and rigid section 120 are electrically connected to each other at the entered portions (embedded portions). Accordingly, their connections are strong.

Flexible wiring board 130 is thinner at an end portion beside insulative substrate (10a). Namely, tapered portion (P33) is positioned at an end portion of flexible wiring board 130 beside insulative substrate (10a). Tapered portion (P33) is positioned closer to insulation layer (10a) than are connection conductors (22, 32) (F-R connection sections FR1, FR2); more specifically, it is positioned between connection conductors (22, 32) (F-R connection sections FR1, FR2) and end surface (F3) of flexible wiring board 130 (hereinafter referred to as range R11). In tapered portion (P33), the thickness of flexible wiring board 130 decreases as it comes closer to insulation layer (10a).

Flexible wiring board 130 in flex-rigid wiring board 100 according to the present embodiment has tapered portions (P33) (end portions of flexible wiring board 130 beside insulation layer 10a) where portions entered into rigid sections (110, 120) are thinner. Therefore, adhered areas increase between flexible wiring board 130 and rigid sections (110, 120). Accordingly, it is thought that both end portions of flexible wiring board 130 become firmly connected with rigid sections (110, 120). Also, as a result, connection reliability improves in the F-R connection sections.

In the present embodiment, in flexible wiring board 130, end surface (F3) beside insulation layer (10a) intersects with the main surfaces of flexible wiring board 130 at a right angle (angle θ1=90°. However, the angle of end surface (F3) is not limited to such, and it may be inclined (see later-described FIG. 29 and FIGS. 31-33).

In the present embodiment, in insulation layer (10a), end surface (F4) beside flexible wiring board 130 intersects with the main surfaces of insulation layer (10a) at a right angle (angle θ2=90°. However, the angle of end surface (F4) is not limited to such, and it may be inclined (see later-described FIGS. 30-33).

Figure 5A:
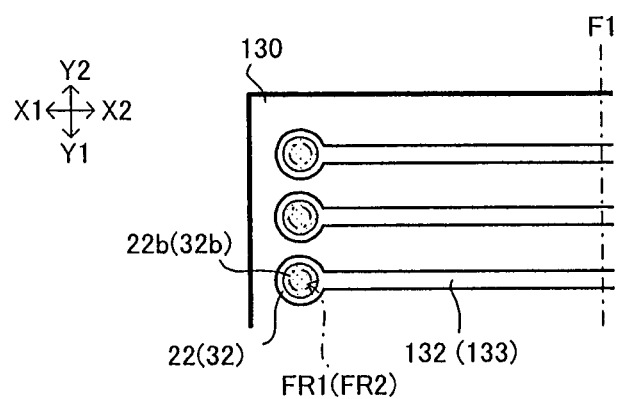
FIG. 5A is a view showing an example where wiring layers near an F-R connection section are formed straight.
Figure 5B:
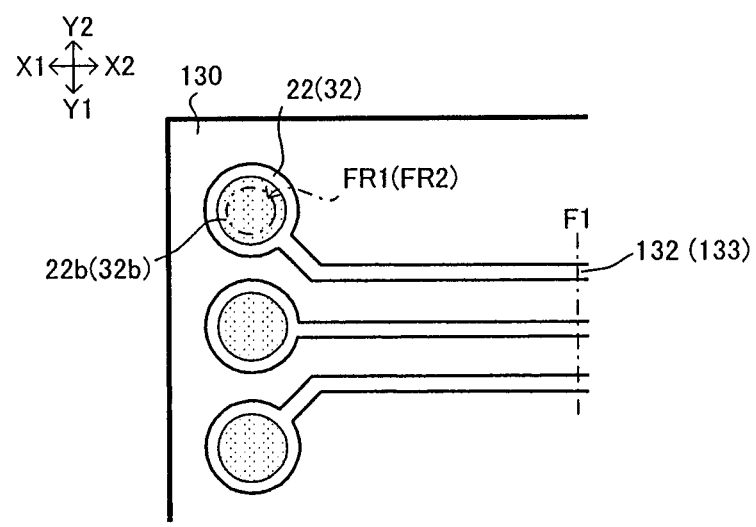
FIG. 5B is a view showing an example where wiring layers are formed to fan out near an F-R connection section.

As shown in FIGS. 4, 5A and 5B, connection conductor 22 (or hole 22a) is formed to be a tapered cylinder, widening from the second-surface side toward the first-surface side. Connection conductor 32 (or hole 32a) is formed to be a tapered cylinder, widening from the first-surface side toward the second-surface side. However, connection conductor 22 and the like are not limited to such, and they may be formed freely (see later-described FIGS. 43A-44B).

In flex-rigid wiring board 100 of the present embodiment, F-R connection section (FR1) and F-R connection section (FR2) face each other when they are seen on the X-Y plane. Accordingly, it is thought that both end portions of flexible wiring board 130 are sandwiched and held more firmly. Even if F-R connection section (FR1) and F-R connection section (FR2) do not face each other completely, if only either F-R connection section (FR1) or (FR2) faces at least part of the other, it is thought that substantially the same effect is achieved. Also, connection conductor 22 and connection conductor 32 may be positioned away from axis Z (shifted in direction X or direction Y, for example). In such a case, F-R connection section (FR1) and F-R connection section (FR2) do not face each other.

Also, wiring layer 21 and connection conductor 22 are set to be a contiguous conductor. Accordingly, compared with situations in which wiring layer 21 and connection conductor 22 are formed intermittently (see later-described FIG. 39B), it is thought that both end portions of flexible wiring board 130 are sandwiched and held more firmly. The same applies to wiring layer 31 and connection conductor 32.

Moreover, connection conductors (22, 32) are made of plating. Accordingly, it is thought that both end portions of flexible wiring board 130 are sandwiched and held more firmly than in situations in which connection conductors (22, 32) are made of conductive paste (see later-described FIG. 39B).

Connection conductors (22, 32) are conductors in holes (22a, 32a), which penetrate only through their respective insulation layers (20a, 30a), so called via holes. Such a structure is advantageous to enhance connection reliability between flexible wiring board 130 and rigid section 110 or 120. However, the present invention is not limited to such, and a conductor of flexible wiring board 130 and a conductive pattern on connection conductor 22 or 32 may be electrically connected by a conductor in a hole that penetrates through multiple layers (see later-described FIGS. 40A, 40B).

Conductive patterns on both surfaces of flexible wiring board 130 are electrically connected to conductive patterns (wiring layers 21, 31) in rigid sections (110, 120) by means of connection conductors (22, 32). However, the present invention is not limited to such, and only the conductive pattern on one surface of flexible wiring board 130 may be electrically connected to a conductive pattern (wiring layer 21 or 31) in rigid sections (110, 120) by means of connection conductor 22 or 32 (see later-described FIG. 41).

Basically, conductive patterns (wiring layers 132, 133) of flexible wiring board 130 may be formed freely. Therefore, wiring layers (132, 133) near F-R connection sections (FR1, FR2) may be formed straight as shown in FIG. 5A, for example. However, to enhance connection reliability at F-R connection sections (FR1, FR2), as shown in FIG. 5B, for example, it is preferred that wiring layers (132, 133) be formed to fan out near F-R connection sections (FR1, FR2), namely, that terminal pitches be formed to fan out. By setting so, the distance between adjacent wiring lines is secured and interference between wiring lines is suppressed. Accordingly, the width of connection conductors (22, 32) may be enlarged. If the width of connection conductors (22, 32) is enlarged, the connection area between flexible wiring board 130 and rigid section 110 or 120 increases. As a result, connection reliability is enhanced at F-R connection sections (FR1, FR2).

As shown in FIG. 1, insulation layer (40a) is laminated on the first-surface side of insulation layer (20a), and insulation layer (50a) is laminated on the second-surface side of insulation layer (30a). Wiring layer 41 is formed on the first surface of insulation layer (40a) and wiring layer 51 is formed on the second surface of insulation layer (50a). In addition, solder-resist layer 43 is formed on the first surface of insulation layer (40a), and solder-resist layer 53 is formed on the second surface of insulation layer (50a).

Insulation layers (40a, 50a) correspond to interlayer insulation layers. Hole (42a) is formed in insulation layer (40a), and hole (52a) is formed in insulation layer (50a). On the wall surfaces of holes (42a, 52a), connection conductors (42, 52) made of copper plating, for example, are formed respectively. Connection conductors (42, 52) are conformal conductors. However, connection conductors (42, 52) are not limited to such, and they may also be filled conductors.

Wiring layers (11, 12, 21, 31, 41, 51) are made of copper foil and copper plating, for example. However, their material is not limited to such, and conductors other than copper may also be used, for example. Also, as the material for insulation layers (20a, 30a, 40a, 50a), the following may be used: those made by impregnating inorganic material such as glass fiber or aramid fiber with resins such as epoxy resin, polyester resin, bismaleimide triazine resin (BT resin), imide resin (polyimide), phenol resin, or allyl polyphenylene ether resin (A-PPE resin).

Connection conductors (13, 42, 52) are made of copper plating, for example. Shapes of holes (42a, 52a) in which connection conductors (42, 52) are formed are tapered cylinders, for example. The shape of through hole (13a) in which connection conductor 13 is formed is a cylinder, for example.

Figure 6:
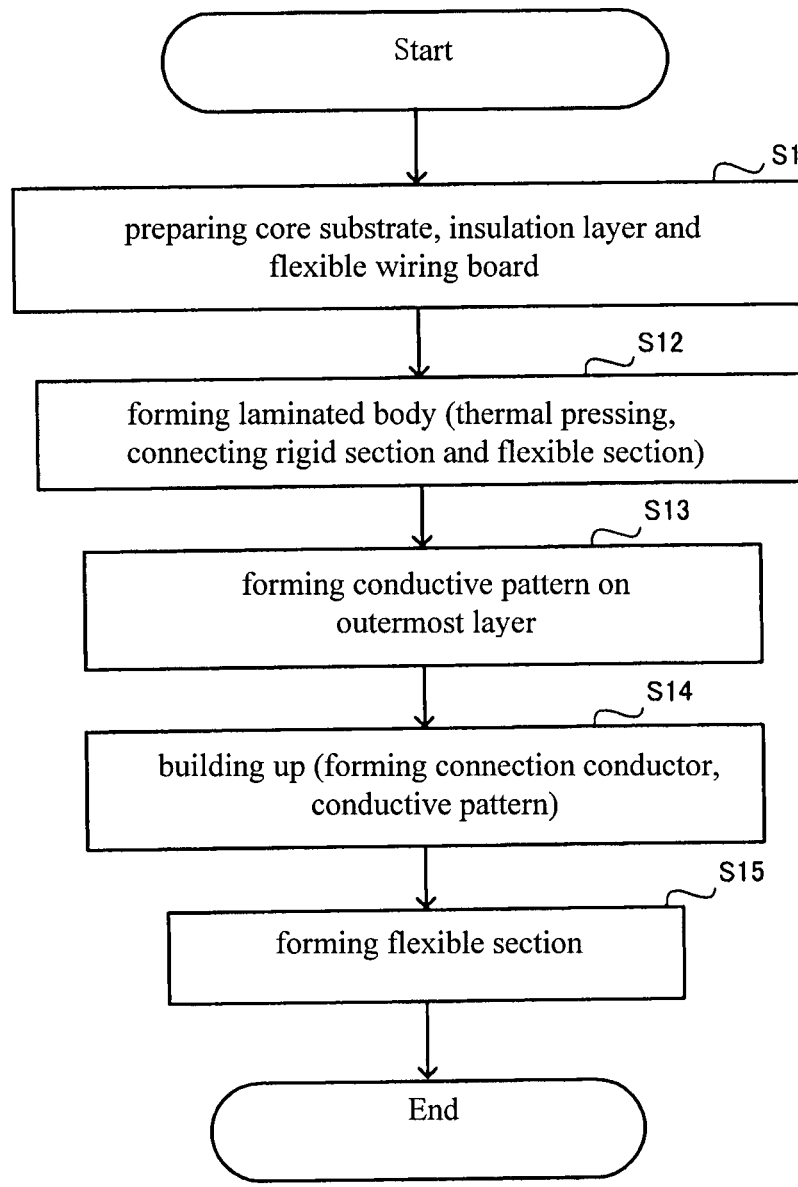
FIG. 6 is a flowchart showing a method for manufacturing a flex-rigid wiring board according to embodiments of the present invention.

The above flex-rigid wiring board 100 is manufactured by the procedure shown in FIG. 6, for example.

In step (S11), substrate 10 (core substrate), insulation layers (20a, 30a) and flexible wiring board 130 are prepared.

A method for manufacturing substrate 10 is shown in FIGS. 7A-7D.

Figure 7A:
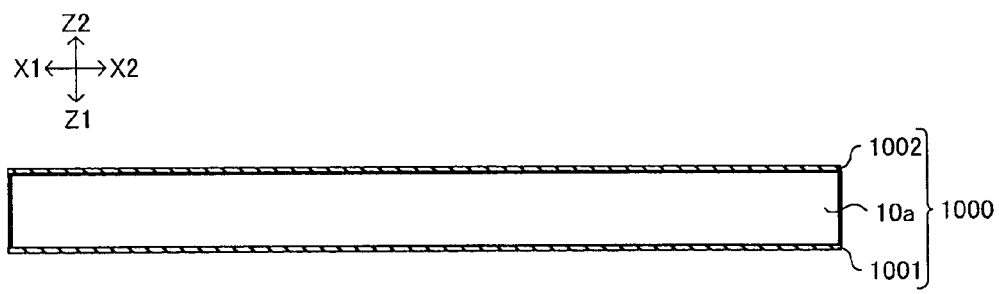
FIG. 7A is a view to illustrate a first step of a method for manufacturing a core substrate.

First, as shown in FIG. 7A, double-sided copper-clad laminate 1000 (starting material) is prepared. Double-sided copper-clad laminate 1000 has insulation layer (10a) and copper foils (1001, 1002). Copper foil 1001 is formed on the first surface of insulation layer (10a) and copper foil 1002 is formed on the second surface of insulation layer (10a). As described previously, the material for insulation layer (10a) is epoxy resin containing reinforcing material, for example.

Figure 7B:
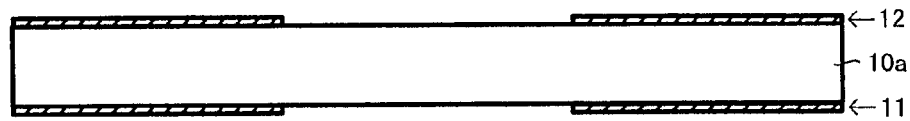
FIG. 7B is a view to illustrate a second step subsequent to the step in FIG. 7A.

Next, as shown in FIG. 7B, wiring layers (11, 12) are formed. Specifically, after copper panel plating (full plain plating), conductive layers on both surfaces of insulation layer (10a) are patterned by a lithographic technique. Accordingly, wiring layer 11 is formed on the first surface of insulation layer (10a), and wiring layer 12 is formed on the second surface of insulation layer (10a).

Figure 7C:
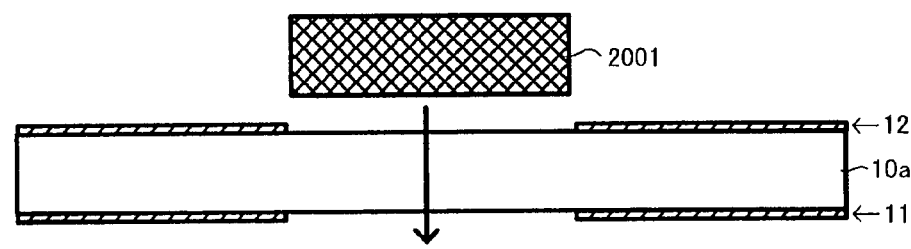
FIG. 7C is a view to illustrate a third step subsequent to the step in FIG. 7B.
Figure 7D:
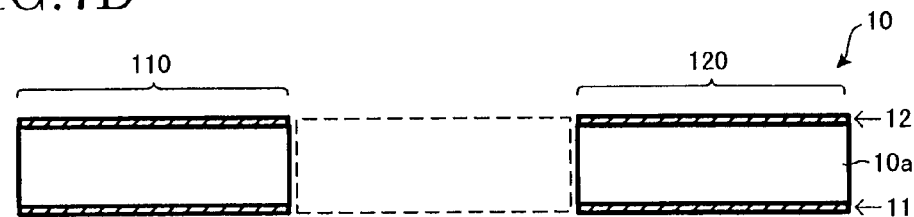
FIG. 7D is a view to illustrate a fourth step subsequent to the step in FIG. 7C.

Next, as shown in FIG. 7C, blanking is performed on insulation layer (10a) using die 2001. Accordingly, end surface (F4) (FIG. 4) is formed. As a result, as shown in FIG. 7D, insulation layer (10a) is separated into rigid section 110 and rigid section 120, and substrate 10 is completed.

Figure 8:
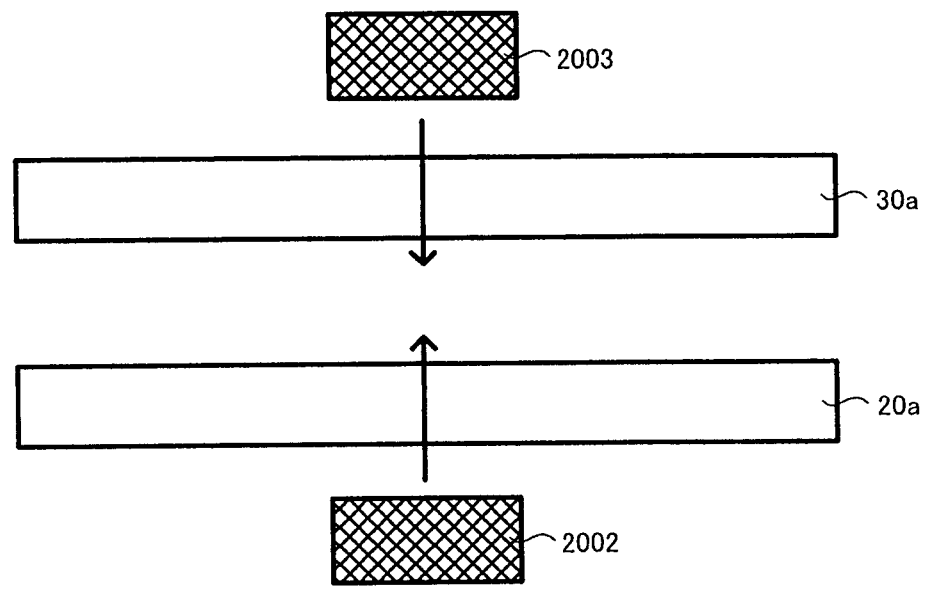
FIG. 8 is a view to illustrate a first step of a method for processing insulation layers.
Figure 9:
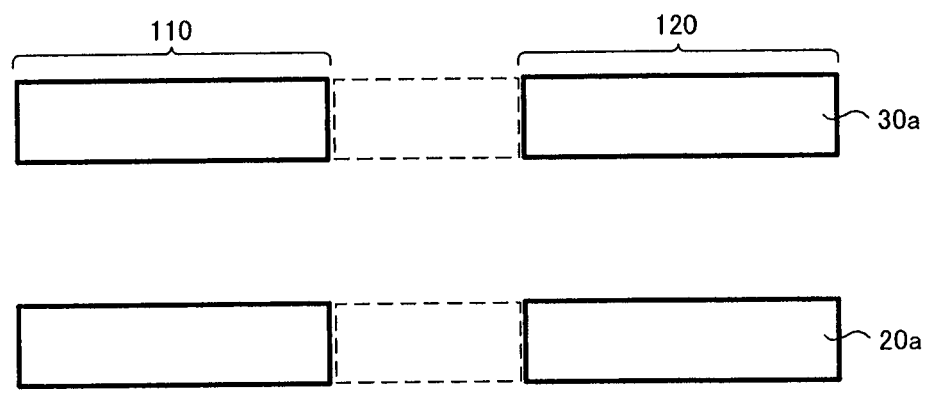
FIG. 9 is a view to illustrate a second step subsequent to the step in FIG. 8.

A method for processing insulation layers (20a, 30a) is shown in FIGS. 8 and 9.

First, as shown in FIG. 8, insulation layers (20a, 30a) prior to processing are prepared. As described previously, the material for insulation layers (20a, 30a) is the following: those made by impregnating inorganic material such as glass fiber or aramid fiber with resins such as epoxy resin, polyester resin, bismaleimide triazine resin (BT resin), imide resin (polyimide), phenol resin, or allyl polyphenylene ether resin (A-PPE resin). At this stage, insulation layers (20a, 30a) are still prepreg (semi-cured adhesive sheet). However, instead of prepreg, RCF (resin-coated copper foil) or the like may also be used.

Next, blanking is performed on insulation layer (20a) using die 2002, and blanking is performed on insulation layer (30a) using die 2003. Accordingly, as shown in FIG. 9, insulation layers (20a, 30a) are each separated into rigid section 110 and rigid section 120.

A method for manufacturing flexible wiring board 130 is shown in FIGS. 10A-12. In the present embodiment, multiple flexible wiring boards 130 are simultaneously manufactured in a single manufacturing panel, and one of them is separated in a step in FIG. 12. However, the present invention is not limited to such, and one flexible wiring board 130 may be formed using a single manufacturing panel.

Figure 10A:
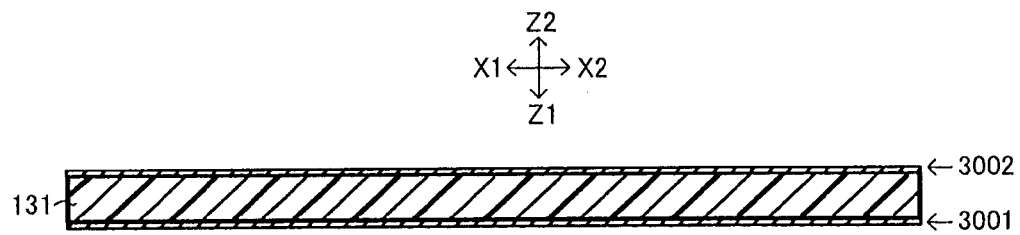
FIG. 10A is a view to illustrate a first step of a method for manufacturing a flexible wiring board.

First, as shown in FIG. 10A, a double-sided copper-clad laminate (starting material) is prepared. Such a double-sided copper-clad laminate has flexible substrate 131 and copper foils (3001, 3002). Copper foil 3001 is formed on the first surface of flexible substrate 131, and copper foil 3002 is formed on the second surface of flexible substrate 131. As described previously, the material for flexible substrate 131 is, for example, insulative polyimide or liquid-crystal polymer. The thickness of copper foils (3001, 3002) is 18 μm, for example.

Figure 10B:
FIG. 10B is a view to illustrate a second step subsequent to the step in FIG. 10A.

Next, as shown in FIG. 10B, wiring layers (132, 133) and connection conductor (131b) are formed.

Specifically, to begin with, hole (131a) is formed in flexible substrate 131 using a laser, for example. Hole (131a) penetrates through flexible substrate 131 and reaches copper foil 3001. Then, desmearing and soft etching are conducted if required.

Next, copper panel plating (plating in hole (131a) and on the entire surface) is performed on the second surface. Accordingly, copper plating (such as electroless plating and electrolytic plating), for example, is filled in hole (131a). As a result, connection conductor (131b) is formed. In the present embodiment, plating is performed only on one surface (second surface). However, the present invention is not limited to such, and plating may be performed on both surfaces (first and second surfaces). By plating on both surfaces, the thickness of wiring layer 132 and the thickness of wiring layer 133 may be made the same.

Next, conductive layers on both surfaces of flexible substrate 131 are patterned using a lithographic technique. Accordingly, wiring layer 132 is formed on the first surface of flexible substrate 131, and wiring layer 133 is formed on the second surface of flexible substrate 131. Flexible substrate 131 has end portions which are absent of wiring layers (132, 133). After that, a horizontal roughening process is further carried out if required.

Figure 10C:
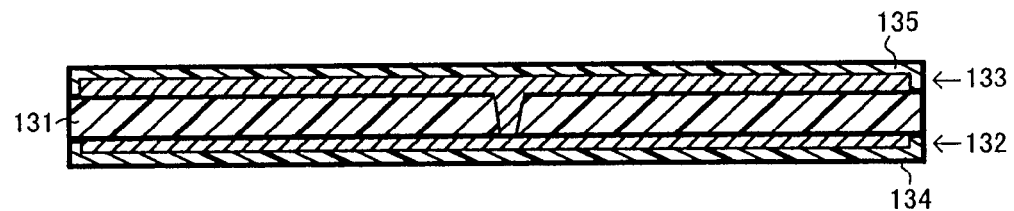
FIG. 10C is a view to illustrate a third step subsequent to the step in FIG. 10B.

Next, as shown in FIG. 10C, by pressing, for example, inner coverlay 134 is attached to the first-surface side of flexible substrate 131, and inner coverlay 135 is attached to the second-surface side of flexible substrate 131. Accordingly, wiring layers (132, 133) are coated with inner coverlays (134, 135) respectively, and the end portions of flexible substrate 131 are coated with inner coverlays (134, 135), respectively.

Figure 11:
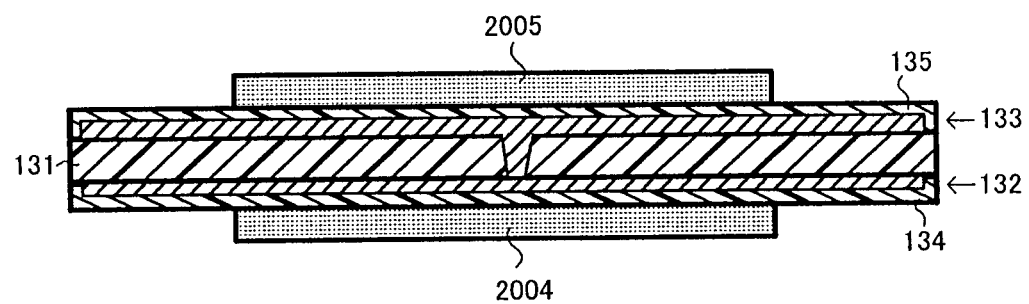
FIG. 11 is a view to illustrate a fourth step subsequent to the step in FIG. 10C.

Next, as shown in FIG. 11, by printing, for example, strip mask 2004 is formed on the first-surface side of inner coverlay 134, and strip mask 2005 is formed on the second-surface side of inner coverlay 135.

Figure 12:
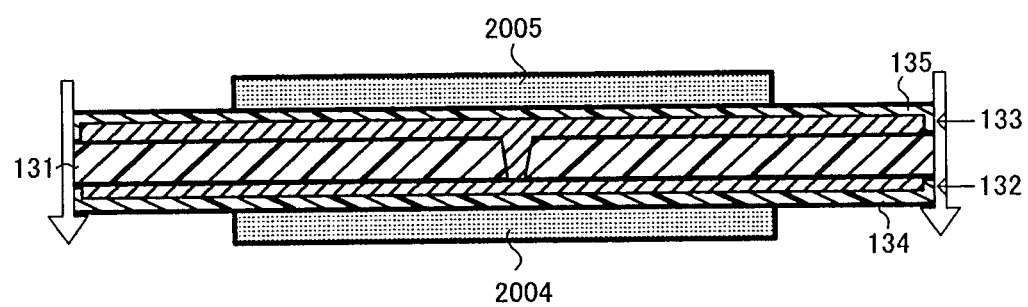
FIG. 12 is a view to illustrate a fifth step subsequent to the step in FIG. 11.

Next, as shown in FIG. 12, using a die, for example, one flexible wiring board 130 is pulled out. Accordingly, end surface (F3) (FIG. 4) is formed, and flexible wiring board 130 previously shown in FIG. 3 is obtained. At this stage, tapered portion (P33) is not yet formed. The method for separating flexible wiring board 130 is not limited to using a die, and any other method may also be employed. For example, it may be separated using a laser or a drill.

Next, in step (S12) of FIG. 6, a laminated body is formed using substrate 10 (core substrate), insulation layers (20a, 30a) and flexible wiring board 130.

Figure 13:
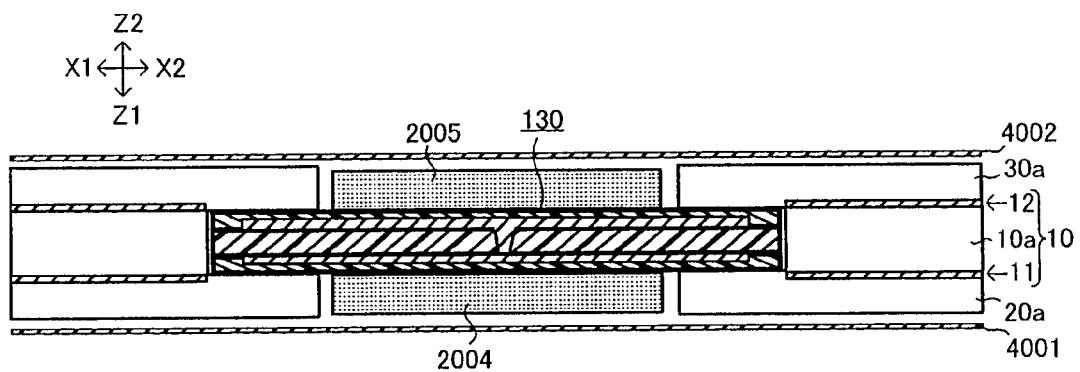
FIG. 13 is a view to illustrate a first step for forming a laminated body.

Specifically, to begin with, substrate 10 (FIG. 7D), insulation layers (20a, 30a) (FIG. 9) and flexible wiring board 130 (FIG. 12) are aligned and positioned as shown in FIG. 13, for example. Then, insulation layers (20a, 30a) are provisionally melted and adhered to substrate 10. After that, copper foils (4001, 4002) (metal foils) are positioned outside of insulation layers (20a, 30a) (on the first-surface side and the second-surface side).

Accordingly, substrate 10 is positioned beside (in direction X) flexible wiring board 130. Insulation layer (20a) is positioned beside (in direction X) strip mask 2004, and insulation layer (30a) is positioned beside (in direction X) strip mask 2005. Both end portions of flexible wiring board 130 are sandwiched by insulation layers (20a, 30a).

Figure 14:
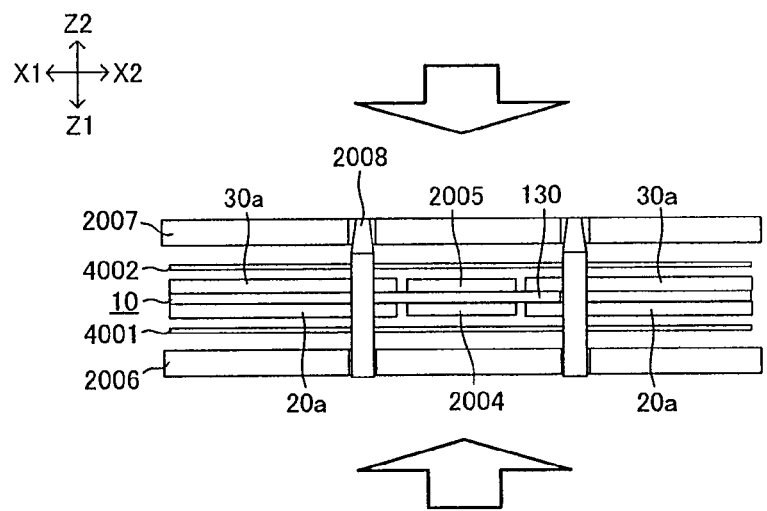
FIG. 14 is a view to illustrate a second step subsequent to the step in FIG. 13.

Next, as shown in FIG. 14, for example, the above members are sandwiched by pressing jigs (2006, 2007) and are thermal pressed all at once. Namely, pressing and heating are conducted simultaneously. During that time, jigs (2006, 2007) are aligned using pins 2008. Accordingly, pressure is exerted substantially perpendicular to the main surfaces.

Figure 15:
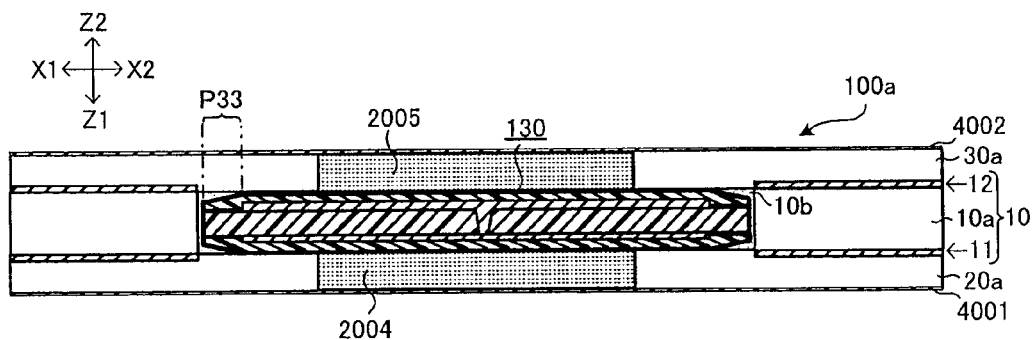
FIG. 15 is a view to illustrate a third step subsequent to the step in FIG. 14.

By the above pressing, end surfaces of at least either flexible wiring board 130 or insulation layer (10a) become inclined. As shown in FIG. 15, end portions of flexible wiring board 130 (end portions which do not have wiring layer 132 between flexible substrate 131 and coverlay 134 and do not have wiring layer 133 between flexible substrate 131 and coverlay 135) are compressed and deformed. As a result, tapered portions (P33) are formed.

In addition, resin (10b) is squeezed from the surrounding insulation layers (insulation layers 10a, 20a, 30a), and resin (10b) is filled in the clearance between insulation layer (10a) and flexible wiring board 130.

Moreover, through the above pressing, prepreg (insulation layers 20a, 30a) is cured, and insulation layer (10a) and insulation layers (20a, 30a) are adhered. Insulation layers (20a, 30a) are also bonded with flexible wiring board 130.

The above pressing and heating may be divided into multiple procedures. Also, heating and pressing may be conducted separately, but it is more efficient if they are conducted simultaneously. After the thermal pressing, another heating for integration may be conducted separately.

Figure 16:
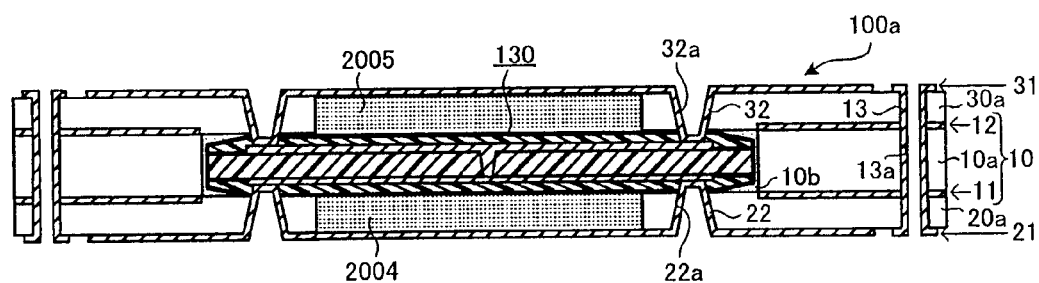
FIG. 16 is a view to illustrate a fourth step subsequent to the step in FIG. 15.

Next, as shown in FIG. 16, wiring layers (21, 31) and connection conductors (13, 22, 32) are formed.

Specifically, using a laser, for example, hole (22a) is formed in insulation layer (20a), hole (32a) is formed in insulation layer (30a) and through hole (13a) is formed in insulation layers (10a, 20a, 30a). Hole (22a) reaches wiring layer 132 of flexible wiring board 130, and hole (32a) reaches wiring layer 133 of flexible wiring board 130. Through hole (13a) penetrates through insulation layers (10a, 20a, 30a) entirely. After that, desmearing and soft etching are conducted if required.

Next, for example, by copper panel plating (plating in holes (22a, 32a) as well as in through hole (13a) and on the entire surface), copper plating, for example, is formed on the wall surfaces of holes (22a, 32a), and copper plating, for example, is formed on the wall surface of through hole (13a). Such plating is made of electroless plating and electrolytic plating, for example. However, the present invention is not limited to such, and plating may be made of only either electroless plating or electrolytic plating. Moreover, dry plating such as PVD (physical vapor deposition) and CVD (chemical vapor deposition) may also be performed.

Accordingly, connection conductors (13, 22, 32) are formed. Connection conductor 22 is bonded to wiring layer 132, and connection conductor 32 is bonded to wiring layer 133. Connection conductor 13 electrically connects conductive layers on both surfaces (wiring layers 21, 31 prior to being patterned) with each other.

Through the above steps, laminated body (100a) having substrate 10, insulation layers (20a, 30a) and flexible wiring board 130 is formed. Insulation layer (10a) is sandwiched between insulation layer (20a) and insulation layer (30a).

Next, in step (S13) of FIG. 6, conductive layers on both surfaces (outermost layers) are patterned by a lithographic technique, for example. Accordingly, wiring layer 21 is formed on insulation layer (20a), and wiring layer 31 is formed on insulation layer (30a). By the above panel plating, wiring layer 21 and connection conductor 22 as well as wiring layer 31 and connection conductor 32 are each formed to be contiguous.

Next, in step (S14) of FIG. 6, building up is conducted on laminated body (100a).

Figure 17:
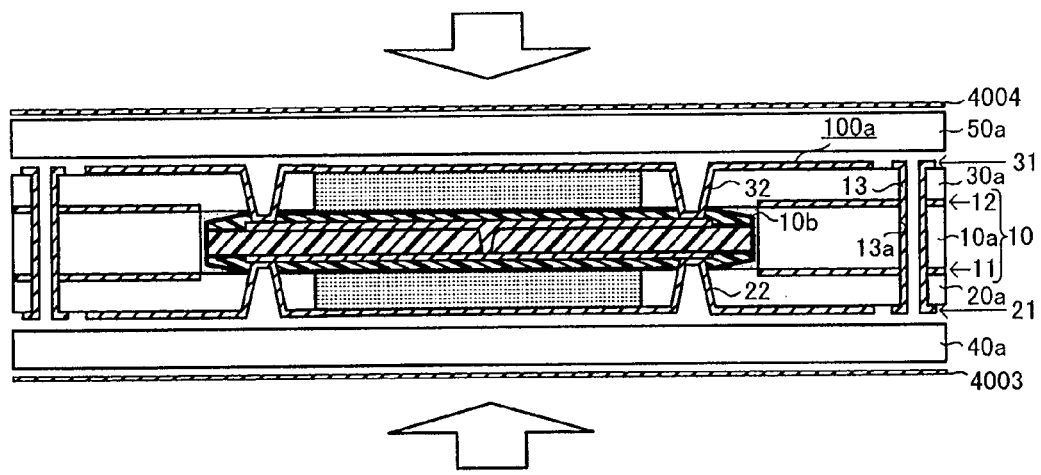
FIG. 17 is a view to illustrate a first step for building up on the laminated body (core section)

Specifically, to begin with, as shown in FIG. 17, copper foil 4003, insulation layer (40a), laminated body (100a), insulation layer (50a) and copper foil 4004 are positioned to be laminated in that order. Accordingly, laminated body (100a) is sandwiched by insulation layer (40a) and insulation layer (50a). At this stage, insulation layers (40a, 50a) are still prepreg (semi-cured adhesive sheets). However, instead of prepreg, RCF (resin-coated copper foil) or the like may also be used.

Figure 18:
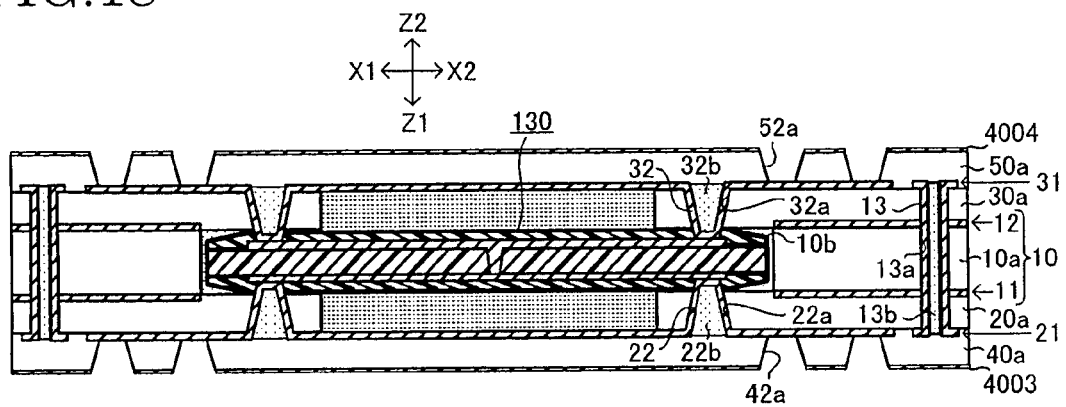
FIG. 18 is a view to illustrate a second step subsequent to the step in FIG. 17.

Next, thermal pressing is performed. Accordingly, prepreg (insulation layers 40a, 50a) is cured, and copper foil 4003, insulation layer (40a), laminated body (100a), insulation layer (50a) and copper foil 4004 become integrated. Also, as shown in FIG. 18, resin flowed from insulation layers (40a, 50a) is filled in through hole (13a) and holes (22a, 32a), becoming insulative bodies (13b, 22b, 32b). Insulative bodies (13b, 22b, 32b) may be filled in advance prior to pressing.

Next, by using a laser, for example, hole (42a) is formed in insulation layer (40a), and hole (52a) is formed in insulation layer (50a) as shown in FIG. 18. After that, desmearing and soft etching are conducted if required.

Figure 19:
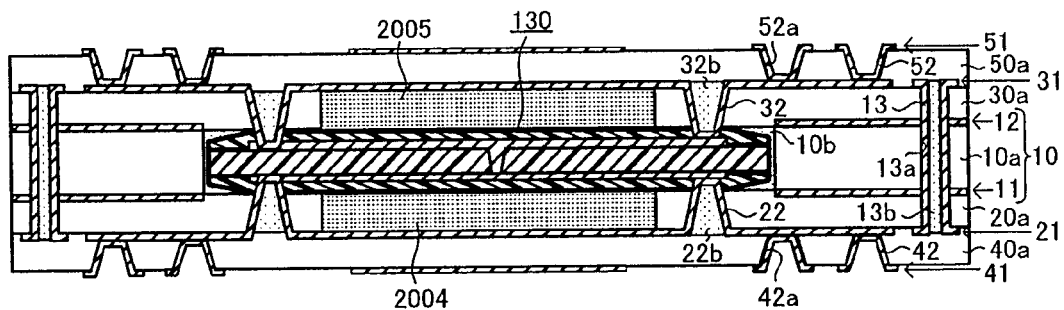
FIG. 19 is a view to illustrate a third step subsequent to the step in FIG. 18.

Next, for example, by copper panel plating (such as electroless plating or electrolytic plating or both), copper plating, for example, is formed in hole (42a), and copper plating, for example, is formed in hole (52a) as shown in FIG. 19. Accordingly, connection conductors (42, 52) are formed.

Furthermore, conductive layers on both surfaces are patterned by a lithographic technique, for example. Accordingly, wiring layer 41 is formed on insulation layer (40a), and wiring layer 51 is formed on insulation layer (50a). Conductive patterns of wiring layers (41, 51) remain on strip masks (2004, 2005) respectively.

Figure 20:
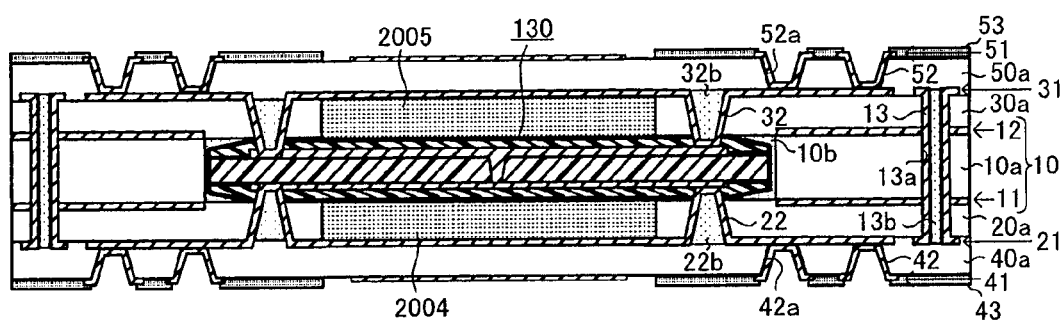
FIG. 20 is a view to illustrate a fourth step subsequent to the step in FIG. 19.

Next, as shown in FIG. 20, solder-resist layers (43, 53) are formed on both surfaces by screen printing or lamination, for example. Then, solder-resist layers (43, 53) are cured by heating, for example. Patterning, drilling and exterior processing are conducted if required.

Figure 21:
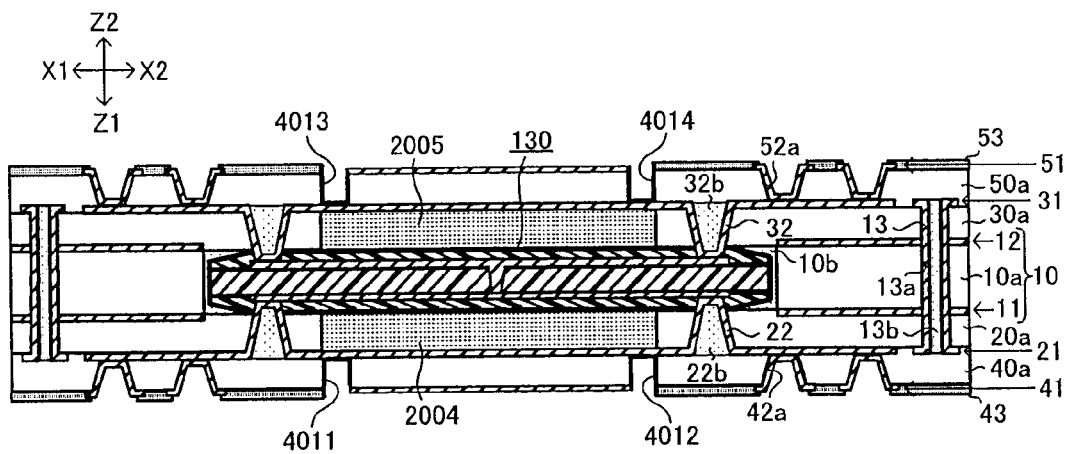
FIG. 21 is a view to illustrate a fifth step subsequent to the step in FIG. 20.

Next, by etching while coating the first surface and second surface with a mask having predetermined openings, for example, or by partially beaming a laser, cut lines (4011-4014) are formed as shown in FIG. 21. Cut lines (4011, 4012) are formed in insulation layer (40a), and cut lines (4013, 4014) are formed in insulation layer (50a). Cut lines (4011-4014) each reach a conductive pattern (wiring layer 41 or 51) on strip mask 2004 or 2005. Then, desmearing and soft etching are conducted if required.

Next, in step (S15) of FIG. 6, space is formed on both sides (first-surface side and second-surface side) of the central portion in flexible wiring board 130. Accordingly, flexible section (R100) (FIG. 1) is formed.

Figure 22:
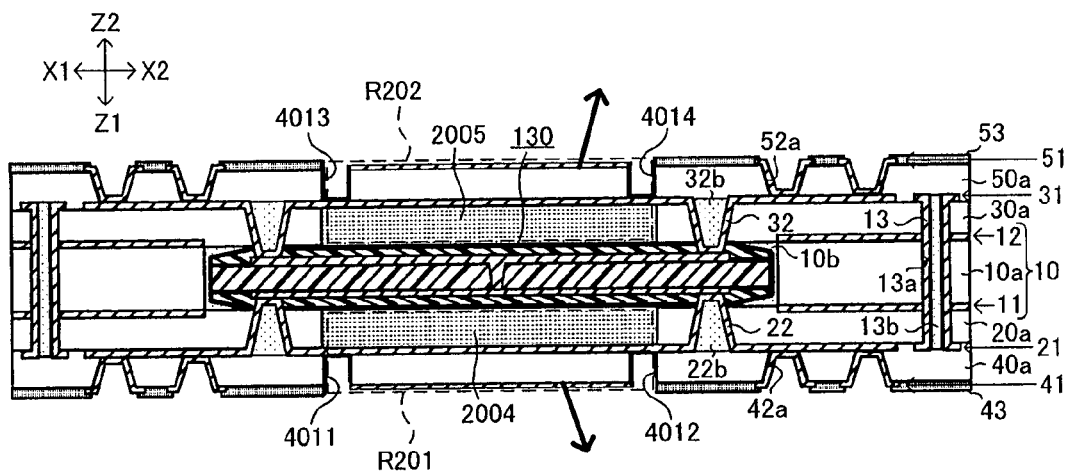
FIG. 22 is a view to illustrate a step for forming a flexible section.

Specifically, as shown in FIG. 22, portions corresponding to regions (R201, R202) partitioned by cut lines (4011-4014) are removed by peeling them from both surfaces of flexible wiring board 130. During that time, detaching is easy since strip masks (2004, 2005) are arranged. Accordingly, the central section of flexible wiring board 130 is exposed and space that allows flexible wiring board 130 to curve (bend) is formed on the upper and lower surfaces of flexible wiring board 130 (in lamination directions of insulation layers). As a result, flex-rigid wiring board 100 (FIG. 1) is completed.

Then, if required, remaining conductors are removed by mask etching, for example. Also, external connection terminals (solder bumps) are formed in opening portions in solder-resist layers (43, 53) by printing solder paste, reflowing and the like. Accordingly, connecting flex-rigid wiring board 100 to other wiring boards, mounting electronic components on flex-rigid wiring board 100 and so forth become possible through such external connection terminals. Also, exterior processing, warping correction, conductivity inspection, external inspection, final inspection and the like are conducted according to requirements.

The manufacturing method according to the present embodiment is suitable for manufacturing the above flex-rigid wiring board 100. Using such a manufacturing method, excellent flex-rigid wiring boards 100 may be obtained at a lower cost.

Second Embodiment

The second embodiment of the present invention is described by focusing on differences from the above first embodiment. Here, the same reference number is used for an element which is the same as that shown in the above FIG. 1 and others. Common portions already described above, namely, portions whose description would be redundant, will be omitted from being described here for convenience sake.

Figure 23:
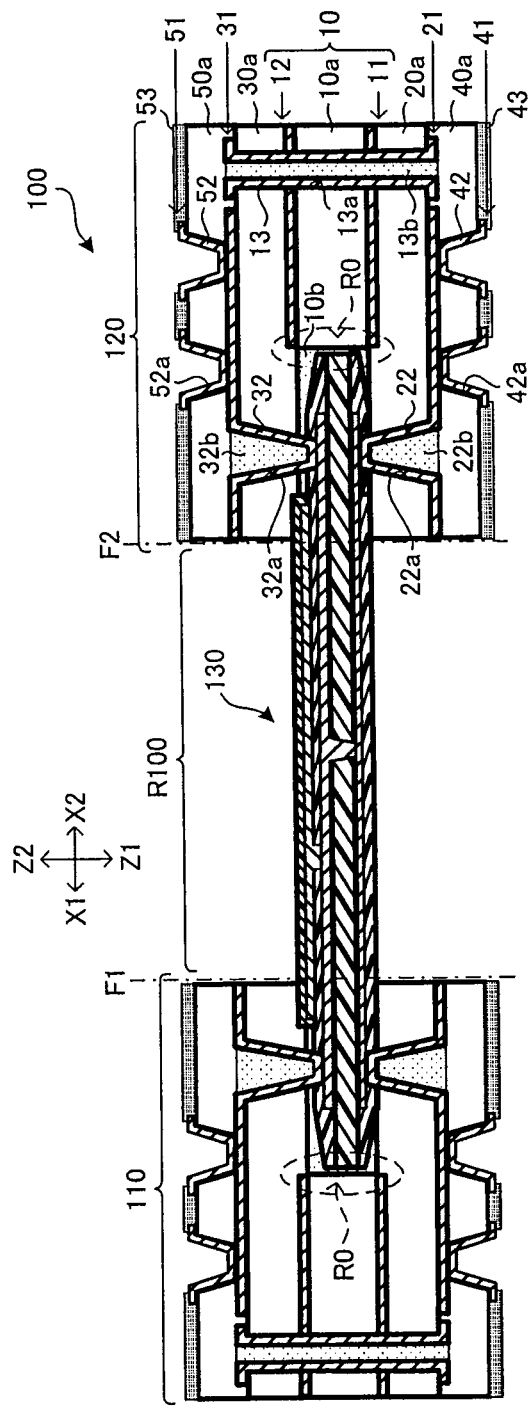
FIG. 23 is a cross-sectional view of a flex-rigid wiring board according to the second embodiment of the present invention.
Figure 24:
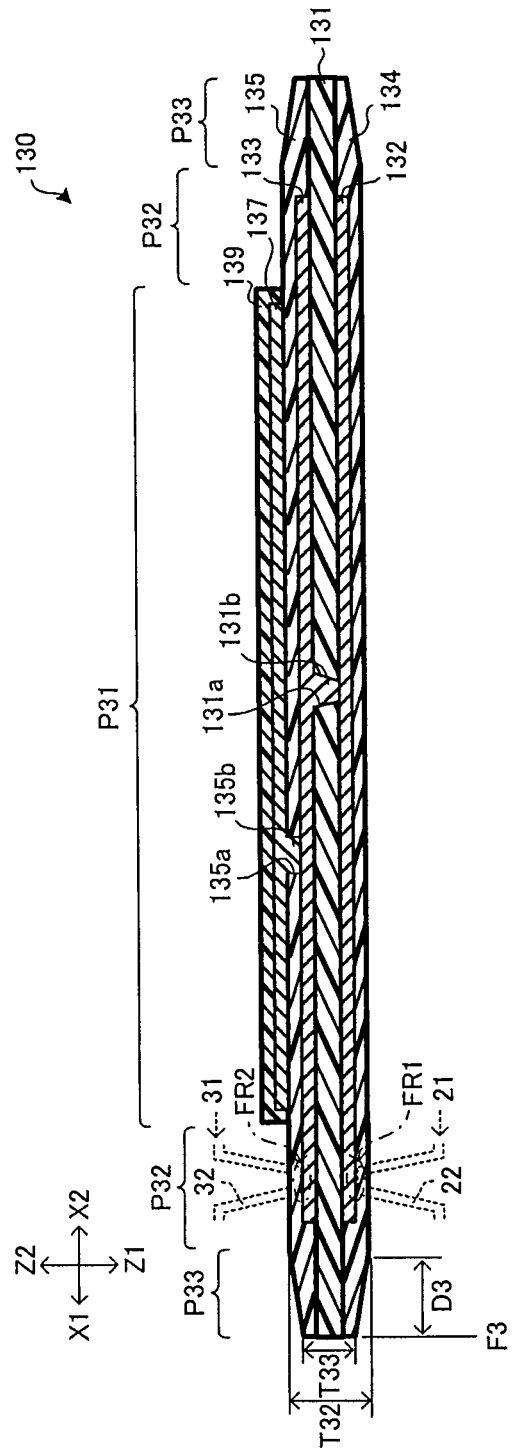
FIG. 24 is a cross-sectional view of a flexible wiring board according to the second embodiment.
Figure 25:
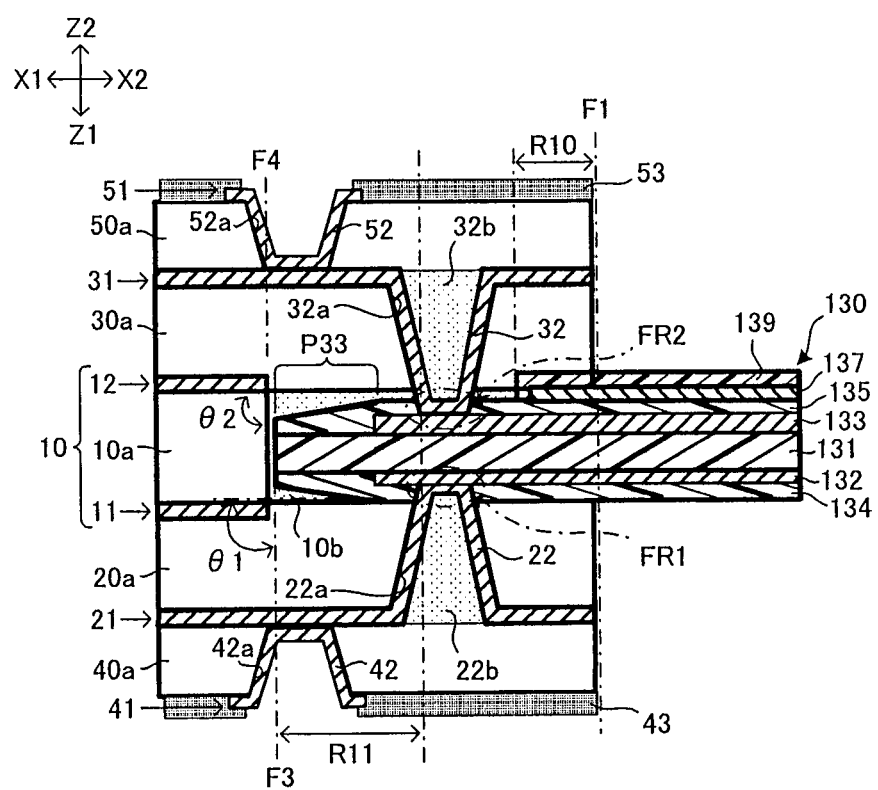
FIG. 25 is a magnified cross-sectional view showing part of a region in FIG. 23.

As shown in FIGS. 23-25, flexible wiring board 130 of flex-rigid wiring board 100 according to the present embodiment has shield layer 137 and outer coverlay 139 on one surface (second surface, for example).

Shield layer 137 is formed on inner coverlay 135. Shield layer 137 shields electromagnetic noise from the outside (especially from the second-surface side) to wiring layers (132, 133), as well as shields electromagnetic noise from wiring layers (132, 133) to the outside (especially to the second-surface side). Shield layer 137 is made of conductive paste, for example. The thickness of shield layer 137 is approximately 10-30 μm, for example.

The conductive paste forming shield layer 137 contains fine silver particles, for example. Conductive paste is preferred to contain at least one kind from among silver, gold, copper and carbon. Especially, since silver has high electrical conductivity, it is effective to reduce noise. However, the material for shield layer 137 is not limited to the above, and any other type may also be used.

In addition, inner coverlay 135 has connection conductor (135b). Specifically, hole (135a) is formed in inner coverlay 135. Hole (135a) may be formed by a laser, for example. Connection conductor (135b) is formed by filling conductive paste in hole (135a). Conductive paste may be filled by screen printing, for example. Shield layer 137 and wiring layer 133 are electrically connected by means of connection conductor (135b).

Outer coverlay 139 is formed over inner coverlay 135. Outer coverlay 139 coats shield layer 137. Outer coverlay 139 insulates as well as protects flexible wiring board 130 from the outside. Outer coverlay 139 is made of polyimide, for example. The thickness of outer coverlay 139 is approximately 5-30 μm, for example.

As shown in FIG. 25, resin (10b) is filled in the space partitioned by flexible wiring board 130 and insulation layers (10a, 20a, 30a) (clearance among those members). Resin (10b) flows from the surrounding insulation layers (insulation layers 20a, 30a or the like) during pressing (see FIG. 14), for example, and is integrated with the surrounding insulation layers.

Flexible wiring board 130 is divided into shield section (P31), non-tapered section (P32) and tapered section (P33) in lengthwise directions (directions X).

Shield section (P31) is a portion where flexible substrate 131, wiring layers (132, 133), inner coverlays (134, 135), shield layers (136, 137) and outer coverlays (138, 139) are laminated, and it is the thickest portion in flexible wiring board 130. Since shield layers (136, 137) and outer coverlays (138, 139) are removed from non-tapered portion (P32), non-tapered portion (P32) is thinner than shield portion (P31).

In flex-rigid wiring board 100 of the present embodiment, since wiring layers (132, 133) are protected by shield layer 137, it is thought that flexible wiring board 130 is tolerant to noise. In addition, since flexible wiring board 130 is protected by outer coverlay 139, it is thought that the strength or the like of flexible wiring board 130 is enhanced.

Other than the above, regarding the same structure as in the first embodiment, it is thought that substantially the same effects as described above in the first embodiment are achieved.

Third Embodiment

The third embodiment of the present invention is described by focusing on differences from the above second embodiment. Here, the same reference number is used for an element which is the same as that shown in the above FIG. 1 and others. Common portions already described above, namely, portions whose description would be redundant, will be omitted from being described here for convenience sake.

Figure 26:
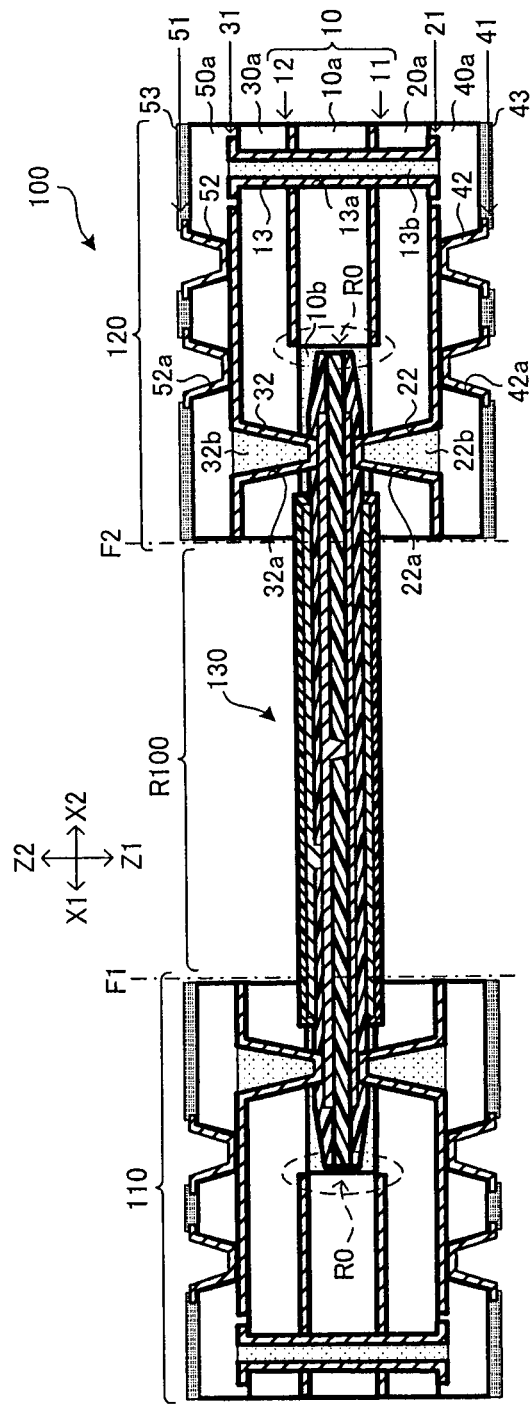
FIG. 26 is a cross-sectional view of a flex-rigid wiring board according to the third embodiment of the present invention.
Figure 27:
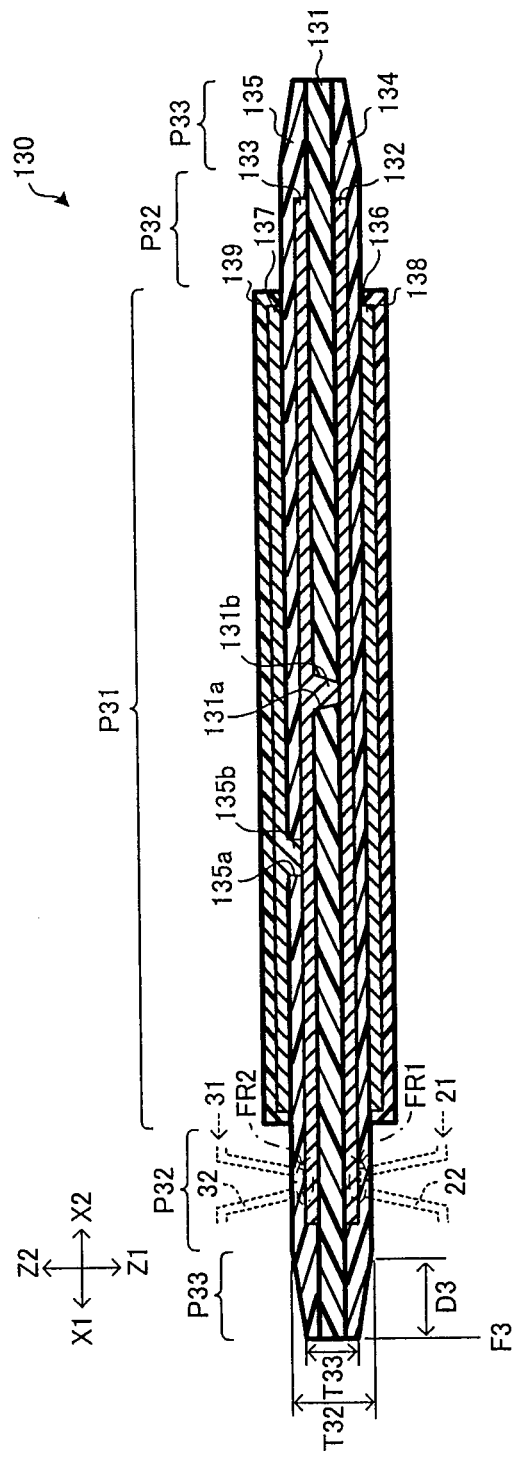
FIG. 27 is a cross-sectional view of a flexible wiring board according to the third embodiment.
Figure 28:
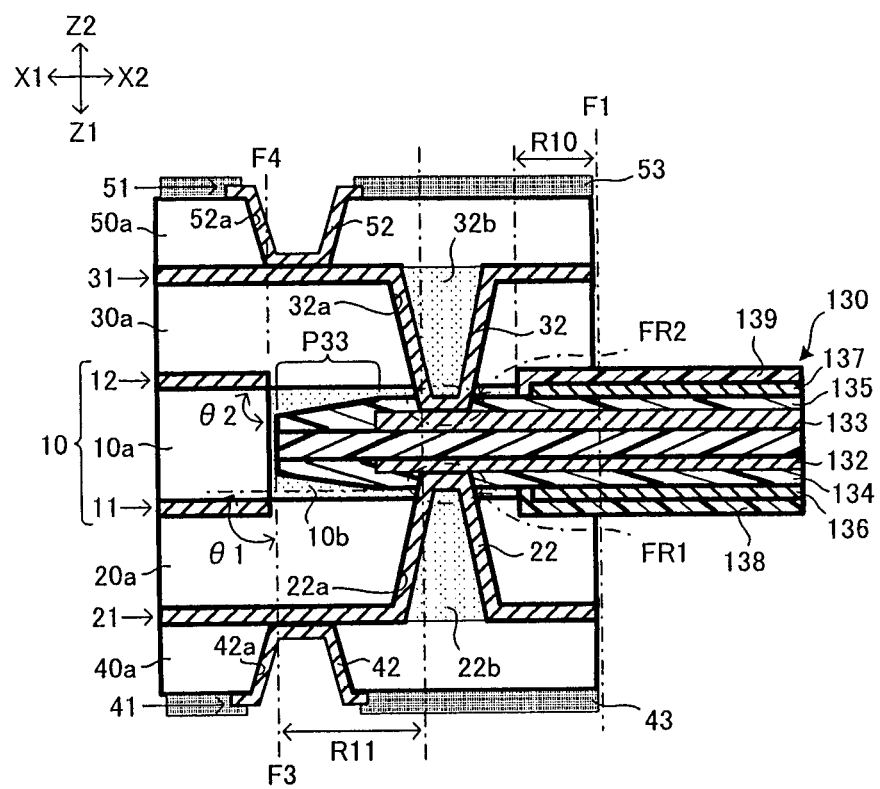
FIG. 28 is a magnified cross-sectional view showing part of a region in FIG. 26.

As shown in FIGS. 26-28, flexible wiring board 130 in flex-rigid wiring board 100 according to the present embodiment has shield layers (136, 137) and outer coverlays (138, 139) on both surfaces (such as the first and second surfaces).

If such a structure is employed, since wiring layers (132, 133) are protected by shield layers (136, 137) from both surfaces, it is thought that flexible wiring board 130 becomes further tolerant to noise. In addition, by protecting flexible wiring board 130 with outer coverlays (138, 139) from both surfaces, it is thought that the strength or the like of flexible wiring board 130 further increases.

So far, flex-rigid wiring boards and their manufacturing methods according to the embodiments of the present invention have been described. However, the present invention is not limited to the above embodiments.

Figure 29:
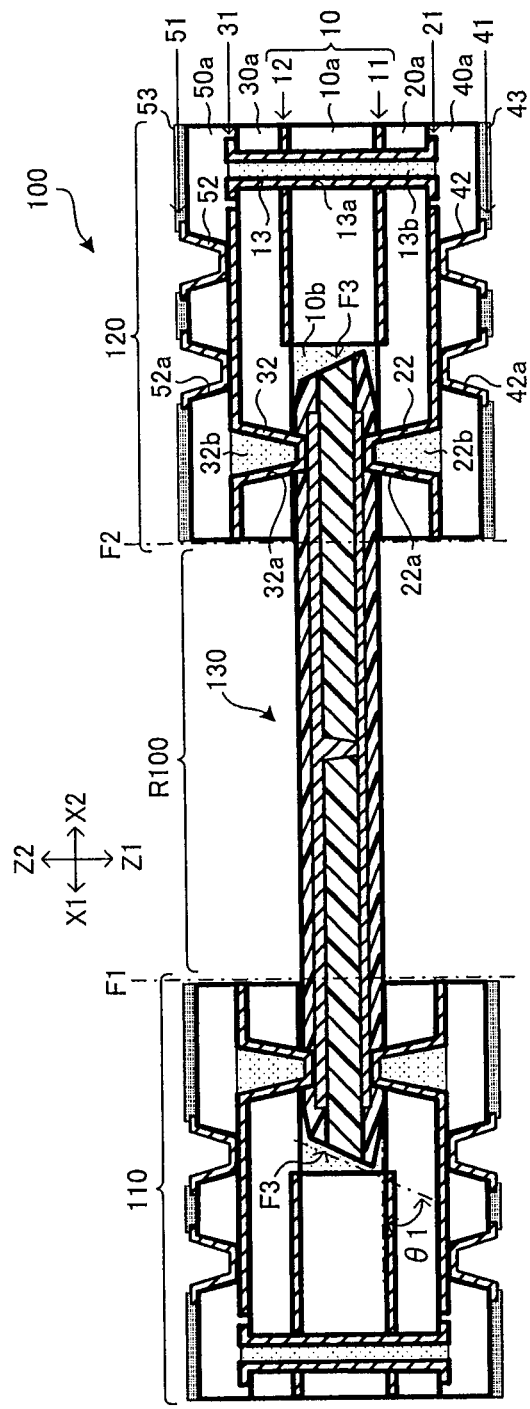
FIG. 29 is a view showing an example where an end surface of the flexible wiring board is a slope.

As shown in FIG. 29, end surface (F3) of flexible wiring board 130 beside insulation layer (10a) may be a slope inclined (at an obtuse angle or an acute angle) toward a main surface of flexible wiring board 130. Such end surface (F3) may be easily formed, for example, by processing a side surface of flexible wiring board 130 using a laser, a die, a guillotine cutter or the like in the step previously shown in FIG. 10C. By employing such a structure, adhesion areas between flexible wiring board 130 and rigid sections (110, 120) increase, and it is thought that both end portions of flexible wiring board 130 are connected even more firmly with rigid sections (110, 120).

In FIG. 29, since the smaller the angle (θ1) of end surface (F3), the greater the bonded area between flexible wiring board 130 and resin (10b), it is thought that their bonding strength improves. However, if angle (θ1) becomes too small, it is thought that the strength at an end portion of flexible wiring board 130 decreases and the end portion tends to be deformed. Then, as a result, it is thought that the position of flexible wiring board 130 may tend to be shifted or the like. Considering such problems, it is thought that angle (θ1) of end surface (F3) is preferably set at 40-80°, especially at 60° or 80°.

Figure 30:
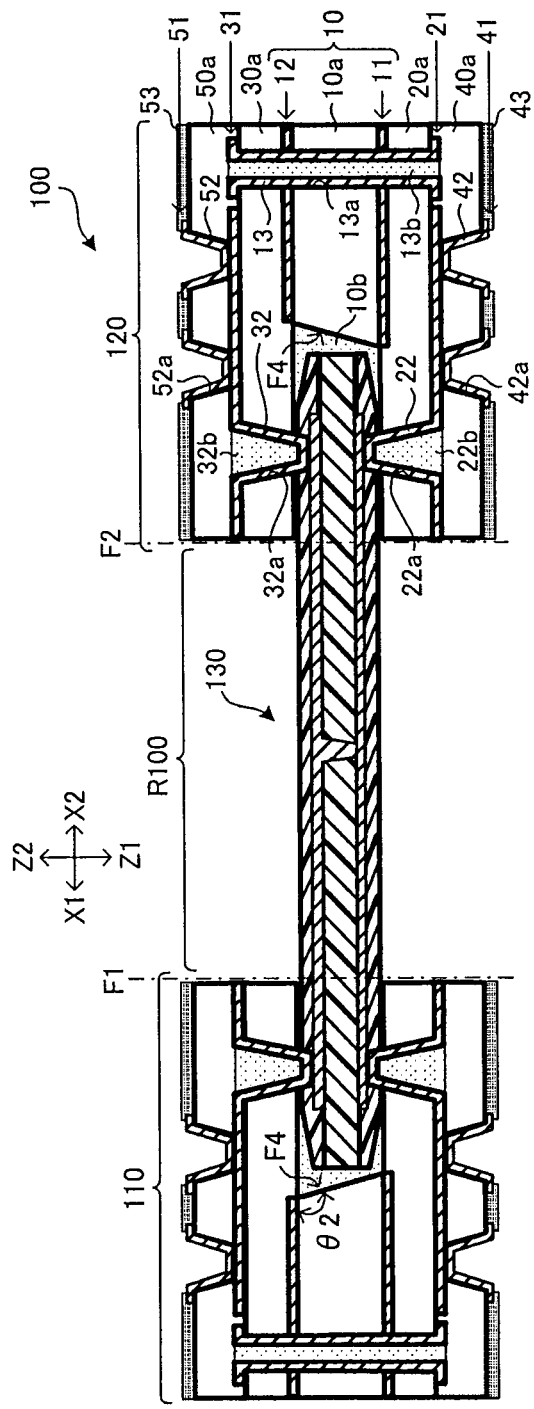
FIG. 30 is a view showing an example where an end surface of an insulation layer positioned beside the flexible wiring board is a slope.

As shown in FIG. 30, end surface (F4) of insulation layer (10a) beside flexible wiring board 130 may be a slope inclined (at an obtuse angle or an acute angle) toward a main surface of insulation layer (10a). Such end surface (F4) may be easily formed, for example, by processing a side surface of insulation layer (10a) using a laser, a die, a guillotine cutter or the like in the step previously shown in FIG. 7C. By employing such a structure, adhesion areas between flexible wiring board 130 and rigid sections (110, 120) increase, and it is thought that both end portions of flexible wiring board 130 are connected more firmly with rigid sections (110, 120).

In FIG. 30, since the greater the angle (θ2) of end surface (F4), the greater the bonded area between flexible wiring board 130 and resin (10b), it is thought that their bonding strength improves. However, if angle (θ2) becomes too great, it is thought that movement (especially movement in directions X) of flexible wiring board 130 becomes less restricted by end surface (F4) of insulation layer (10a). Accordingly, it is thought that the position of flexible wiring board 130 may tend to shift or the like. Considering such problems, it is thought that angle (θ2) of end surface (F4) is preferably set at 40-80°, especially at 60° or 80°.

Figure 31:
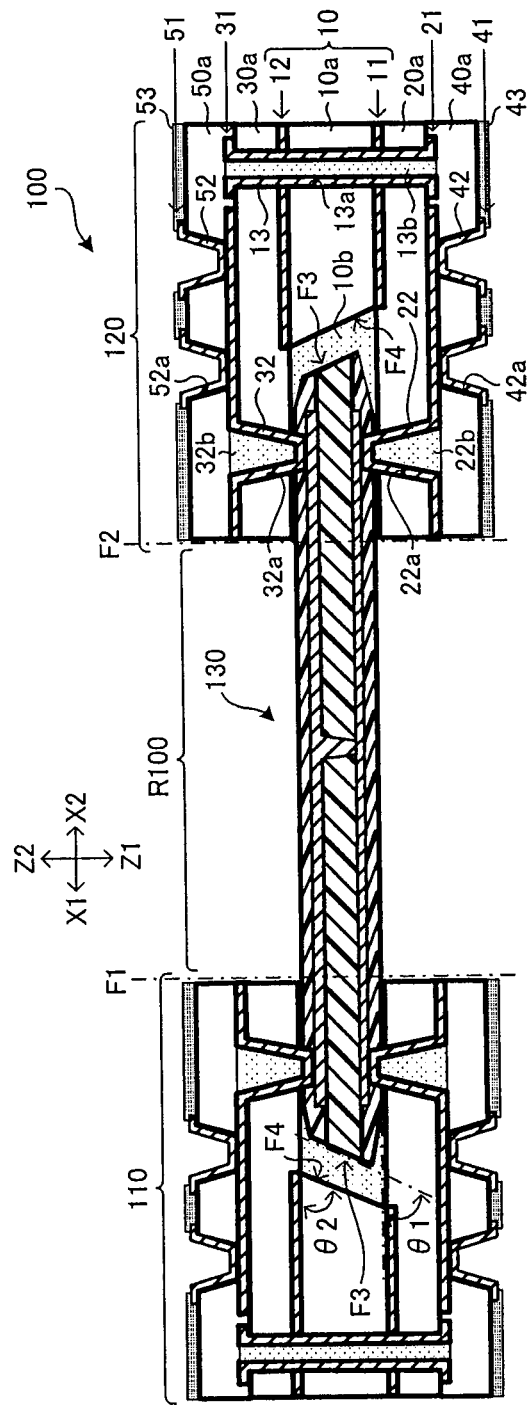
FIG. 31 is a view showing an example where the direction of an end surface of the flexible wiring board and the direction of an end surface of the insulation layer are substantially parallel.

As shown in FIG. 31, it is thought that the direction of end surface (F3) of flexible wiring board 130 and the direction of end surface (F4) of insulation layer (10a) are preferred to be substantially parallel. Also, the same as above, it is thought that angle (θ1) of end surface (F3) and angle (θ2) of end surface (F4) in FIG. 31 are each preferred to be set at 40-80°, especially at 60° or 80°. In addition, if angle (θ1) and angle (θ2) are set at 60°, it is thought that the effects of alignment are high when fitting end surface (F3) of flexible wiring board 130 and end surface (F4) of insulation layer (10a).

Figure 32:
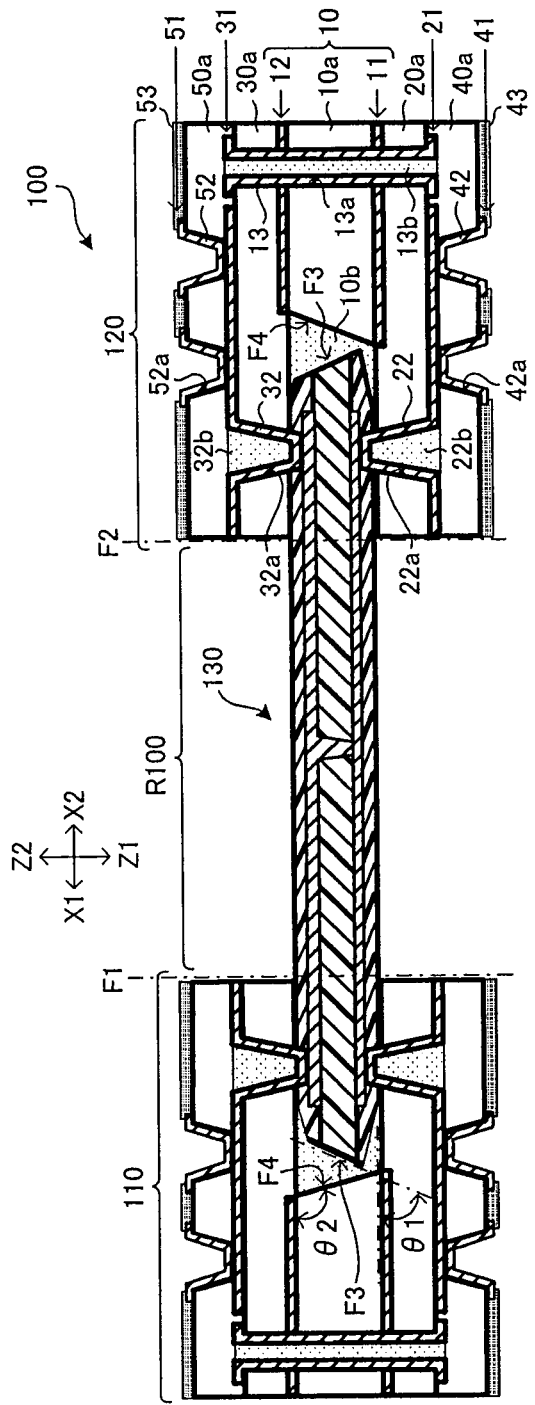
FIG. 32 is a view showing an example where the direction of an end surface of the flexible wiring board and the direction of an end surface of the insulation layer are not parallel.

By contrast, as shown in FIG. 32, the direction of end surface (F3) of flexible wiring board 130 and the direction of end surface (F4) of insulation layer (10a) may be set so as not to be parallel. In FIG. 32, angle (θ1) of end surface (F3) is preferred to be set at 40-80°, and angle (θ2) of end surface (F4) is preferred to be set at 110-140°.

Figure 33:
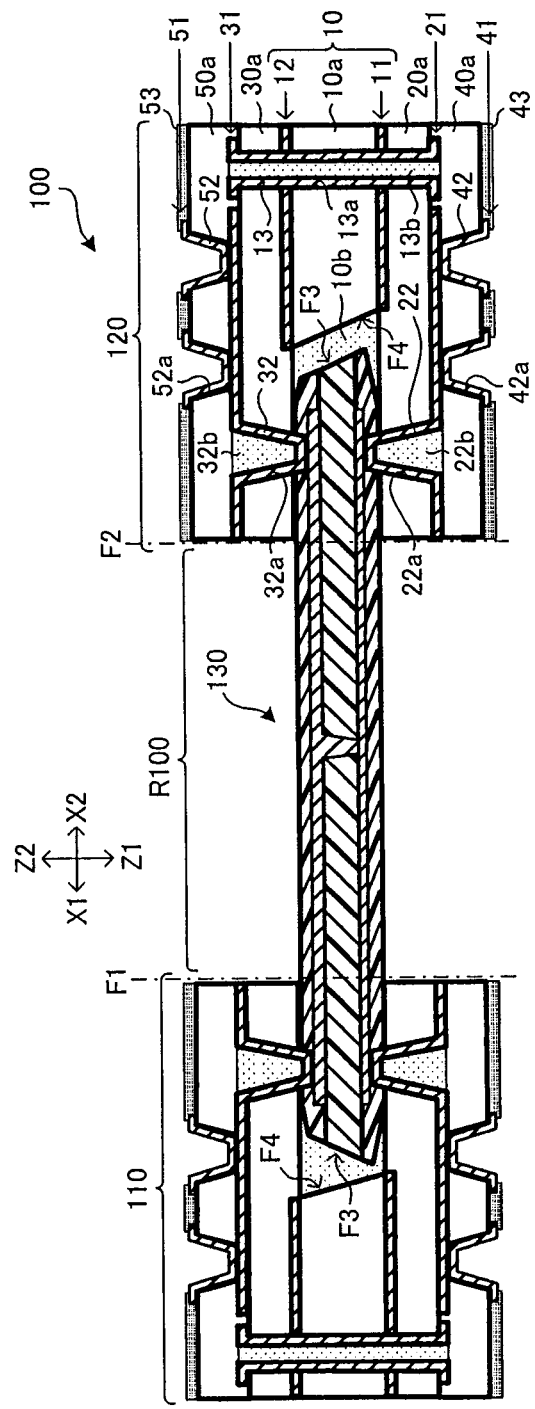
FIG. 33 is a view showing an example where one end surface of the flexible wiring board is not parallel to an end surface of the insulation layer, and the other end surface of the flexible wiring board is substantially parallel to an end surface of the insulation layer.

The above structures shown in FIGS. 29-32 may be freely combined. For example, as shown in FIG. 33, it is also acceptable if end surface (F3) at one end of flexible wiring board 130 is not parallel to end surface (F4) of insulation layer (10a) in rigid section 110, and end surface (F3) at the other end of flexible wiring board 130 is substantially parallel to end surface (F4) of insulation layer (10a) in rigid section 120.

Figure 34:
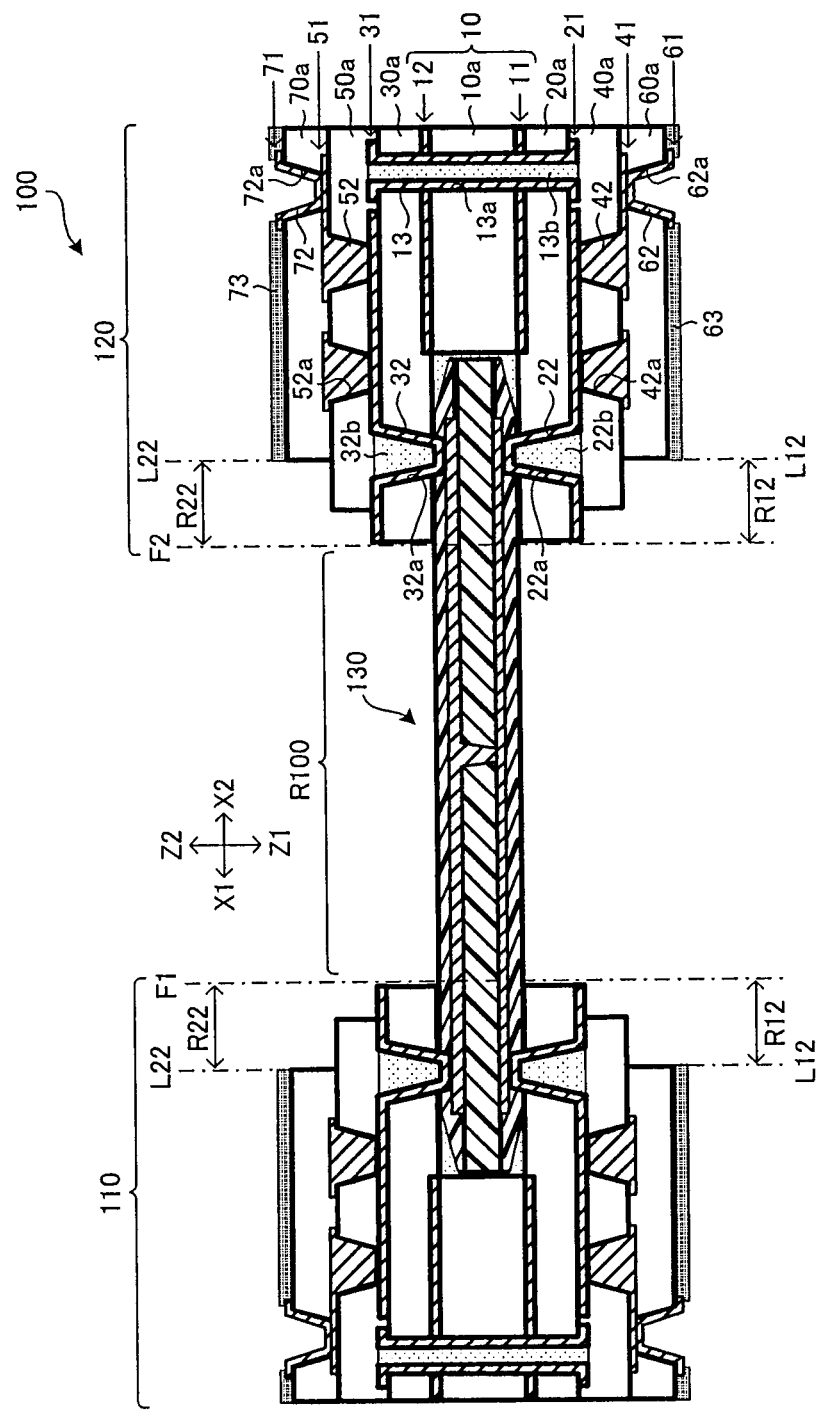
FIG. 34 is a view showing a structure where insulation layers near the boundary between a flexible section and a rigid section become lower in steps as they come closer to the boundary.
Figure 35:
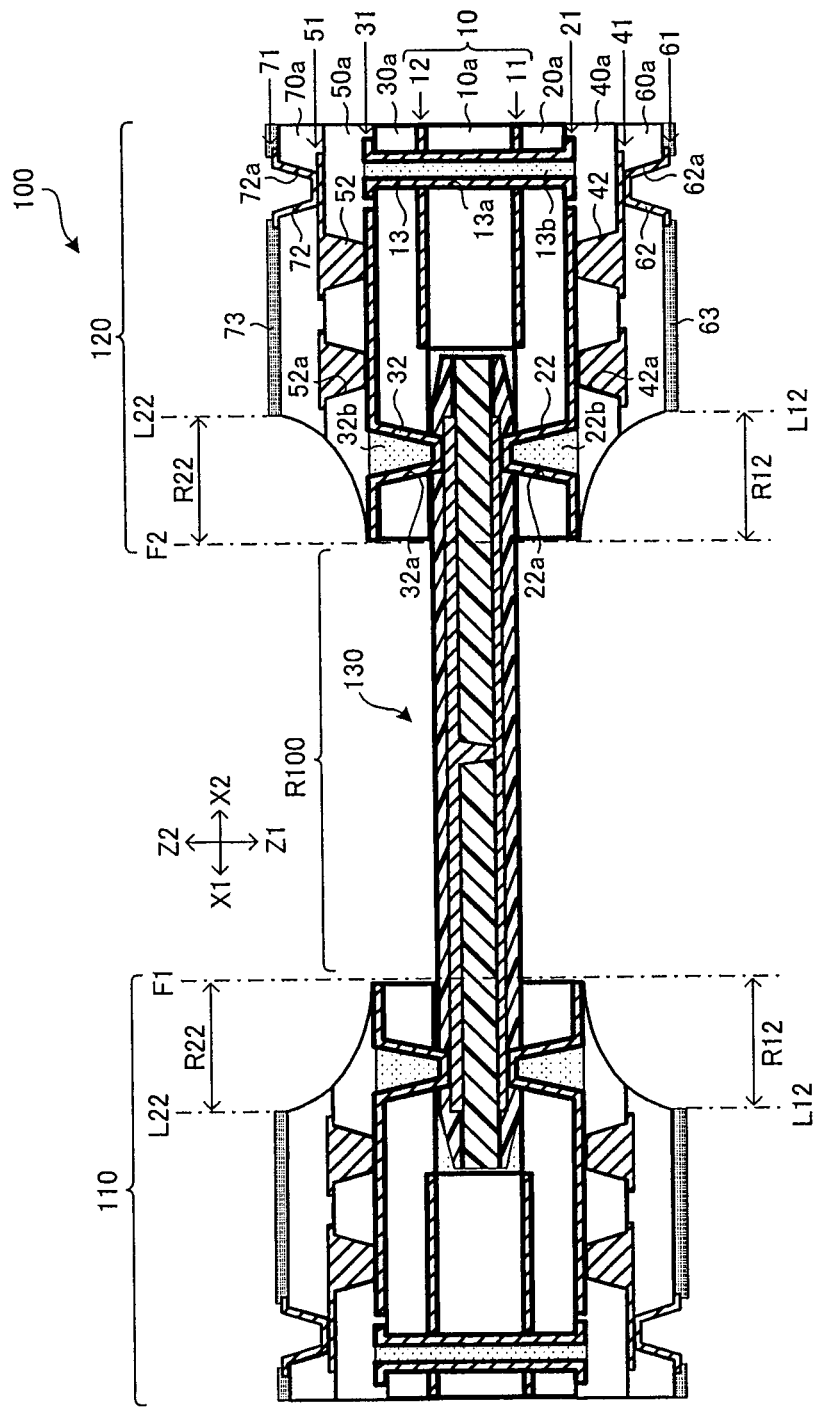
FIG. 35 is a view showing a first structure where insulation layers near the boundary between a flexible section and a rigid section become continuously lower as they come closer to the boundary.
Figure 36:
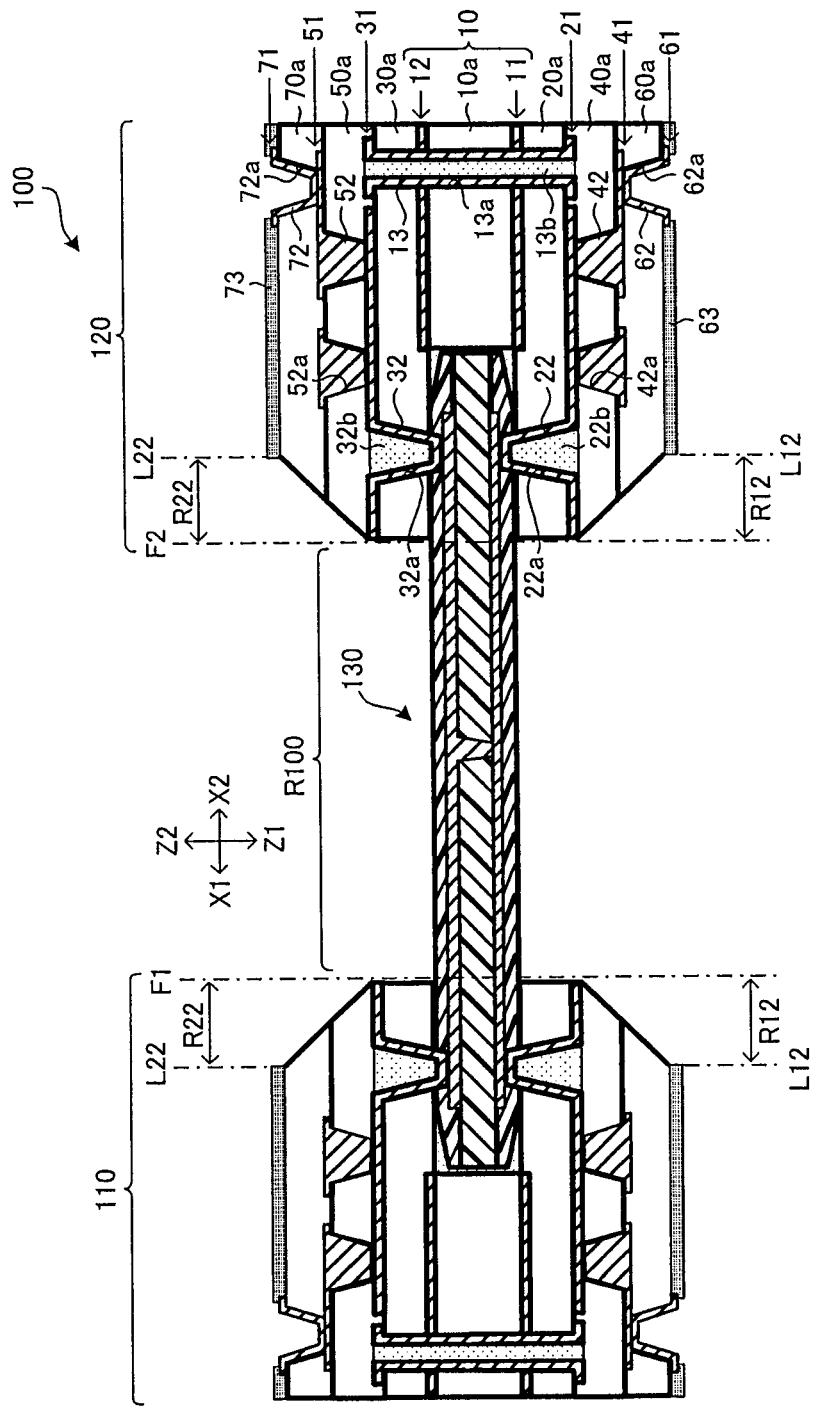
FIG. 36 is a view showing a second structure where insulation layers near the boundary between a flexible section and a rigid section become continuously lower as they come closer to the boundary.

As shown in FIGS. 34-36, insulation layers near the boundary between flexible section (R100) and rigid section 110 or 120 may become lower as they come closer to the boundary. By employing such a structure, it is thought that both end portions of flexible wiring board 130 may be even more firmly sandwiched and held by insulation layers (20*a*, 30*a*) positioned on both of their sides.

In examples shown in FIGS. 34-36, the number of layers is increased from those in flex-rigid wiring boards 100 of the above embodiments. Insulation layer (60*a*) is laminated on the first-surface side of insulation layer (40*a*), and insulation layer (70*a*) is formed on the second-surface side of insulation layer (50*a*). Wiring layer 61 is formed on insulation layer (60*a*), and wiring layer 71 is formed on insulation layer (70*a*). In addition, solder-resist layer 63 is formed on insulation layer (60*a*), and solder resist layer 73 is formed on insulation layer (70*a*). Also, hole (62*a*) is formed in insulation layer (60*a*), and hole (72*a*) is formed in insulation layer (70*a*). Connection conductors (62, 72) made of copper plating, for example, are formed respectively on the wall surfaces of holes (62*a*, 72*a*).

In an example shown in FIG. 34, range (R12), which is located between position (L12) at an end of the outermost insulation layer (insulation layer 60*a*) of rigid section 110 or 120 in the direction of flexible section (R100) and F-R boundary surface (F1) or (F2), becomes lower in steps as it comes closer to flexible section (R100). Here, an end of insulation layer (60*a*) in the direction of flexible section (R100) is located at position (L12); an end of insulation layer (40*a*) in the direction of flexible section (R100) is located midway between position (L12) and F-R boundary surface (F1) or (F2); and an end of insulation layer (20*a*) in the direction of flexible section (R100) corresponds to F-R boundary surface (F1) or (F2). Such a structure also applies to insulation layers (30*a*, 50*a*, 70*a*) on the second-surface side. However, in that situation, position (L22) shown in FIG. 34 replaces position (L12), and range (R22) replaces range (R12).

By contrast, in an example shown in FIGS. 35 and 36, range (R12), which is located between position (L12) at an end of the outermost insulation layer (insulation layer 60*a*) of rigid section 110 or 120 in the direction of flexible section (R100) and F-R boundary surface (F1) or (F2), becomes continuously lower as it comes closer to flexible section (R100).

In an example shown in FIG. 35, end surfaces of insulation layers (40*a*, 60*a*) in the direction of flexible section (R100) are curved surfaces that continue through such insulation layers (40*a*, 60*a*). Also, the same applies to insulation layers (50*a*, 70*a*) on the second-surface side.

In an example shown in FIG. 36, end surfaces of insulation layers (40*a*, 60*a*) in the direction of flexible section (R100) are sloped surfaces that continue through such insulation layers (40*a*, 60*a*). Also, the same applies to insulation layers (50*a*, 70*a*) on the second-surface side.

Structures shown in FIGS. 34-36 may be formed, for example, by shifting insulation layers when arranging them from a lower layer toward an upper layer, by etching or by shaving insulation layers by a laser or the like when forming cut lines (4011-4014) (FIG. 21), and so forth.

Figure 37A:
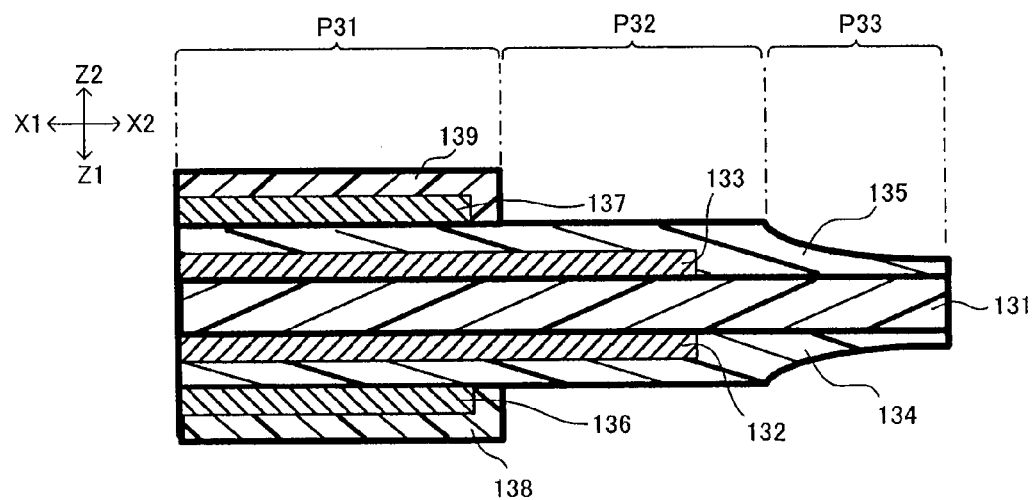
FIG. 37A is a view showing an example where a flexible wiring board becomes thinner on a curved line at a tapered portion.

As shown in FIG. 37A, the thickness of flexible wiring board 130 may decrease on a curved line at tapered portion (P33). In such a case, the first surface or the second surface of tapered portion (P33) becomes a curved surface.

Figure 37B:
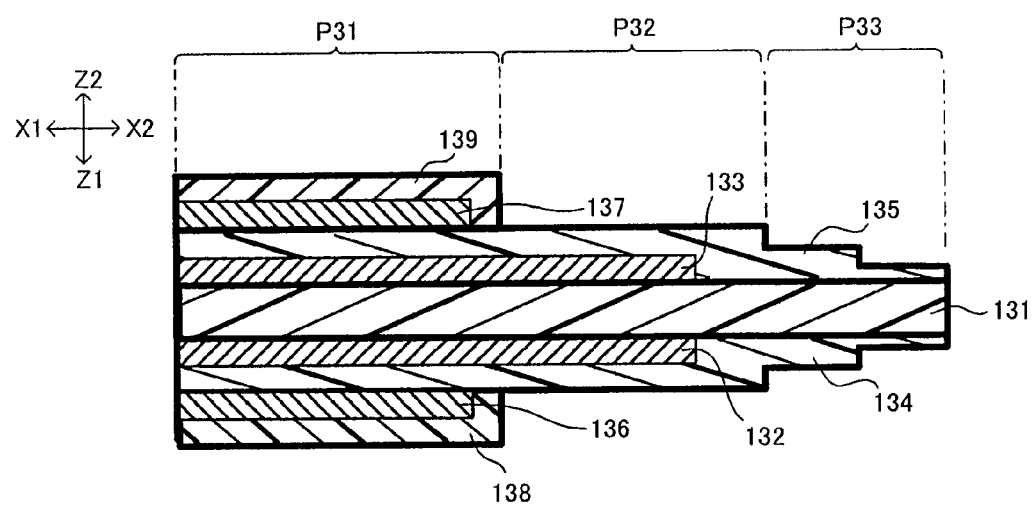
FIG. 37B is a view showing an example where a flexible wiring board becomes thinner in steps at a tapered portion.

In addition, as shown in FIG. 37B, the thickness of flexible wiring board 130 may decrease in steps at tapered portion (P33).

Figure 38A:
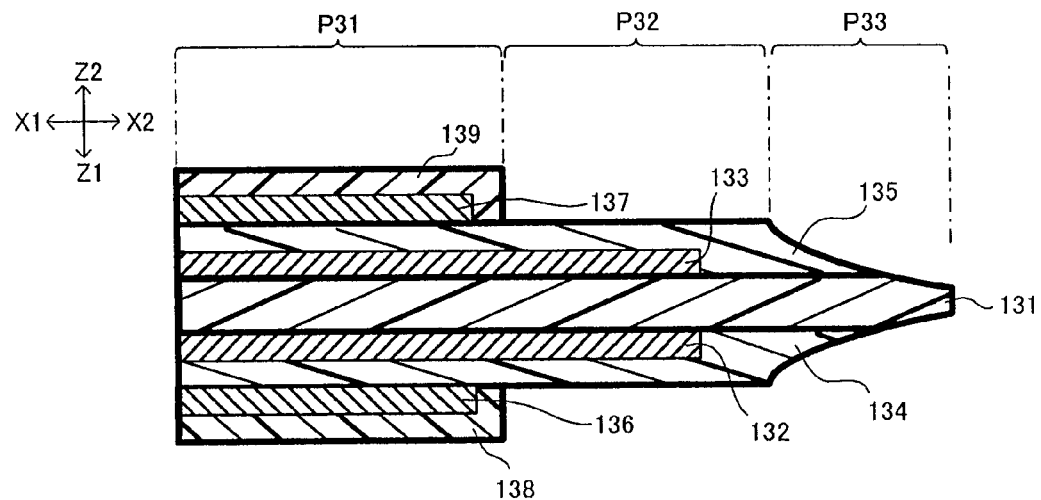
FIG. 38A is a view showing a first example where a flexible substrate also becomes thinner along with coverlays at a tapered portion.
Figure 38B:
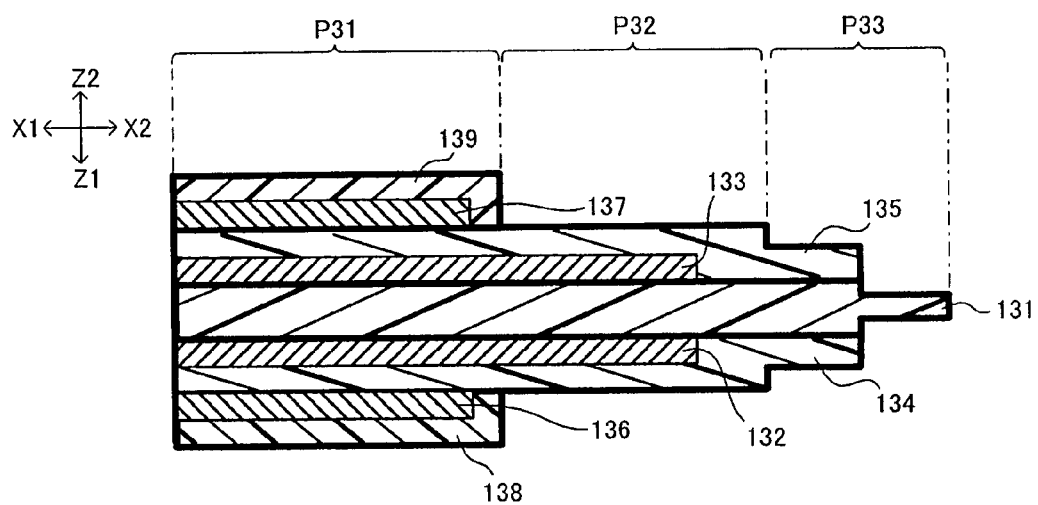
FIG. 38B is a view showing a second example where a flexible substrate also becomes thinner along with coverlays at a tapered portion.

As shown in FIG. 38A or 38B, flexible substrate 131, along with inner coverlays (134, 135), may become thinner at an end portion of flexible wiring board 130 (tapered portion P33). In such a structure, the thickness of flexible wiring board 130 may be made even thinner.

A method for forming tapered portion (P33) is not limited to the pressing described above and any other method may be employed. For example, prior to pressing (a step shown in FIG. 14), a predetermined shape may be formed by using a laser, a die, a guillotine cutter or the like. However, since such methods require more steps than pressing, pressing is preferred to easily form tapered portion (P33).

Figure 39A:
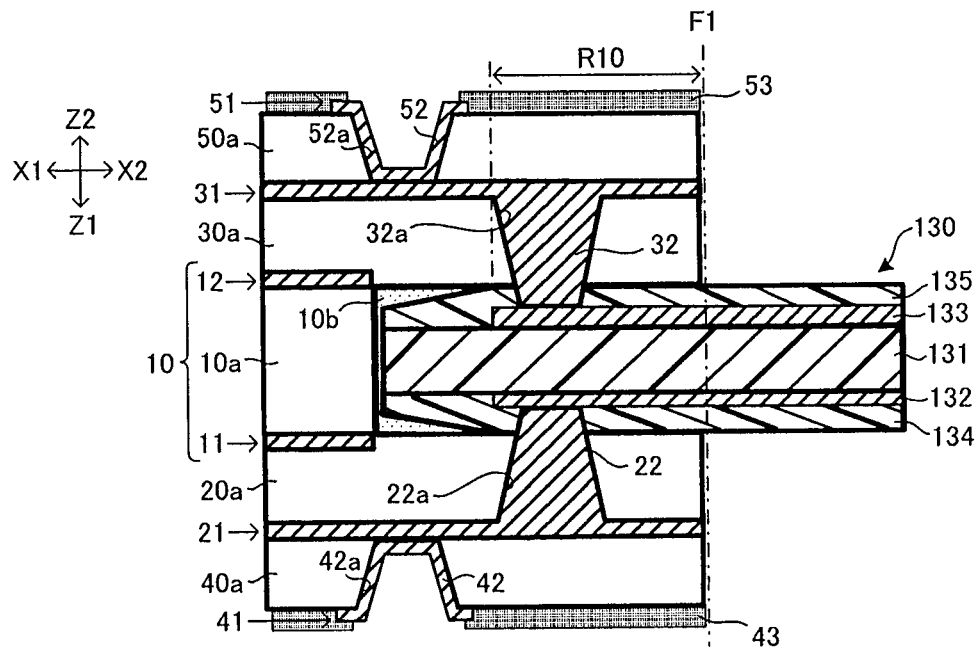
FIG. 39A is a view showing an example where connection conductors in an F-R connection section are filled conductors.

Connection conductors (22, 32) to electrically connect conductive patterns in flexible wiring board 130 (wiring layers 132, 133) and conductive patterns in rigid section 110 or 120 (wiring layers 21, 31) are not limited to conformal conductors, and they may be filled conductors as shown in FIG. 39A. When connection conductors (22, 32) are filled conductors, it is thought that conductive patterns in flexible wiring board 130 (wiring layers 132, 133) and conductive patterns in rigid section 110 or 120 (wiring layers 21, 31) are connected more firmly.

Figure 39B:
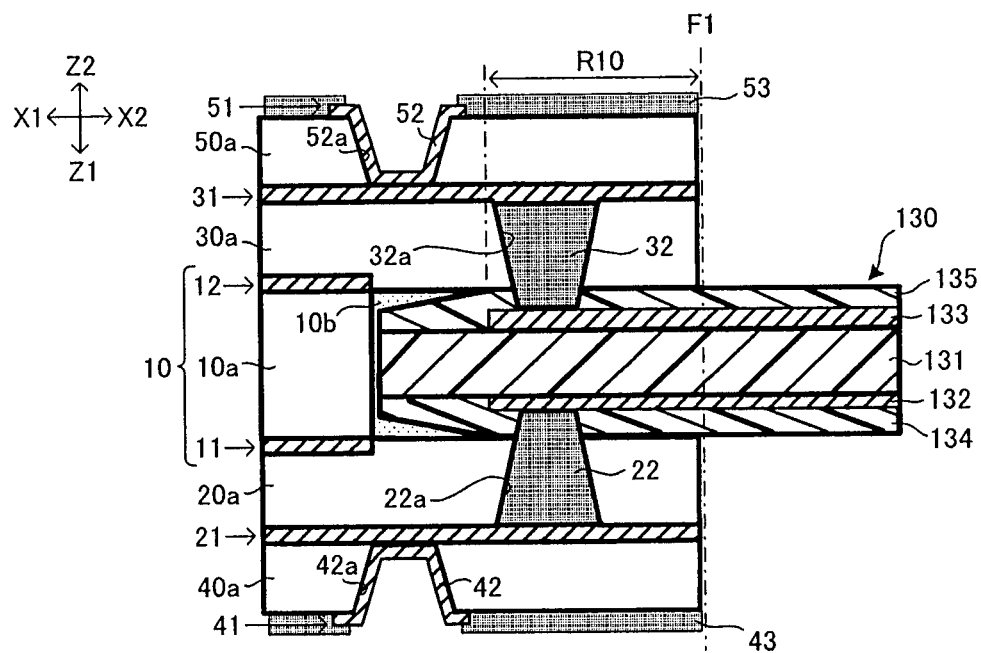
FIG. 39B is a view showing an example where connection conductors in an F-R connection section are made of conductive paste.

Connection conductors (22, 32) to electrically connect conductive patterns in flexible wiring board 130 (wiring layers 132, 133) and conductive patterns in rigid section 110 or 120 (wiring layers 21, 31) may be formed using conductive paste as shown in FIG. 39B. Connection conductors (22, 32) may be filled conductors or conformal conductors. Also, as shown in FIG. 39B, wiring layer 21 or 31 and connection conductor 22 or 32 may be formed using different materials from each other.

Figure 40A:
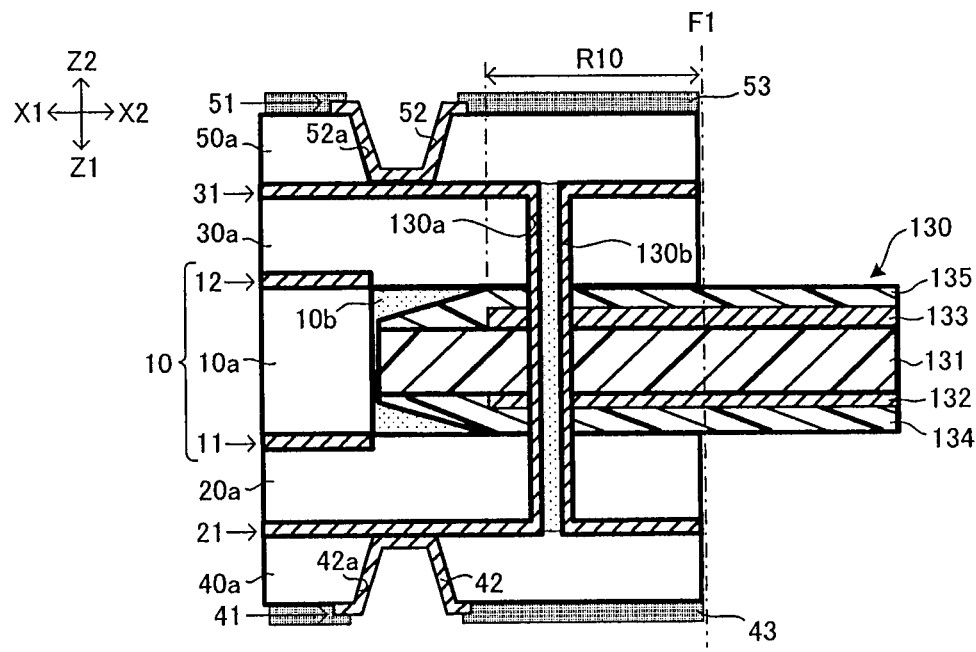
FIG. 40A is a view showing a first example where a connection conductor in an F-R connection section is a conductor in a through hole.
Figure 40B:
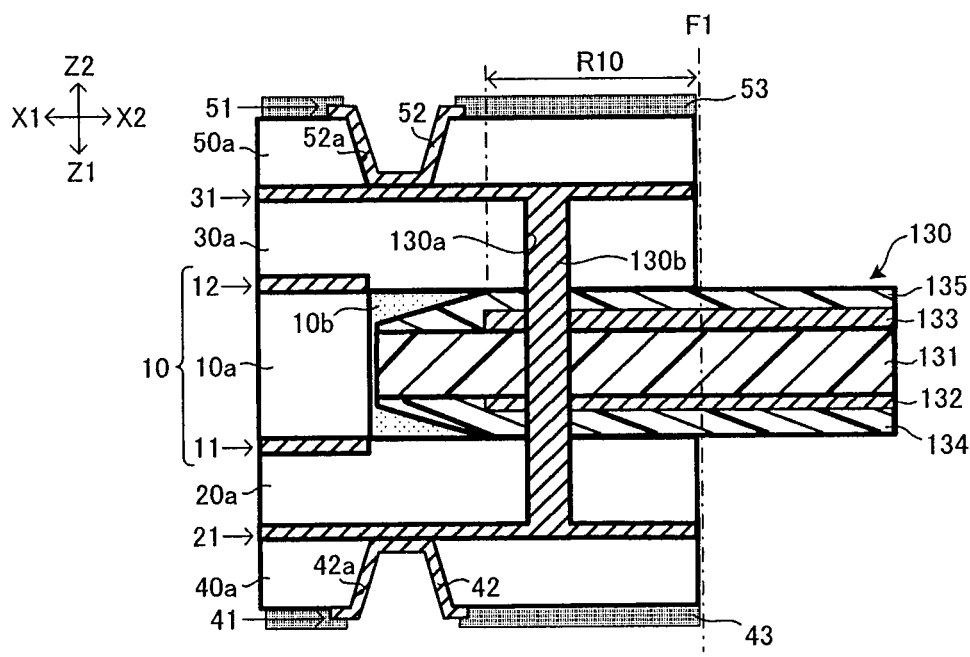
FIG. 40B is a view showing a second example where a connection conductor in an F-R connection section is a conductor in a through hole.

As shown in FIGS. 40A, 40B), conductive patterns in flexible wiring board 130 (wiring layers 132, 133) and conductive patterns in rigid section 110 or 120 (wiring layers 21, 31) may be electrically connected to each other by means of conductor (130*b*) (conformal conductor or filled conductor) in through hole (130*a*) which penetrates through insulation layer (30*a*), flexible wiring board 130 and insulation layer (20*a*). In such examples, wiring layers (21, 31, 132, 133) are electrically connected by means of conductor (130*b*). If such a connection method is employed, since holes in multiple layers may be formed all at once, manufacturing flex-rigid wiring board 100 becomes easier compared with situations in which holes are formed in each layer. Through hole (130*a*) may also penetrate through rigid section 110 or 120.

Figure 41:
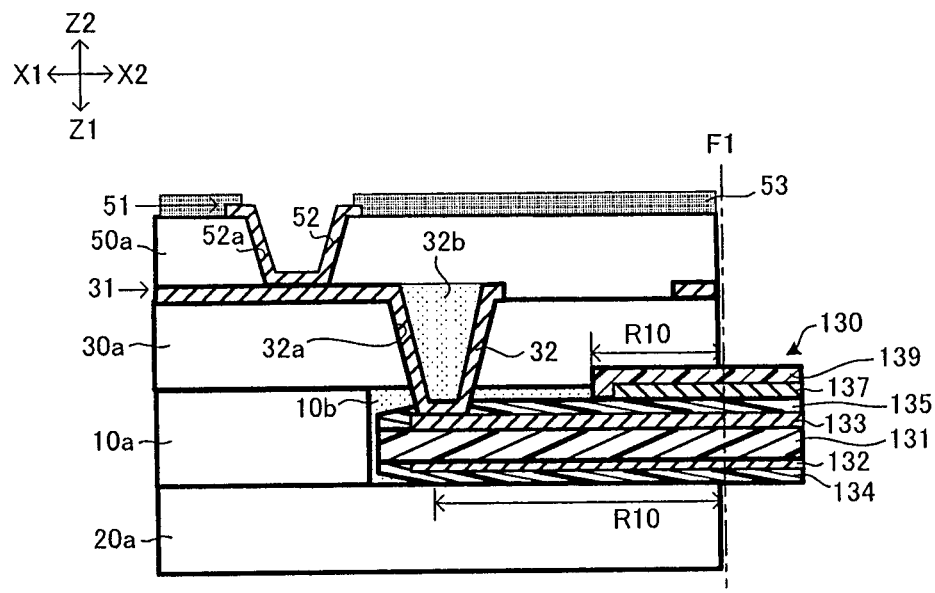
FIG. 41 is a view showing an example where only either one of the wiring layers formed on both surfaces of a flexible wiring board is electrically connected to a conductive pattern in a rigid section.

As shown in FIG. 41, it is also acceptable if only either wiring layer 132 or 133 is electrically connected to a conductive pattern (wiring layer 21 or 31) in rigid sections (110, 120). In an example in FIG. 41, only wiring layer 31 is connected to wiring layer 133 by means of connection conductor 32.

Figure 42:
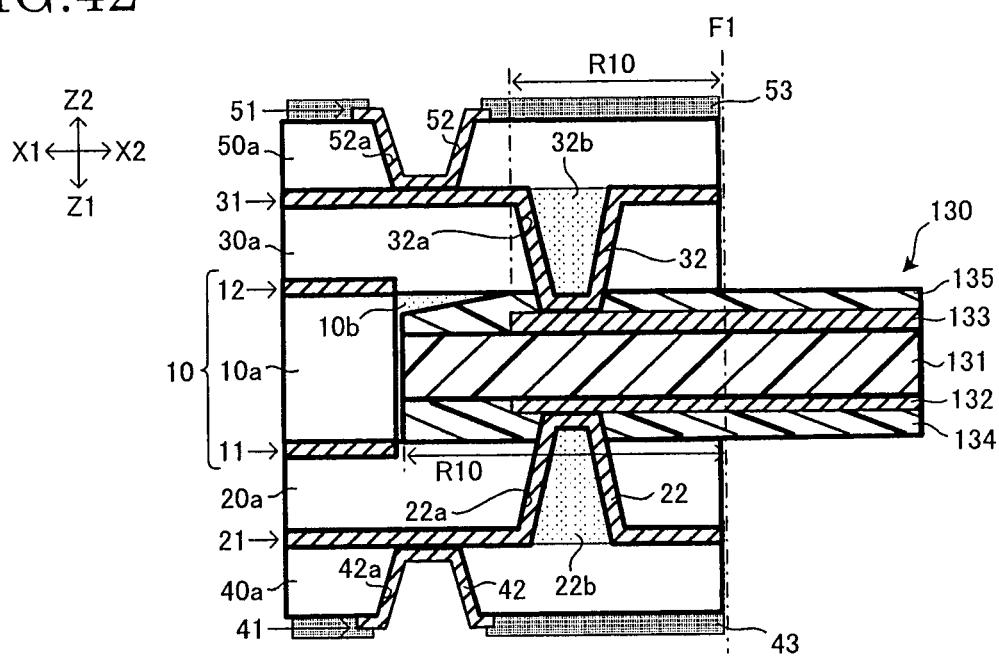
FIG. 42 is a view showing an example where only one surface of an end portion of a flexible wiring board is tapered.

It is not required that an end portion of flexible wiring board 130 be tapered both on the first-surface side and the second-surface side. For example, only the second-surface side of an end portion of flexible wiring board 130 may be tapered as shown in FIG. 42. However, if both first-surface and second-surface sides of an end portion of flexible wiring board 130 are tapered, it is thought that above-described effects to enhance connection reliability or the like are greater.

Figure 43A:
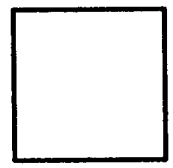

The shape of horizontal cross sections (X-Y plane) of connection conductors and their holes is not limited to a circle (completely round circle), and any other shape may be employed. The shape of such cross sections may be a square as shown in FIG. 43A, for example, or may be any other regular polygons, such as a regular hexagon or a regular octagon. The shape of angles in such polygons is not limited to any type, and may be a right angle, an acute angle, or an obtuse angle, or may even be roundish, for example. However, to prevent thermal stress from being concentrated, it is preferred that angles be roundish.

Also, the shape of the above horizontal cross sections may be oval, rectangular, triangular or the like.

The above circles, ovals and regular polygons have advantages since their shapes tend to be similar to the shape of the holes.

Figure 43B:
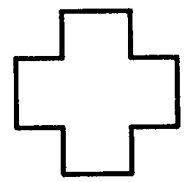
Figure 43C:
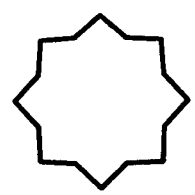

Alternatively, as shown in FIG. 43B or 43C, shapes such as a cross or a regular polygonal star formed by drawing straight lines to radiate out from the center (shapes in which multiple spokes are positioned in a radial pattern) are effective as the shape of the above horizontal cross sections.

Figure 44A:
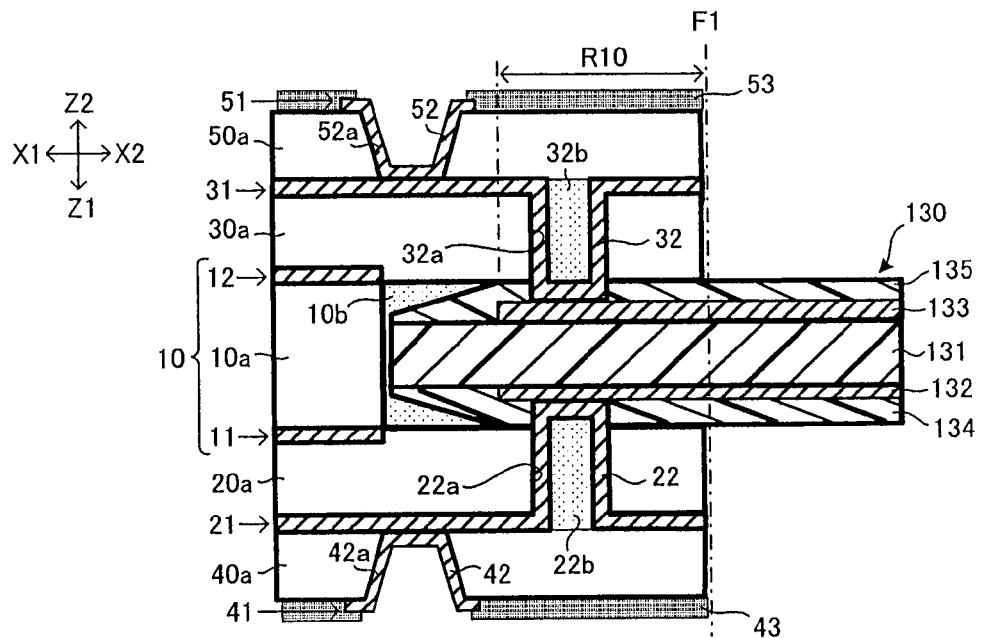
FIG. 44A is a view showing a first alternative example of a vertical cross-sectional shape of connection conductors in an F-R connection section.
Figure 44B:
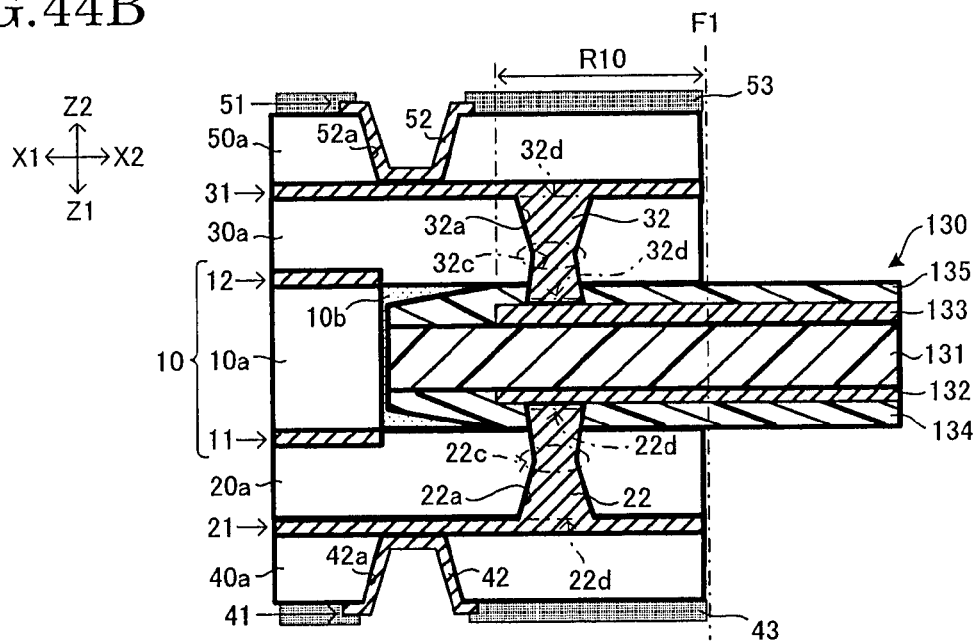
FIG. 44B is a view showing a second alternative example of a vertical cross-sectional shape of connection conductors in an F-R connection section.

The shape of vertical cross sections of connection conductors may be formed freely. For example, as shown in FIG. 44A, holes (22a, 32a) in which connection conductors (22, 32) are formed may be formed to be cylindrical. Alternatively, as shown in FIG. 44B, connection conductors (22, 32) may be formed in such a way that the width at middle portions (22c, 32c), which are positioned at substantially the middle in a thickness direction, is smaller than the width at opening portions (22d, 32d) on the first surface and the second surface. If holes are formed as such, since the width at opening portions (22d, 32d) is greater than the width at middle portions (22c, 32c), it is thought that better performance is expected when the holes are filled by plating. As a result, it is thought that surface flatness features are enhanced. Also, connection conductors (22, 32) have the smallest cross sections at middle portions (22c, 32c). Accordingly, it is thought that connection areas between insulation layers (20a, 30a) and connection conductors (22, 32) increase. In addition, stress is concentrated in portions on connected conductors (22, 32) away from wiring layers (21, 31). Accordingly, it is thought that stress from side directions (directions X or directions Y) is dispersed and that connection conductors (22, 32) are suppressed from peeling caused by concentrated stress. In addition, as a result, it is thought that connection reliability increases.

Figure 45:
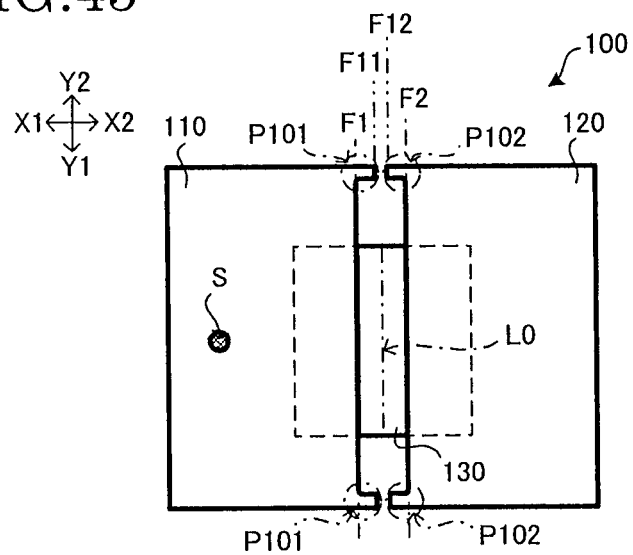
FIG. 45 is a view showing an example where rigid sections have protruding portions that protrude from the boundary surface with a flexible section.

As shown in FIG. 45, rigid sections (110, 120) may have protruding portions (P101, P102) which protrude from F-R boundary surfaces (F1, F2) between flexible section (R100) and the rigid sections. In an example shown in FIG. 45, rigid section 110 has two protruding portions (P101), and rigid section 120 has two protruding portions (P102). Protruding portions (P101) are positioned on the Y1 side and Y2 side of flexible wiring board 130, and protrude toward the X2 side from F-R boundary surface (F1) between rigid section 110 and flexible section (R100). On the other hand, protruding portions (P102) are positioned on the Y1 side and Y2 side of flexible wiring board 130, and protrude toward the X1 side from F-R boundary surface (F2) between rigid section 120 and flexible section (R100). The planar shape of protruding portions (P101, P102) (the shape on the X-Y plane) is rectangular, for example. Excessive stress may be prevented from occurring in the F-R connection sections by forming such protruding portions (P101, P102). Descriptions of such an effect are provided in the following with reference to FIG. 46.

It is thought that flex-rigid wiring board 100 may be folded in two at line (L0) in FIG. 45, for example, and accommodated in casing 5001 of a cell phone or the like. When being folded in two, curved portion (P103) is formed near line (L0) of flexible wiring board 130. In such a case, flex-rigid wiring board 100 may be pressed against casing 5001 due to vibrations or swinging.

Figure 46:
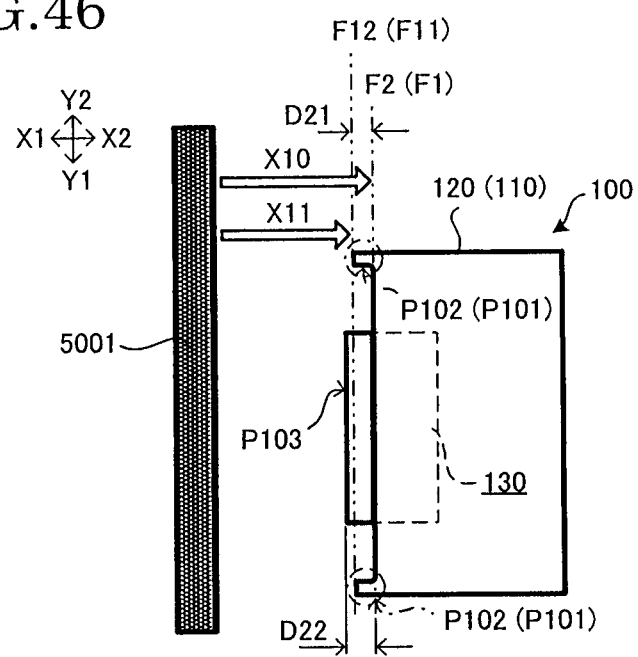
FIG. 46 is a view to illustrate the effects of the protruding portions shown in FIG. 45.

During such time, without protruding portions (P101, P102), casing 5001 may move freely until it touches F-R boundary surface (F1) or (F2) as indicated by arrow (X10) in FIG. 46. In such a situation, if force toward the X2 side is exerted on casing 5001 due to vibrations or the like, it is thought that curved portion (P103) of flexible wiring board 130 is pushed into the X2 side by casing 5001. Moreover, if curved portion (P103) of flexible wiring board 130 is further pushed near F-R boundary surface (F1) or (F2), great force is generated at the F-R connection sections, and line breakage or the like becomes a concern.

By contrast, with protruding portions (P101, P102), as indicated by arrow (X11) in FIG. 46, the movement of casing 5001 is restricted by top surfaces (F11) of protruding portions (P101) or top surfaces (F12) of protruding portions (P102). Therefore, casing 5001 is not push curved portion (P103) of flexible wiring board 130 any further. Accordingly, stress is seldom generated at the F-R connection sections. As a result, line breakage or the like is suppressed from occurring at the F-R connection sections.

Figure 47:
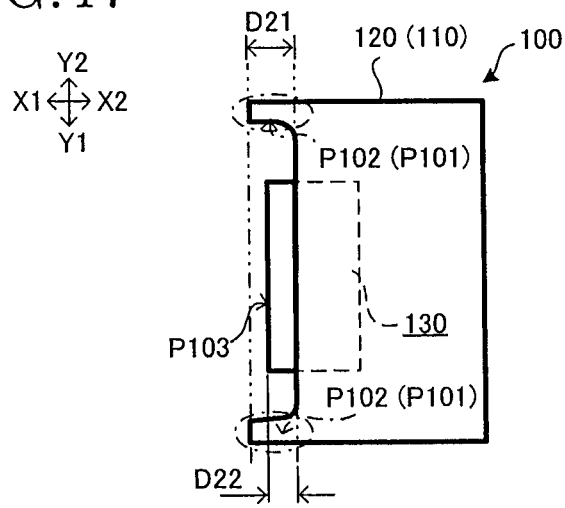
FIG. 47 is a view showing a first alternative example of the form of protruding portions.

The protruding amount (D21) of protruding portions (P101, P102) is approximately 1 mm, for example. The protruding amount (D22) of curved portion (P103) of flexible wiring board 130 is approximately 2-3 mm, for example. Namely, in such an example, (D22) is set greater than (D21) (D21<D22). However, the protruding amounts are not limited to such, and (D22) may be set smaller than (D21) (D22<D21) as shown in FIG. 47, for example. By so setting, it is difficult for casing 5001 to even touch curved portion (P103) of flexible wiring board 130.

Figure 48A:
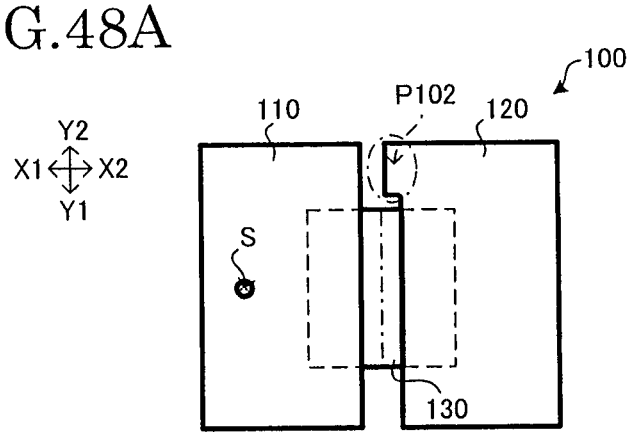
FIG. 48A is a view showing a second alternative example of the form of a protruding portion.
Figure 48B:
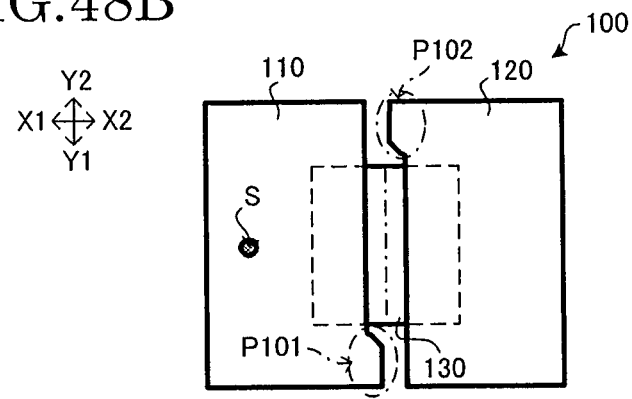
FIG. 48B is a view showing a third alternative example of the form of protruding portions.

The number, shape, positioning and so forth of protruding portions (P101, P102) are not limited specifically. For example, as shown in FIG. 48A, one protruding portion (P102) may be formed only in either rigid section 110 or 120; for example, only in rigid section 120. Alternatively, as shown in FIG. 48B, for example, the planar shape of protruding portions (P101, P102) may be trapezoidal. As in the example shown in FIG. 48B, protruding portion (P101) may be formed on the Y1 side of flexible wiring board 130, and protruding portion (P102) may be formed on the Y2 side of flexible wiring board 130.

Figure 49A:
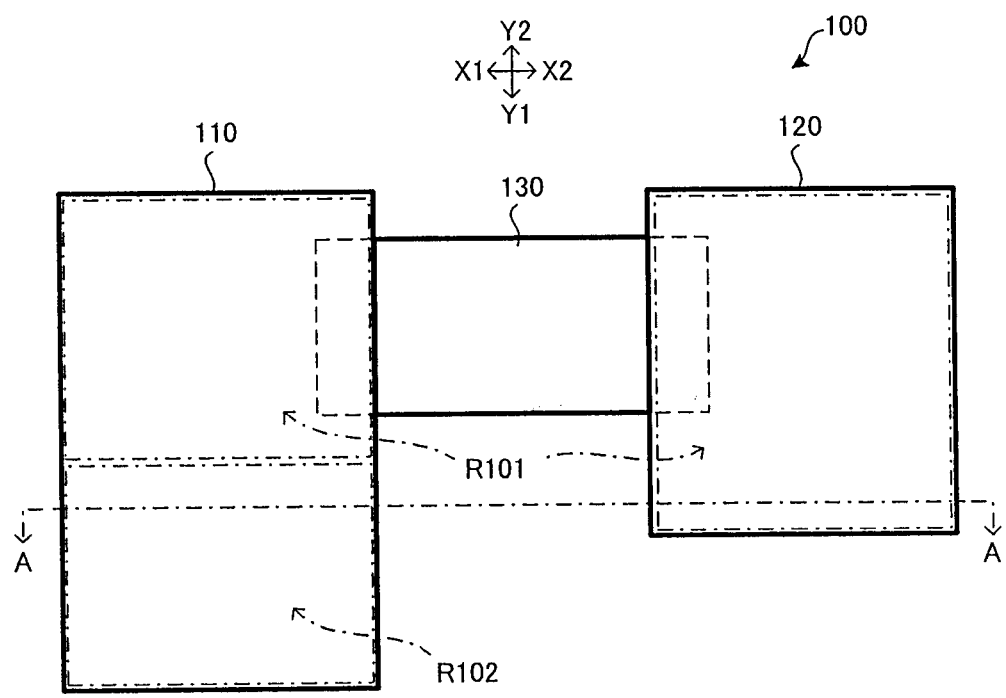
FIG. 49A is a view showing an example where a rigid section has multiple regions with a different number of layers from each other.
Figure 49B:
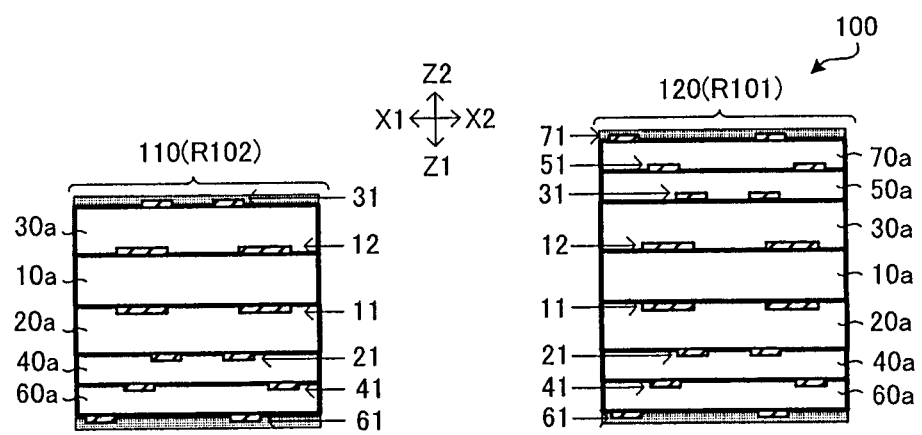
FIG. 49B is a cross-sectional view seen from the A-A line of FIG. 49A.

Rigid section 110 or 120 may contain multiple regions having a different number of layers from each other. For example, as shown in FIG. 49A and FIG. 49B (cross-sectional view seen from the (A-A) line in FIG. 49A), rigid section 110 may have nine-layered region (R101) and six-layered region (R102). Region (R102) having fewer layers than region (R101) may be formed by masking or the like so that more than a predetermined number of layers are not laminated. However, forming methods are not limited to the above, and the number of layers may be adjusted by removing the unnecessary layers after they are laminated.

Figure 50A:
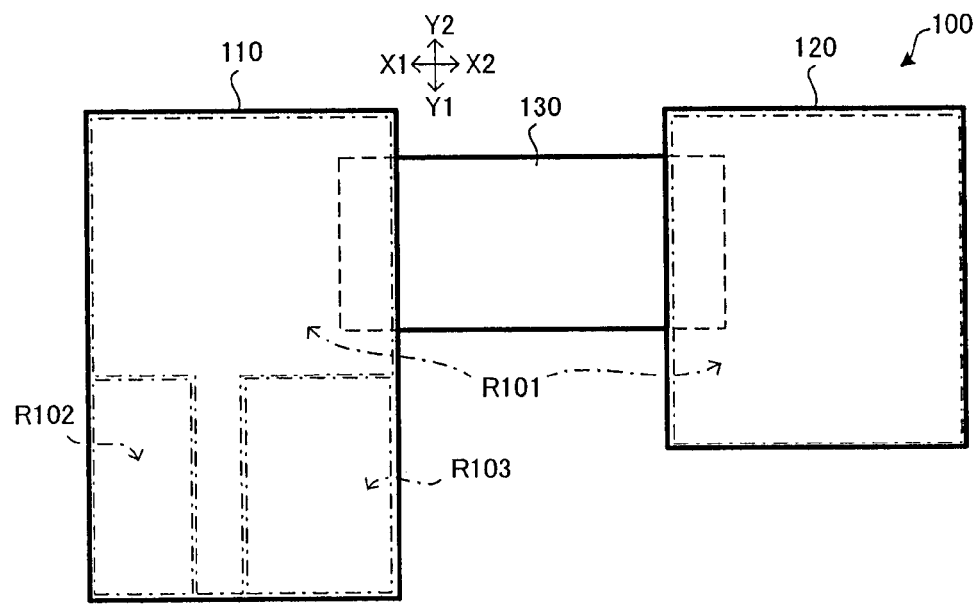
FIG. 50A is a view showing an example where a rigid section has three regions with a different number of layers from each other.

At least either rigid section 110 or 120 may contain three or more regions having a different number of layers from each other. For example, as shown in FIG. 50A, rigid section 110 may contain three regions (R101-R103) having a different number of layers from each other.

Figure 50B:
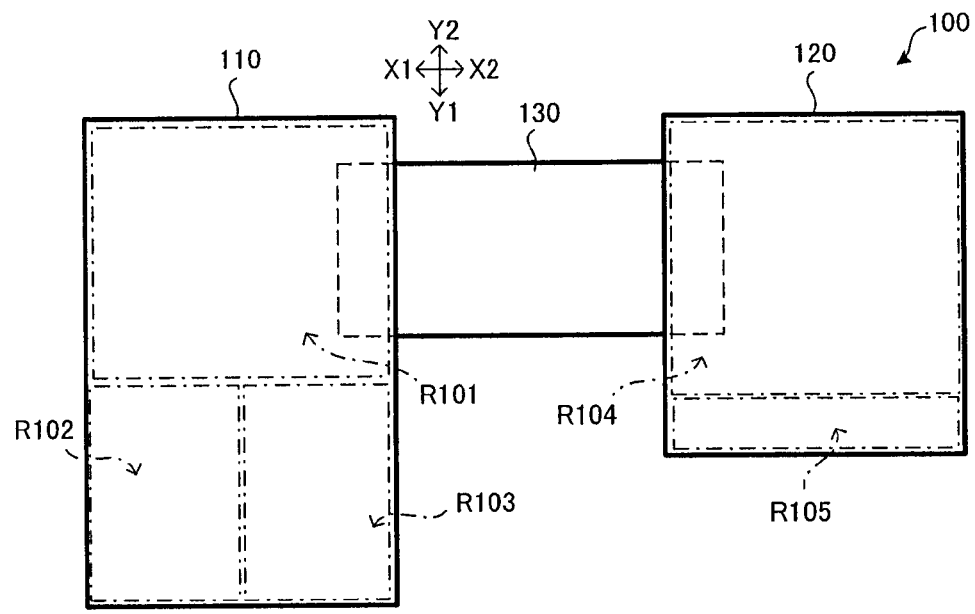
FIG. 50B is a view showing an example where two rigid sections each have multiple regions with a different number of layers from each other.

Both rigid sections 110 and 120 may contain multiple regions having a different number of layers from each other. For example, as shown in FIG. 50B, rigid section 110 may contain three regions (R101-R103) having a different number of layers from each other, and rigid section 120 may contain two regions (R104, R105) having a different number of layers from each other.

In FIGS. 49A-50B, regions (R101-R105) each have a different number of layers from the other regions. If regions (R101-R105) are listed in order of the region with the most layers to the region with the fewest layers, the order is, for example, region (R101), region (R102), region (R103), region (R104) and region (R105) (region (R101)>region (R102)>region (R103)>region (R104)>region (R105)).

The number of flexible wiring boards 130 is not limited specifically. For example, to enhance the bendability of flexible section (R100), it is effective if multiple flexible wiring boards are positioned so as to be detached from each other in lamination directions (directions Z) of insulation layers (10a, 20a, 30a), as shown in FIG. 51 or 52.

Figure 51:
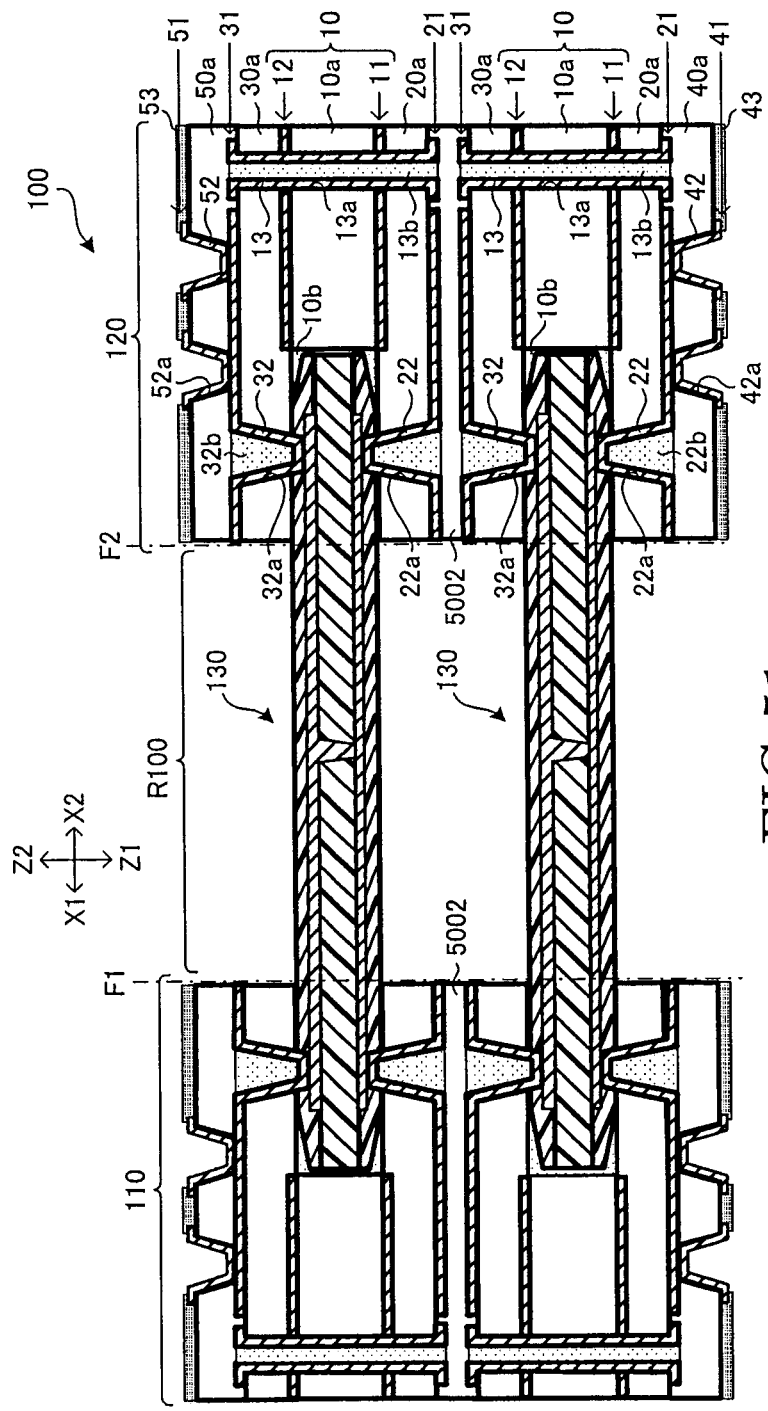
FIG. 51 is a view showing an example of a flex-rigid wiring board having two sets of core sections connected to flexible wiring boards.

In an example shown in FIG. 51, flex-rigid wiring board 100 has two sets of core sections (substrate 10 and insulation layers (20a, 30a) and the like positioned on both of its sides) which are connected to flexible wiring boards 130. The two sets of core sections are connected by means of connection layers 5002. Then, multiple flexible wiring boards 130 are positioned so as to be detached from each other in lamination directions (directions Z). The material for connection layers 5002 is, for example, the same as the above-described interlayer insulation layers (insulation layer (40a) and the like). Connection layers 5002 are formed by curing prepreg, for example.

Figure 52:
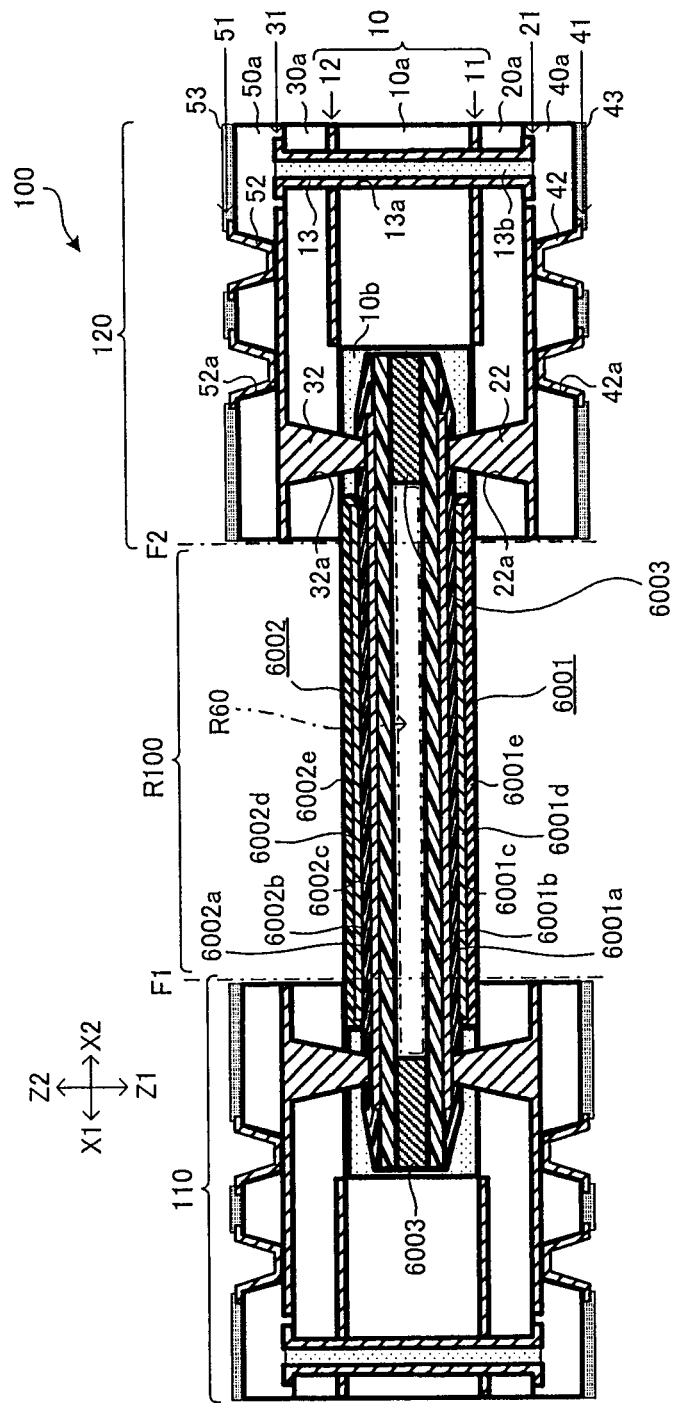
FIG. 52 is a view showing an example of a flex-rigid wiring board having two single-sided flexible wiring boards.

Alternatively, as shown in FIG. 52, for example, flex-rigid wiring board 100 may have two single-sided flexible wiring boards; flexible wiring board 6001 and flexible wiring board 6002. Flexible wiring board 6001 has flexible substrate (6001a), wiring layer (6001b), inner coverlay (6001c), shield layer (6001d) and outer coverlay (6001e). Shield layer (6001d) is formed over wiring layer (6001b). Accordingly, electromagnetic noise or the like to wiring layer (6001b) is blocked by shield layer (6001d). Meanwhile, flexible wiring board 6002 has flexible substrate (6002a), wiring layer (6002b), inner coverlay (6002c), shield layer (6002d) and outer coverlay (6002e). Shield layer (6002d) is formed over wiring layer (6002b). Accordingly, electromagnetic noise or the like to wiring layer (6002b) is blocked by shield layer (6002d). The material or the like for each member is the same as for flexible wiring board 130 as shown in FIG. 3, for example.

In an example shown in FIG. 52, flexible wiring board 6001 has wiring layer (6001b) on the first-surface side, and flexible wiring board 6002 has wiring layer (6002b) on the second-surface side. Then, the second-surface side of flexible wiring board 6001 and the first-surface side of flexible wiring board 6002 are physically connected by sandwiching bonding sheet 6003. Space (R60) sealed by bonding sheet 6003 is formed between flexible wiring board 6001 and flexible wiring board 6002. Space (R60) is formed to be a rectangular cuboid, for example. However, the shape, number, positioning and the like of space (R60) are not limited to the above and any other type may be employed (see later-described FIGS. 57A-57C).

Wiring layer 21 is electrically connected to a conductive pattern on the first-surface side of flexible wiring board 6001 (wiring layer 6001b) by means of connection conductor 22 in insulation layer (20a). Also, wiring layer 31 is electrically connected to a conductive pattern on the second-surface side of flexible wiring board 6002 (wiring layer 6002b) by means of connection conductor 32 in insulation layer (30a). Connection conductors (22, 32) are conductors which are filled in holes (22a, 32a) formed in insulation layers (20a, 30a), namely, filled conductors. When connection conductors (22, 32) are made filled conductors, it is thought that conductive patterns (wiring layers 6001b, 6002b) in flexible wiring boards (6001, 6002) are connected more firmly with conductive patterns (wiring layers 21, 31) in rigid sections (110, 120).

A method for manufacturing flex-rigid wiring board 100 shown in FIG. 52 is described in the following. First, two examples are shown in regard to a method for connecting flexible wiring board 6001 and flexible wiring board 6002.

Figure 53A:
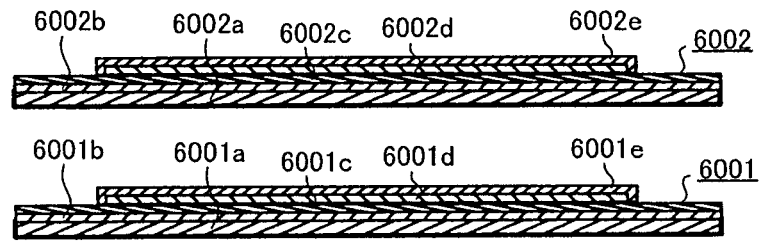
FIG. 53A is a view to illustrate a first step of a first method for connecting two single-sided flexible wiring boards.

In the first example, flexible wiring boards 6001 and 6002 are prepared as shown in FIG. 53A. A method for manufacturing such flexible wiring boards 6001 and 6002 is the same as that for flexible wiring board 130 according to the above second embodiment, for example.

Figure 53B:
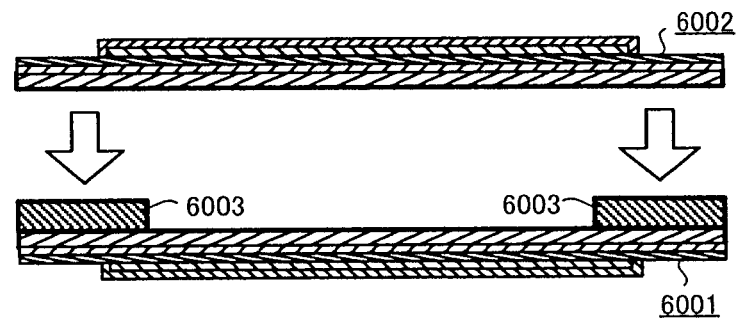
FIG. 53B is a view to illustrate a second step subsequent to the step in FIG. 53A.

Next, as shown in FIG. 53B, flexible wiring board 6001 and flexible wiring board 6002 are connected by means of bonding sheet 6003. In bonding sheet 6003, a hole corresponding to the shape of space (R60) is formed in advance.

Figure 54A:
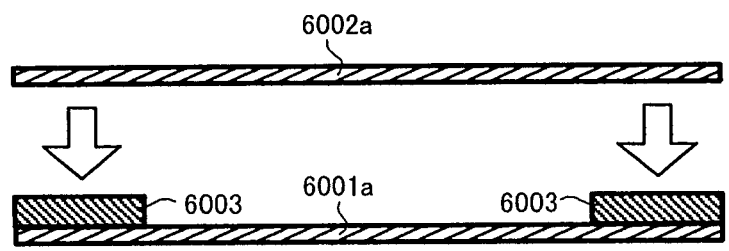
FIG. 54A is a view to illustrate a first step of a second method for connecting two single-sided flexible wiring boards.
Figure 54B:
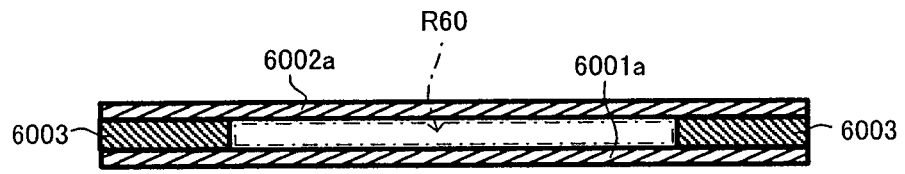
FIG. 54B is a view to illustrate a second step subsequent to the step in FIG. 54A.

On the other hand, in the second example, flexible substrates (6001a, 6002a) and bonding sheet 6003 are prepared as shown in FIG. 54A, and flexible substrate (6001a) and flexible substrate (6002a) are connected by means of bonding sheet 6003 as shown in FIG. 54B. Then, flexible wiring boards 6001 and 6002 are manufactured by the same method as in flexible wiring board 130 according to the above second embodiment, for example.

Figure 55A:
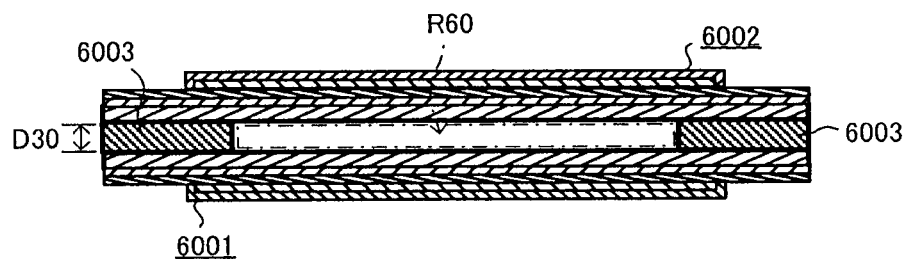
FIG. 55A is a view showing an example of the connected body of two single-sided flexible wiring boards.

A connected body of flexible wiring board 6001 and flexible wiring board 6002 may be manufactured as shown in FIG. 55A by employing either the above first example or the second example. Then, steps that correspond to those shown in FIGS. 11-22, for example, are conducted. In doing so, at both end portions of flexible wiring boards (6001, 6002), connection conductor 14 is connected to wiring layer (6001b), and connection conductor 34 is connected to wiring layer (6002b). Also, built-up sections, flexible section (R100) and the like are formed. As a result, flex-rigid wiring board 100 is completed as shown in FIG. 52.

It is thought that the bendability of flexible section (R100) is improved by positioning space (R60) between flexible wiring board 6001 and flexible wiring board 6002. Moreover, flexible section (R100) in an example shown in FIG. 52 is structured with two single-sided wiring boards (flexible wiring boards 6001 and 6002). Thus, flexible section (R100) is thinner than an example in which double-sided wiring boards are connected. As a result, it is thought that the bendability of flexible section (R100) is improved.

To improve bendability, height (D30) of space (R60) is preferred to be set at 2 mm or less. Height (D30) of space (R60) corresponds to the thickness of bonding sheet 6003.

Figure 55B:
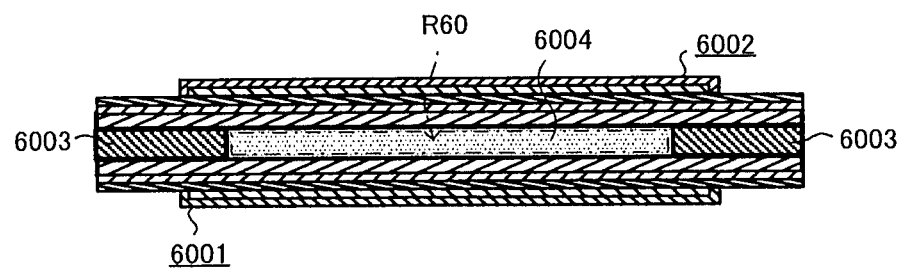
FIG. 55B is a view showing an example where filler is filled in the space arranged between two flexible wiring boards.

Gas such as air may be sealed in space (R60). However, when a heat cycle occurs during the manufacturing steps or the like, there is a concern that the quality of flex-rigid wiring board 100 deteriorates due to the repeated expansion/contraction of the gas in space (R60). Therefore, it is preferred that the gas in space (R60) be eliminated through decompression, for example. Alternatively, as shown in FIG. 55B, by filling filler 6004 (such as gel) in space (R60), the gas in space (R60) may be eliminated.

Figure 56:
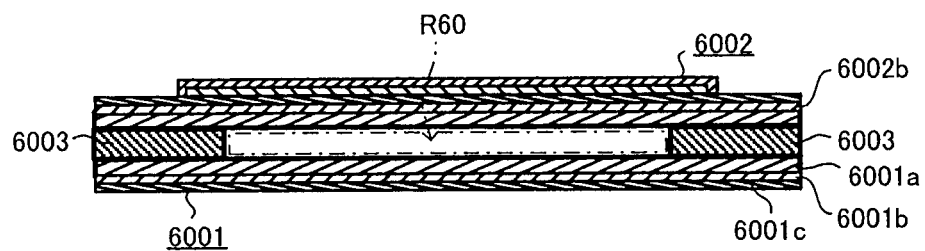
FIG. 56 is a view showing an example where the conductive pattern on one of the two flexible wiring boards is set to be a full plain conductive pattern.

A conductive pattern of either flexible wiring board 6001 or 6002, for example, wiring layer (6001b) of flexible wiring board 6001, may be formed as a full plain conductive pattern (such as a full plain copper pattern) as shown in FIG. 56, and shield layer (6001d) and outer coverlay (6001e) may be omitted. In doing so, the flexible section becomes even thinner, and it is thought that the bendability of flexible section (R100) is further improved.

When a wiring pattern is formed only on one surface in a method shown in FIGS. (54A, 54B), conductive layers are formed on both surfaces and then the conductive layer that becomes wiring layer (6001b) is masked entirely using resist, and the conductive layer that becomes wiring layer (6002b) is patterned using a lithographic technique, for example. Accordingly, wiring layer (6002b) is formed as a wiring pattern and wiring layer (6001b) is formed as a full plain conductive pattern.

Figure 57A:
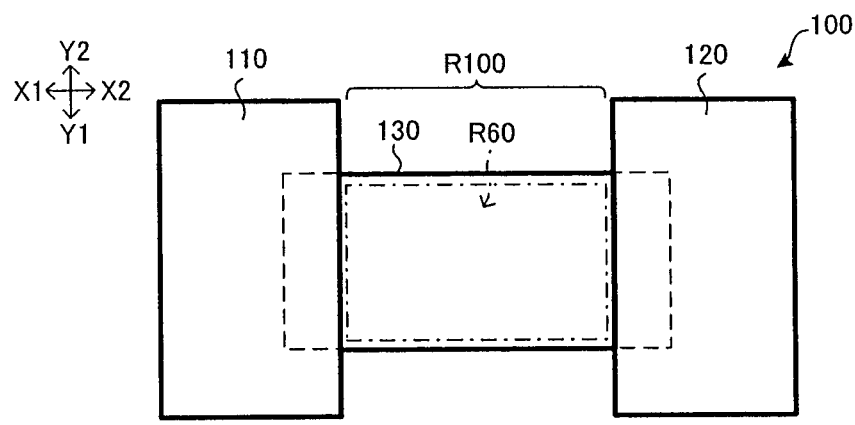
FIG. 57A is a view showing an example showing the position of space arranged between two flexible wiring boards.
Figure 57B:
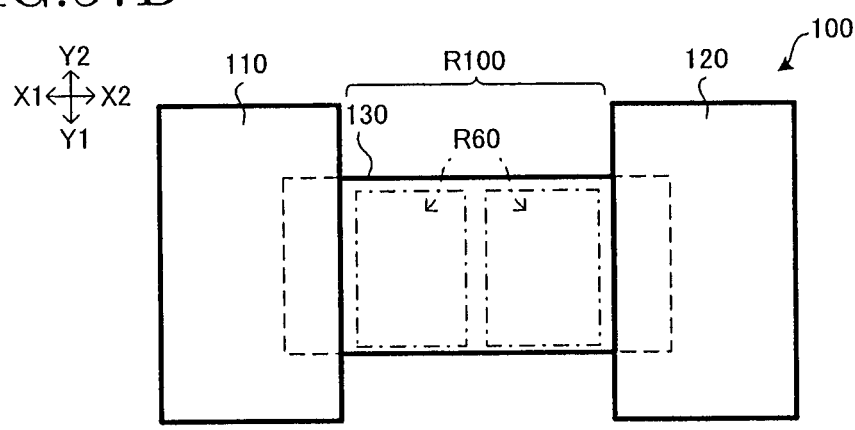
FIG. 57B is a view showing a first alternative example where the number of spaces arranged between two flexible wiring boards is modified.
Figure 57C:
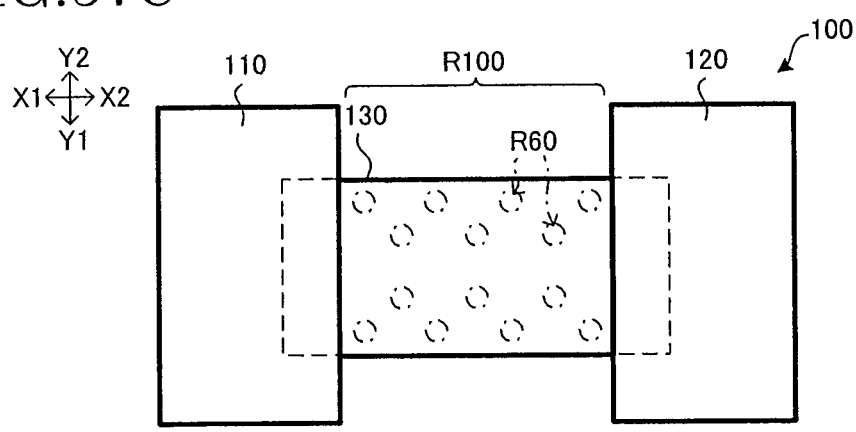
FIG. 57C is a view showing a second alternative example where the number of spaces arranged between two flexible wiring boards is modified.

It is preferred that space (R60) be positioned to extend entirely throughout flexible section (R100) as shown in FIG. 57A, for example. However, space (R60) is not limited to such, and may be positioned by being concentrated in required portions based on stress analysis or the like. The number of spaces (R60) is not limited to one, and multiple spaces may be formed. Namely, as shown in FIG. 57B, for example, two spaces (R60) may be formed, and as shown in FIG. 57C, for example, multiple spaces (R60) may also be formed. The shape of space (R60) is not limited to being a rectangular cuboid, and may be cylindrical as shown in FIG. 57C, for example. Basically, any shape, number, positioning and so forth may be employed for space (R60).

Figure 58:
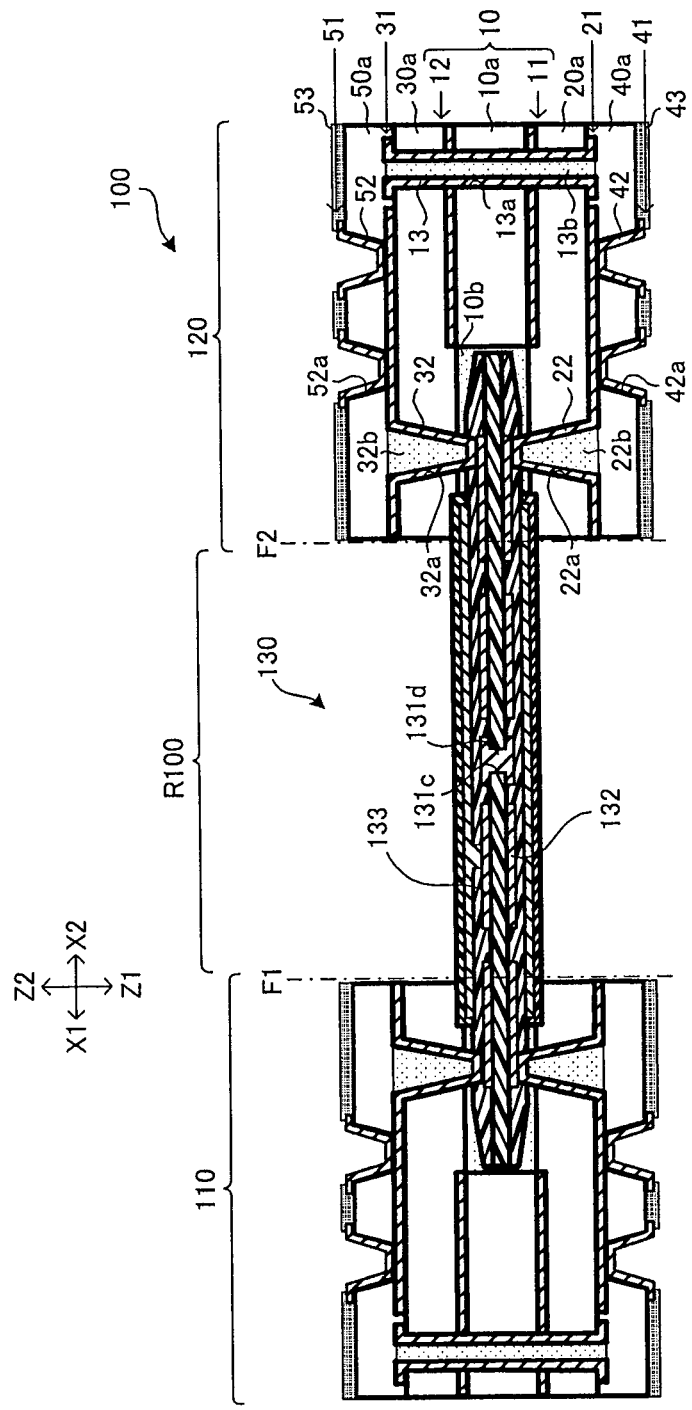
FIG. 58 is a view showing an example of a flex-rigid wiring board having a flexible wiring board where a through hole is formed in the flexible substrate.

As shown in FIG. 58, through hole (131c) (first through hole) may be formed in flexible substrate 131. Through hole (131c) penetrates through flexible substrate 131. Also, through hole (13a) (second through hole) is formed to penetrate through insulation layers (20a, 10a, 30a).

The conductive pattern (wiring layer 21) formed on insulation layer (20a) and the conductive pattern (wiring layer 31) formed on insulation layer (30a) are connected by means of the conductor in through hole (13a) (connection conductor 13). By employing such a structure, wiring layer 21 and wiring layer 31 in rigid sections (110, 120) may be electrically connected without going through flexible wiring board 130.

Wiring layer 21 is electrically connected to wiring layer 132 by means of connection conductor 22 in insulation layer (20a). Connection conductor 22 is a conductor which is filled in hole (22a) formed in insulation layer (20a), namely, a filled conductor. Wiring layer 31 is electrically connected to wiring layer 133 (second conductor) by means of connection conductor 32 in insulation layer (30a). Connection conductor 32 is a conductor which is filled in hole (32a) formed in insulation layer (30a), namely, a filled conductor. When connection conductors (22, 32) are made filled conductors, it is thought that conductive patterns (wiring layers 132, 133) in flexible wiring board 130 and conductive patterns (wiring layers 21, 31) in rigid sections (110, 120) are connected more firmly.

Figure 59A:
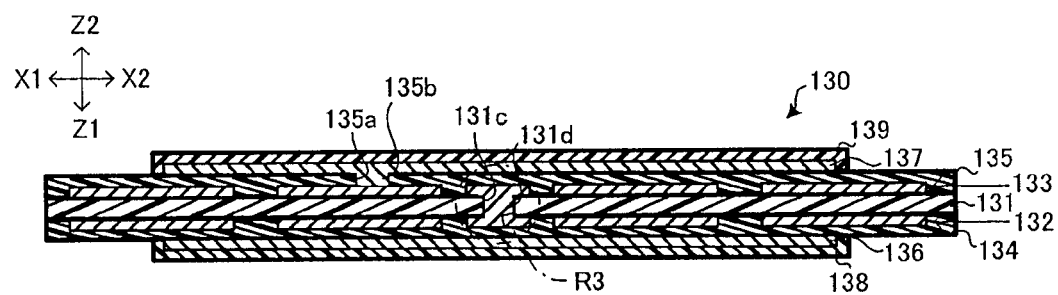
FIG. 59A is a view showing a flexible wiring board to be used in the flex-rigid wiring board shown in FIG. 58.

FIG. 59A shows magnified flexible wiring board 130 to be used in flex-rigid wiring board 100 shown in FIG. 58. In addition, FIG. 59B shows magnified region (R3) shown in FIG. 59A.

Figure 59B:
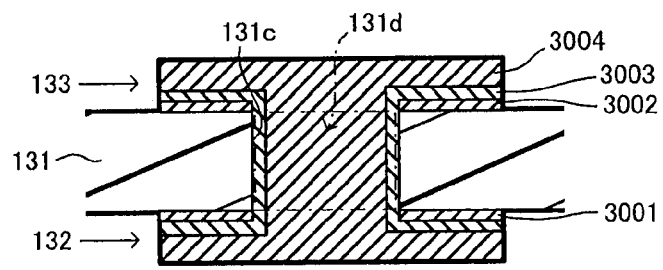
FIG. 59B is a magnified view showing part of a region shown in FIG. 59A.

In an example in FIG. 59B, conductor (131d) is filled in through hole (131c). A surface treatment such as oxidation/reduction or the like is conducted on the wall surface of through hole (131c). It is thought that the connection area increases between through hole (131c) and conductor (131d) by such a surface treatment and that their connection reliability improves. Wiring layer 132 (first conductor) formed on the first-surface side of flexible substrate 131 and wiring layer 133 (second conductor) formed on the second-surface side of flexible substrate 131 are electrically connected by means of the conductor (conductor 131d) in through hole (131c) (first through hole) formed in flexible substrate 131. In addition, the thickness of wiring layer 132 and the thickness of wiring layer 133 are set substantially the same.

On the first and second surfaces of flexible substrate 131, copper foil 3001 or 3002, electroless plating 3003 and electrolytic plating 3004 are respectively laminated from a lower layer toward an upper layer in that order. Accordingly, wiring layer 132 becomes a triple-layer conductive layer having copper foil 3001, electroless plating 3003 and electrolytic plating 3004. Also, wiring layer 133 becomes a triple-layer conductive layer having copper foil 3002, electroless plating 3003 and electrolytic plating 3004. If wiring layers are made to have a triple-layer structure as above, copper foils (3001, 3002) and flexible substrate 131 are adhered and then electroless plating 3003 and electrolytic plating 3004 are laminated on copper foils (3001, 3002). Accordingly, it is thought that flexible substrate 131 and wiring layers 132, 133 on both of its surfaces are adhered firmly.

Conductor (131d) is formed with electroless plating 3003 and electrolytic plating 3004. Flexible substrate 131 is made of polyimide, for example. Wiring layers (132, 133), electroless plating 3003 and electrolytic plating 3004 are made of copper, for example.

Wiring layer 132, conductor (131d) in through hole (131c) and wiring layer 133 are formed to be contiguous from the first-surface side of flexible substrate 131 toward the second-surface side. Wiring layer 132 and wiring layer 133 are connected by a junction conductor (131d). Accordingly, a cylinder (conductor 131d) which connects wiring layer 132 and wiring layer 133 is formed in flexible substrate 131. It is thought that wiring layers (132, 133) are secured through the pinning effect of the cylinder and that stability is enhanced in wiring layers (132, 133) formed on the upper and lower surfaces of flexible substrate 131, which has flexibility. In addition, as a result, it is also thought that the positioning stability of the F-R connection sections is improved, leading to enhanced connection reliability.

Figure 60A:
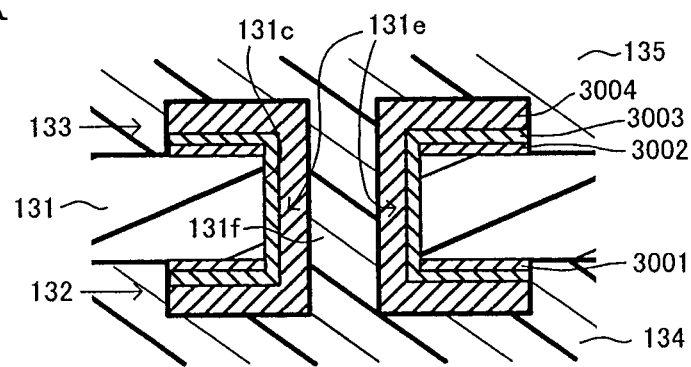
FIG. 60A is a view showing an example where the conductor in a through hole formed in a flexible substrate is a conformal conductor.

As shown in FIG. 60A, a conformal conductor (conductor 131e) may be used instead of a connection conductor (conductor 131d) to obtain the same structure as above. In an example in FIG. 60A, conductor (131e) is formed on the wall surface of through hole (131c). Conductor (131e) is formed with electroless plating 3003 and electrolytic plating 3004. In such a case, resin (1310, for example, is filled inside conductor (131e). Resin (1310 is filled by the material of inner coverlay 134 or 135 flowing into through hole (131c), for example.

Figure 60B:
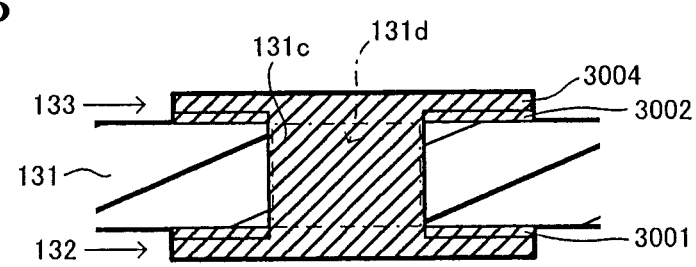
FIG. 60B is a view showing an example where the conductor in a through hole formed in a flexible substrate is made only of electrolytic plating.

If adhesiveness is achieved between electrolytic plating 3004 and flexible substrate 131, electroless plating 3003 may be omitted as shown in FIG. 60B. Alternatively, unless required, copper foils (3001, 3002) may be omitted as well.

Figure 61:
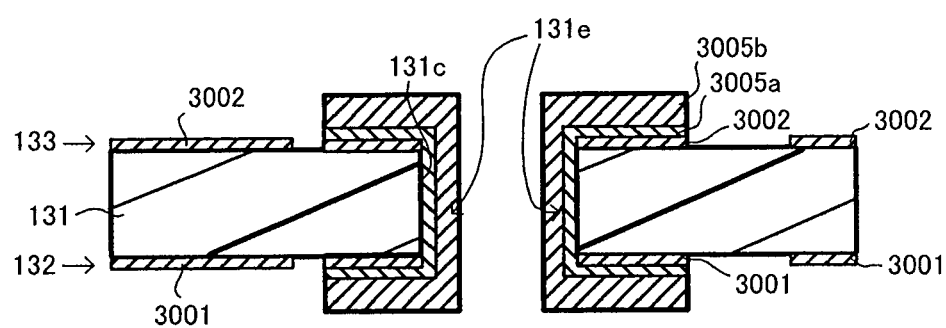
FIG. 61 is a view showing an example where only part of a wiring layer on a flexible substrate is formed to have a triple-layer structure.

To enhance the adhesiveness of wiring layer 132 or 133, it is preferred that the entire wiring layer 132 or 133 be made a triple-layer structure having copper foil 3001 or 3002, electroless plating 3003 and electrolytic plating 3004 as described above. However, wiring layer 132 or 133 is not limited to such, and only part of wiring layer 132 or 133 may have a triple-layer structure as shown in FIG. 61, for example. In an example shown in FIG. 61, wiring layers (132, 133) are triple-layer conductive layers having copper foil 3001 or 3002, electroless plating (3005a) and electrolytic plating (3005b) near through hole (131c). In the rest of the portions, wiring layers (132, 133) are formed as a single layer each having copper foil 3001 or 3002.

Figure 62A:
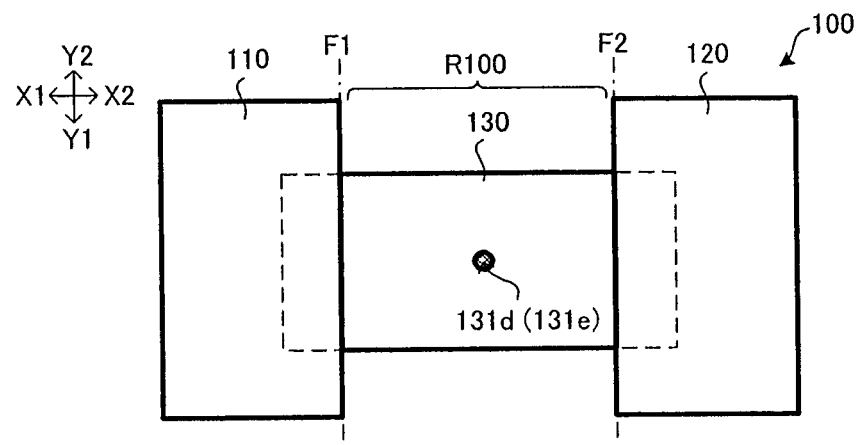
FIG. 62A is a view showing a first example of the position of a through hole formed in a flexible substrate.
Figure 62B:
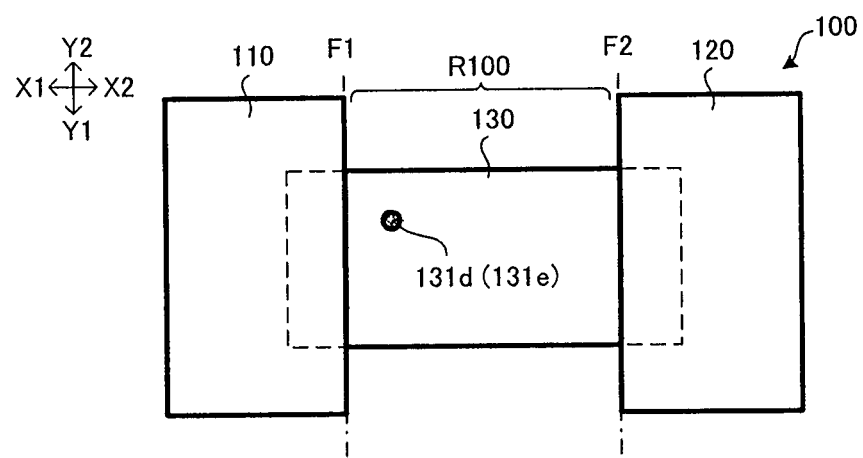
FIG. 62B is a view showing a second example of the position of a through hole formed in a flexible substrate.

Conductor (131d) or (131e) is preferred to be positioned in the middle between rigid section 110 and rigid section 120 as shown in FIG. 62A, for example. However, it may be positioned closer to either rigid section 110 or 120 as shown in FIG. 62B. Conductor (131d) or (131e) is preferred to be positioned in flexible section (R100) as shown in FIGS. 62A, 62B). However, its positioning is not limited to such, and conductor (131d) or (131e) may be positioned in rigid section 110 beside F-R boundary surface (F1) or in rigid section 120 beside F-R boundary surface (F2).

Figure 63:
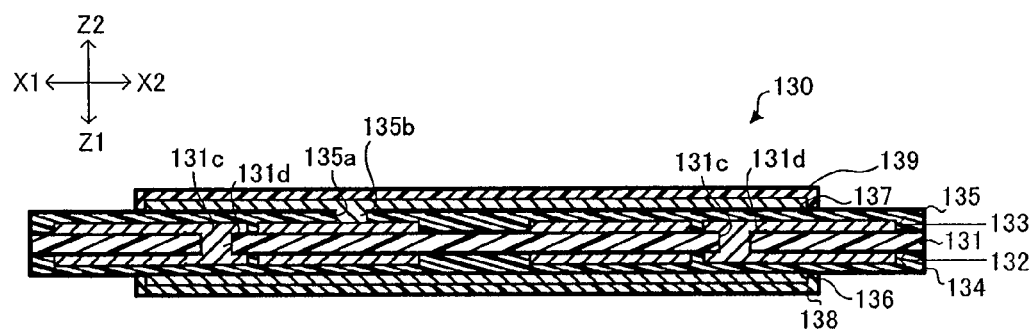
FIG. 63 is a view showing an example where the number of conductors in through holes formed in a flexible substrate is greater than one.

The number of conductors (131d) or (131e) is not limited specifically. For example, as shown in FIG. 63, flexible wiring board 130 may have multiple (two, for example) conductors (131d). Alternatively, flexible wiring board 130 may also have multiple (two, for example) conductors (131e).

Figure 64:
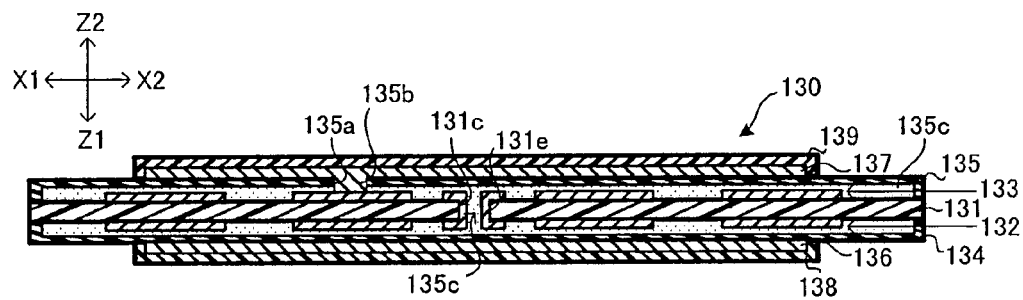
FIG. 64 is a view showing an example where the adhesive forming coverlays is filled in a through hole formed in a flexible substrate.

As shown in FIG. 64, inner coverlays (134, 135) may be adhered to flexible substrate 131 using adhesive agent (135c). In such a case, when inner coverlays (134, 135) are adhered, adhesive agent (135c) is preferred to be filled in through hole (131c). By doing so, another step to fill resin in through hole (131c) may be omitted, and it is thought that a simplified procedure may be employed.

In the following, a method for manufacturing flexible wiring board 130 shown in FIGS. 58-59B is described.

Figure 65A:
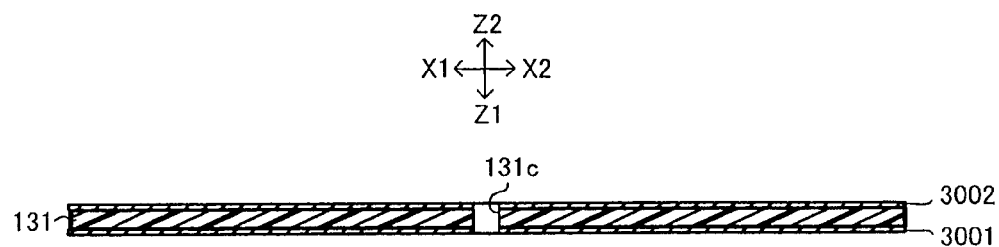
FIG. 65A is a view to illustrate a first step of a method for manufacturing a flexible wiring board shown in FIGS. 58-59B.

First, a double-sided copper-clad laminate (starting material) is prepared the same as in the above-described step shown in FIG. 10A. Then, as shown in FIG. 65A, through hole (131c) is formed in the double-sided copper-clad laminate by a laser, for example.

Figure 65B:
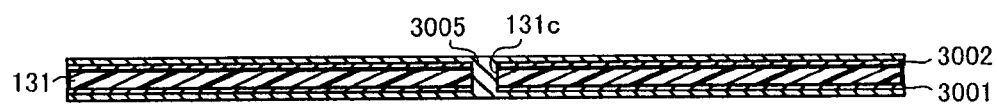
FIG. 65B is a view to illustrate a second step subsequent to the step in FIG. 65A.

Next, as shown in FIG. 65B, plating 3005 is formed by copper panel plating, for example. Specifically, electroless plating and electrolytic plating are performed in that order to form plating 3005 made of electroless plating 3003 and electrolytic plating 3004 (see FIG. 59B). During that time, to enhance the adhesiveness of the plating, a surface treatment or the like may be conducted if required.

When manufacturing flexible wiring board 130 as shown in FIG. 60A, plating 3005 is formed only on the wall surface of through hole (131c) by performing electroless plating and electrolytic plating. Alternatively, when manufacturing flexible wiring board 130 as shown in FIG. 60B, plating 3005 made of electrolytic plating 3004 is formed by performing electrolytic plating.

Figure 65C:
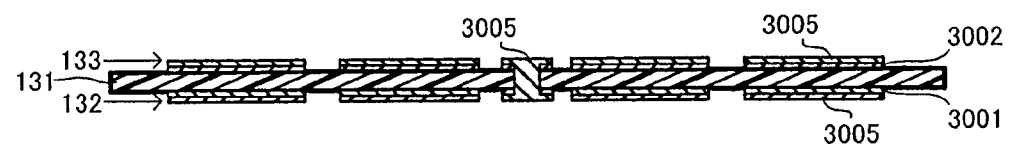
FIG. 65C is a view to illustrate a third step subsequent to the step in FIG. 65B.

Next, as shown in FIG. 65C, conductive layers on both surfaces of flexible substrate 131 are patterned by a lithographic technique, for example. Accordingly, wiring layers (132, 133) are formed.

Then, using the same method as for flexible wiring board 130 according to the above second embodiment, for example, inner coverlays (134, 135), shield layers (136, 137) and outer coverlays (138, 139) are formed. Accordingly, flexible wiring board 130 is completed.

Basically, flexible wiring board 130 may be formed freely. For example, as shown in FIGS. 66A-66C, the width of flexible wiring board 130 may be partially enlarged.

Figure 66A:
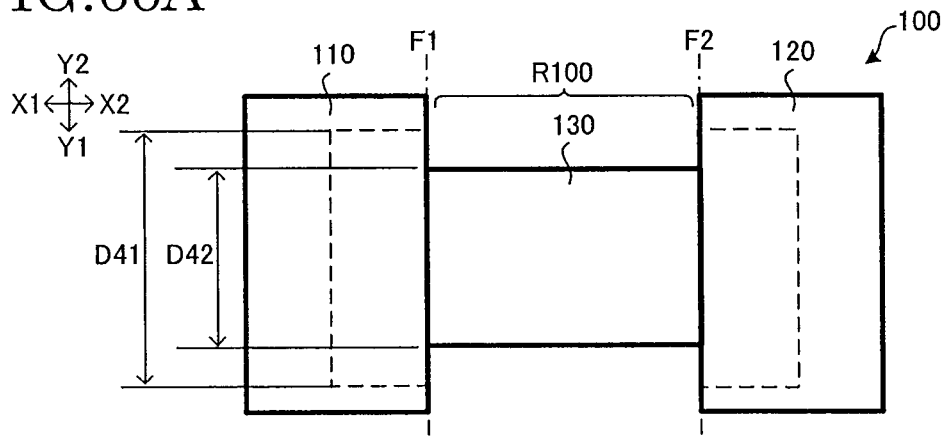
FIG. 66A is a view showing a first example where the width of a flexible wiring board is partially enlarged.

In an example shown in FIG. 66A, when flexible wiring board 130 is divided into two regions at the boundary (F-R boundary surface F1 or F2) between rigid section 110 or 120 and flexible section (R100), width (D41) of the region in rigid section 110 or 120 (the portion where flexible wiring board 130 is inserted into rigid section 110 or 120) is set greater than width (D42) of the region in flexible section (R100) (D41>D42). Accordingly, the connection area increases between flexible wiring board 130 and rigid section 110 or 120. As a result, it is thought that connection reliability is enhanced in the F-R connection sections. If width (D41) or (D42) is not constant (for example, see FIGS. 66B and 66C), which width is greater may be determined by a comparison of their average values.

Figure 66B:
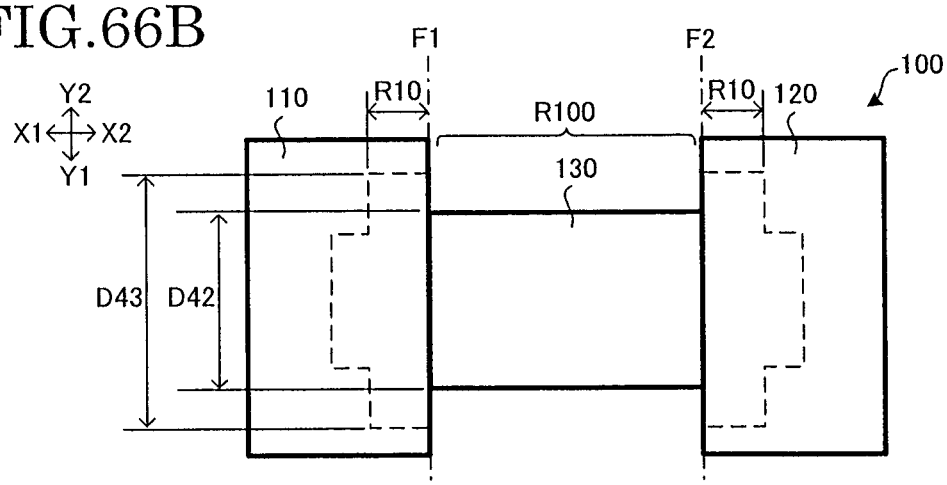
FIG. 66B is a view showing a second example where the width of a flexible wiring board is partially enlarged.

Alternatively, as shown in FIG. 66B, the width of flexible wiring board 130 may be enlarged in region (RIO) (see also FIG. 4) where rigid section 110 or 120 and flexible wiring board 130 are laminated and connected. In such an example, width (D43) of region (R10) is set greater than width (D42) of flexible section (R100) (D43>D42). It is thought that such a structure also enhances connection reliability in the F-R connection sections the same as in the example shown in FIG. 66A.

Figure 66C:
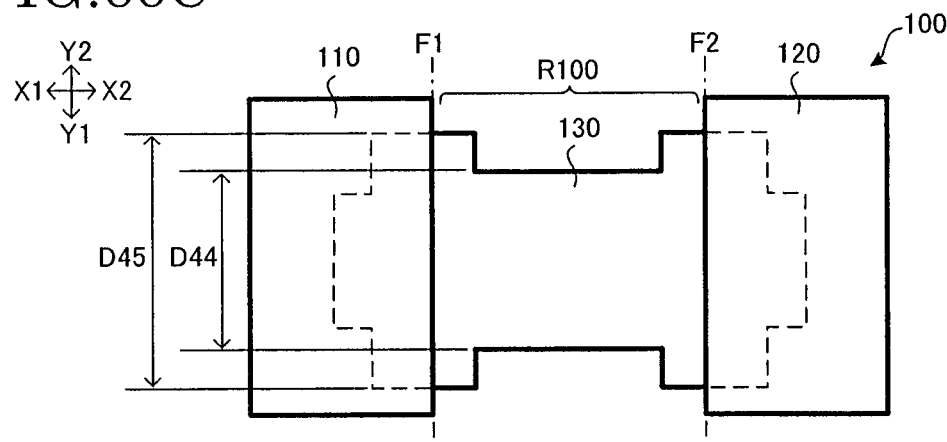
FIG. 66C is a view showing a third example where the width of a flexible wiring board is partially enlarged.

Alternatively, as shown in FIG. 66C, the width of flexible wiring board 130 may also be enlarged near the boundary (F-R boundary surface F1 or F2) between rigid section 110 or 120 and flexible section (R100). In such an example, the width of flexible wiring board 130 is enlarged from (D44) to (D45) near the boundary (D45>D44). It is thought that such a structure also enhances connection reliability at the F-R connection sections the same as in the example shown in FIG. 66A.

Flex-rigid wiring board 100 may contain electronic components and become an electronic device.

Figure 67:
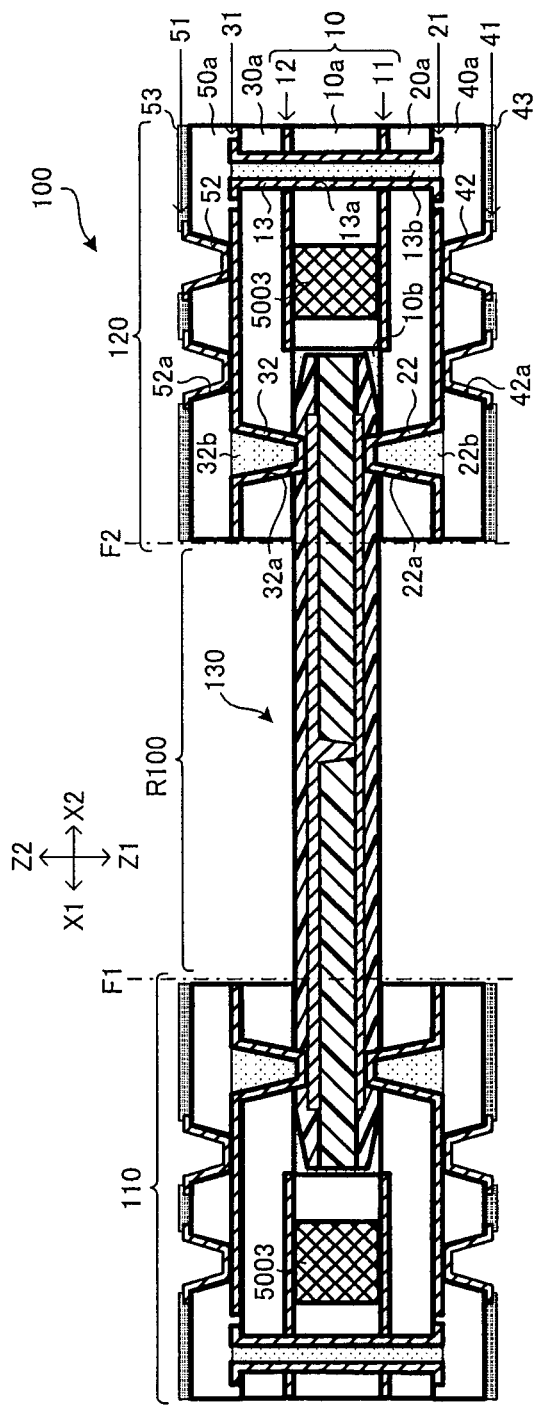
FIG. 67 is a view showing an example of a flex-rigid wiring board having built-in electronic components.

Flexible wiring board 100 may contain built-in electronic components. For example, as shown in FIG. 67, electronic components 5003 may be built in rigid sections (110, 120). In an example shown in FIG. 67, two electronic components 5003 are built into the board. However, the number of electronic components is not limited specifically. For example, rigid section 110 or 120 may have two or more built-in electronic components. Alternatively, an electronic component may be built into only either rigid section 110 or 120. Using flex-rigid wiring board 100 with built-in electronic components, the electronic device becomes highly functional.

Figure 68:
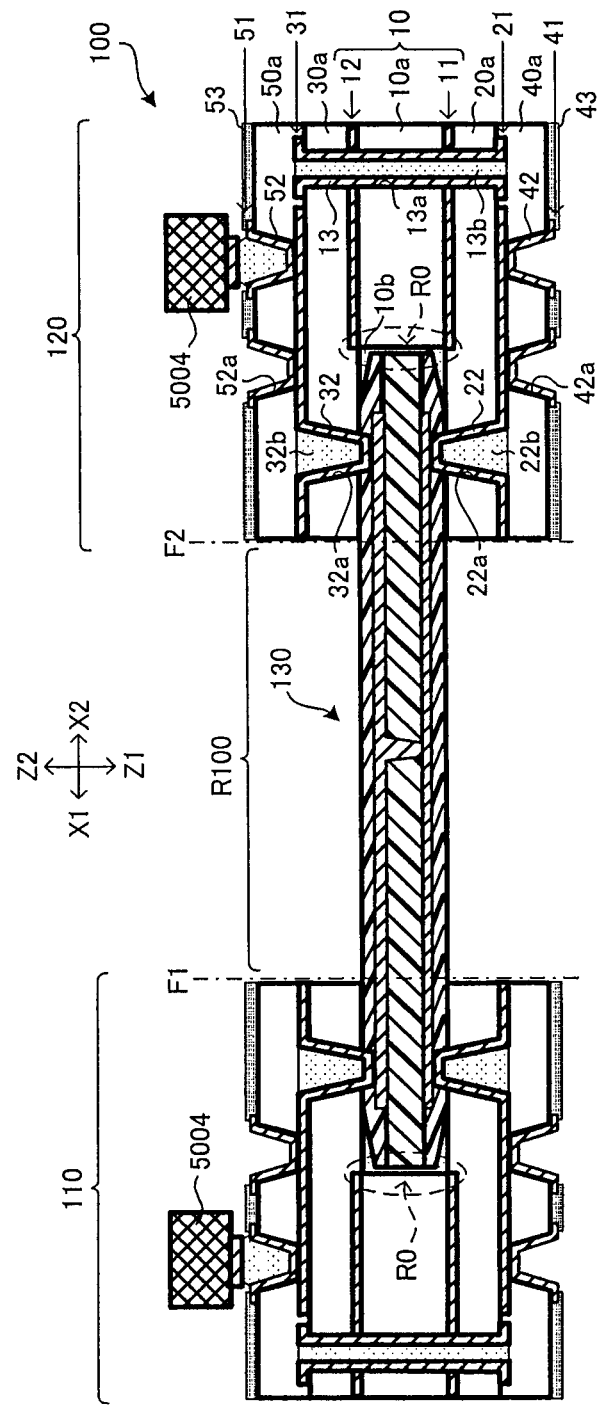
FIG. 68 is a view showing an example of a flex-rigid wiring board having electronic components mounted on its surface.

Alternatively, as shown in FIG. 68, for example, electronic components 5004 may be mounted on a surface of rigid sections (110, 120). In an example shown in FIG. 68, two electronic components 5004 are mounted. However, the number of electronic components is not limited specifically. For example, two or more electronic components may be mounted on rigid section 110 or 120. Alternatively, an electronic component may be mounted only on either rigid section 110 or 120.

Figure 69:
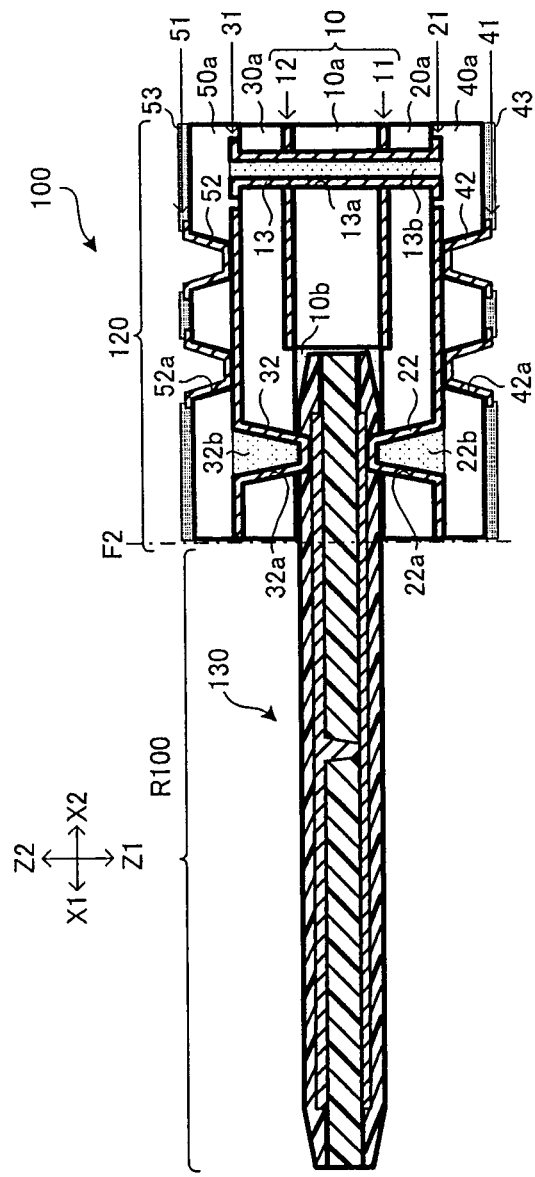
FIG. 69 is a view showing an example of a flying-tail structure.

The number of rigid sections is not limited specifically. For example, as shown in FIG. 69, the present invention may be applied to a structure in which only one end of flexible wiring board 130 is connected to rigid section 110 and the other end is not connected to any, a so-called flying-tail structure. In a flying-tail structure, flexible wiring board 130 protrudes like a tail from rigid section 120. Alternatively, three or more rigid sections may be connected by splitting flexible wiring board 130 or the like.

Regarding other factors, structures of rigid sections (110, 120), flexible wiring board 130 or the like, as well as the type, performance, size, quality, shape, number of layers, positioning and so forth of the elements of such structures, may be modified freely within a scope that does not deviate from the gist of the present invention.

The number of layers in rigid sections (110, 120) and flexible wiring board 130 is not limited specifically. For example, to achieve high functionality, they may be formed to be further multilayered wiring boards. Alternatively, they may be formed as a wiring board with fewer layers (for example, two layers made of a single-layer core section and a single-layered built-up section). Yet alternatively, the number of layers on each surface (first surface, second surface) of the core section may be different. Alternatively still, layers (wiring layers and insulation layers) may be formed (laminated) on only one surface of the core section.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluororesin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each wiring layer and each insulation layer may be formed with multiple layers having different materials.

The conductors formed inside holes in built-up sections may be connection conductors or conformal conductors. However, to secure wiring space, connection conductors are preferred.

The steps in the above embodiments are not limited to the order and contents shown in the flowchart in FIG. 6. The order and contents may be modified freely within a scope that does not deviate from the gist of the present invention. Also, unnecessary steps may be omitted according to usage requirements or the like.

For example, forming various conductive patterns is not limited to any specific method. Conductive patterns may be formed by any one of the following, or any combination of two or more such methods: panel plating method, pattern plating method, full-additive method, semi-additive (SAP) method, subtractive method and tenting method.

The above first through third embodiments and alternative examples may be combined. For example, structures regarding an end surface of flexible wiring board 130 shown in FIGS. 29-33, structures regarding insulation layers shown in FIG. 34-36, structures regarding tapered portions shown in FIGS. 37A-38B, structures regarding connection conductors shown in FIGS. 39A-44A, and other structures shown in FIGS. 45-69 may be combined freely. Alternatively, those structures may be applied to any of the first through third embodiments.

A flex-rigid wiring board according to one aspect of the present invention has an insulative substrate, a flexible wiring board positioned beside the insulative substrate, and an insulation layer positioned on a boundary portion between the insulative substrate and the flexible wiring board and exposing at least part of the flexible wiring board. In such a rigid-flex wiring board, the flexible wiring board is made thinner at an end portion beside the insulative substrate.

A method for manufacturing a flex-rigid wiring board according to another aspect of the present invention includes the following: positioning a flexible wiring board beside an insulative substrate; positioning an insulation layer on a boundary portion between the insulative substrate and the flexible wiring board so that at least part of the flexible wiring board is exposed; and pressing and integrating the insulative substrate, the flexible wiring board and the insulation layer which are positioned as above, and reducing the thickness of the flexible wiring board at an end portion beside the insulative substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
    an insulative substrate;
    a flexible wiring board positioned beside the insulative substrate; and
    an insulation layer positioned over the insulative substrate and the flexible wiring board and exposing at least a portion of the flexible wiring board,
    wherein the flexible wiring board has a tapered portion which is made thinner toward the insulative substrate at an end portion of the flexible wiring board positioned beside the insulative substrate, the flexible wiring board has a non-tapered portion positioned adjacent to the tapered portion and including a connection portion in which a conductive pattern of the flexible wiring board is electrically connected to a conductive pattern on the insulation layer, and the tapered portion of the flexible wiring board is made thinner than the non-tapered portion of the flexible wiring board.

2. The flex-rigid wiring board according to claim 1, further comprising:
    a wiring layer formed in the flexible wiring board and comprising the conductive pattern; and
    a wiring layer formed on the insulation layer and having the conductive pattern,
    wherein the conductive pattern of the flexible wiring board is electrically connected to the conductive pattern of the wiring layer on the insulation layer.

3. The flex-rigid wiring board according to claim 2, wherein the tapered portion of the flexible wiring board has a thickness which is set to be 90% or less of a thickness of the non-tapered portion.

4. The flex-rigid wiring board according to claim 1, wherein the flexible wiring board comprises a flexible substrate and a coverlay positioned on the flexible substrate, and at least one of the flexible substrate and the coverlay has a thickness which is made thinner at the end portion of the flexible wiring board.

5. The flex-rigid wiring board according to claim 1, further comprising a wiring layer comprising a conductor and formed on the insulation layer, wherein the flexible wiring board has a wiring layer comprising a conductor, the insulation layer has a hole and a conductor formed in the hole, the wiring layer on the insulation layer is connected to the wiring layer in the flexible wiring board by the conductor in the hole formed in the insulation layer, and the hole and the conductor in the hole are formed in the connection portion of the flexible wiring board.

6. The flex-rigid wiring board according to claim 1, wherein the tapered portion of the flexible wiring board is a portion which becomes continuously thinner.

7. The flex-rigid wiring board according to claim 1, wherein the tapered portion of the flexible wiring board is a portion which becomes thinner in steps.

8. The flex-rigid wiring board according to claim 1, wherein the flexible wiring board has an end surface facing the insulative substrate and having a slope which inclines toward a surface of the flexible wiring board facing the insulation layer.

9. The flex-rigid wiring board according to claim 1, wherein the insulative substrate has an end surface facing the flexible wiring board and having a slope which inclines toward a surface of the insulative substrate facing the insulation layer.

10. The flex-rigid wiring board according to claim 1, wherein the flexible wiring board has an end surface facing the insulative substrate and having a slope which inclines toward a surface of the flexible wiring board facing the insulation layer, the insulative substrate has an end surface facing the flexible wiring board and having a slope which inclines toward a surface of the insulative substrate facing the insulation layer, and the end surface of the flexible wiring board and the end surface of the insulative substrate are set substantially parallel.

11. The flex-rigid wiring board according to claim 1, wherein the flexible wiring board has an end surface facing the insulative substrate and having a slope which inclines toward a surface of the flexible wiring board facing the insulation layer, the insulative substrate has an end surface facing the flexible wiring board and having a slope which inclines toward a surface of the insulative substrate facing the insulation layer, and the end surface of the flexible wiring board and the end surface of the insulative substrate are not set parallel.

12. The flex-rigid wiring board according to claim 1, further comprising a second insulation layer positioned on the insulation layer, wherein the insulation layer and the second insulation layer have tapered portions which become thinner toward the portion of the flexible wiring board exposed by the insulation layer.

13. The flex-rigid wiring board according to claim 12, wherein the tapered portions of the insulation layer and second insulation layer have thicknesses which decrease in steps.

14. The flex-rigid wiring board according to claim 12, wherein the tapered portions of the insulation layer and second insulation layer have thicknesses which decrease continuously.

15. The flex-rigid wiring board according to claim 1, further comprising a wiring layer comprising a conductor and formed on the insulation layer, wherein the flexible wiring board has a wiring layer comprising a conductor, and the insulation layer has a hole and a via-hole conductor formed in the hole by plating such that the via-hole conductor is connecting the wiring layer on the insulation layer to the wiring layer in the flexible wiring board in the connection portion of the flexible wiring board.

16. The flex-rigid wiring board according to claim 1, further comprising a wiring layer comprising a conductor and formed on the insulation layer, wherein the flexible wiring board has a wiring layer comprising a conductor, and the insulation layer has a hole penetrating only through the insulation layer and a conductor formed in the hole such that the conductor in the hole is connecting the wiring layer on the insulation layer to the wiring layer in the flexible wiring board in the connection portion of the flexible wiring board.

17. The flex-rigid wiring board according to claim 1, further comprising a wiring layer comprising a conductor and formed on the insulation layer, wherein the flexible wiring board has a wiring layer comprising a conductor, and the insulation layer has a hole penetrating only through the insulation layer and a via-hole conductor formed in the hole by plating such that the via-hole conductor is connecting the wiring layer on the insulation layer to the wiring layer in the flexible wiring board in the connection portion of the flexible wiring board.

18. The flex-rigid wiring board according to claim 1, further comprising a second flexible wiring board, wherein the second flexible wiring board is positioned such that the flexible wiring board is detached from the second flexible wiring board in a thickness direction of the flexible wiring board and the second flexible wiring board.

19. The flex-rigid wiring board according to claim 18, further comprising a wiring layer comprising a conductor and formed on the insulation layer, wherein the flexible wiring board has a wiring layer comprising a conductor, and the insulation layer has a hole and a conductor filled in the hole such that the conductor in the hole is connecting the wiring layer on the insulation layer to the wiring layer in the flexible wiring board in the connection portion of the flexible wiring board.

20. The flex-rigid wiring board according to claim 18, further comprising a bonding sheet connecting the flexible wiring board and the second flexible wiring board.

21. The flex-rigid wiring board according to claim 18, further comprising a shield layer formed as an upper layer of a conductive pattern of at least one of the flexible wiring board and the second flexible wiring board.

22. The flex-rigid wiring board according to claim 18, wherein at least one of the flexible wiring board and the second flexible wiring board has a full plain conductive pattern.

23. The flex-rigid wiring board according to claim 18, wherein the flexible wiring board and the second wiring board form a space which is capable of being decompressed.

24. The flex-rigid wiring board according to claim 18, further comprising a filler filling a space formed between the flexible wiring board and the second flexible wiring board.

25. The flex-rigid wiring board according to claim 18, further comprising:
    a wiring layer comprising a conductor and formed on the insulation layer;
    a second insulation layer positioned on an opposite side of the insulation layer over the insulative substrate and the second flexible wiring board and exposing at least a portion of the second flexible wiring board; and
    a wiring layer comprising a conductor and formed on the second insulation layer,
    wherein the flexible wiring board has a wiring layer comprising a conductor, the insulation layer has a hole and a conductor formed in the hole in the insulation layer such that the conductor in the hole is connecting the wiring layer on the insulation layer to the wiring layer in the flexible wiring board in the connection portion of the flexible wiring board, the second flexible wiring board has a wiring layer comprising a conductor and, and the second insulation layer has a hole and a conductor formed in the hole in the second insulation layer such that the conductor in the hole in the second insulation layer is connecting the wiring layer on the second insulation layer to the wiring layer in the second flexible wiring board.

26. The flex-rigid wiring board according to claim 25, further comprising a bonding sheet connecting the flexible wiring board and the second flexible wiring board.

27. The flex-rigid wiring board according to claim 1, wherein the flexible wiring board comprises a flexible substrate, a first wiring layer comprising a conductor and formed on a first surface of the flexible substrate, and a second wiring layer comprising a conductor and formed on a second surface of the flexible substrate, the flexible substrate has a through hole and a through-hole conductor formed in the through hole, the first wiring layer is connected to the second wiring layer by the through-hole conductor in the through hole formed in the flexible substrate.

28. The flex-rigid wiring board according to claim 27, wherein at least one of the conductors of the first and second wiring layers has a portion which is a triple-layer conductive layer comprising a metal foil, an electroless plating and an electrolytic plating.

29. The flex-rigid wiring board according to claim 28, wherein the conductor of the first wiring layer is a triple-layer conductive layer comprising a metal foil, an electroless plating and an electrolytic plating, and the conductor of the second wiring layer is a triple-layer conductive layer comprising a metal foil, an electroless plating and an electrolytic plating.

30. The flex-rigid wiring board according to claim 27, further comprising:
    a coverlay provided to the flexible substrate; and
    an adhesive agent adhering the coverlay to the flexible substrate,
    wherein the adhesive agent on the coverlay is filled in the through hole in the flexible substrate.

31. The flex-rigid wiring board according to claim 27, wherein the through hole in the flexible substrate has a wall surface treated with a surface treatment.

32. The flex-rigid wiring board according to claim 27, further comprising:
a wiring layer comprising a conductor and formed on the insulation layer;
a second insulation layer positioned on an opposite side of the insulation layer over the insulative substrate and the flexible wiring board and exposing at least a portion of the flexible wiring board; and
a wiring layer comprising a conductor and formed on the second insulation layer,
wherein the insulative substrate, the insulation layer and the second insulation layer have a through hole formed through the insulative substrate, the insulation layer and the second insulation layer, and a through-hole conductor formed in the through hole through the insulative substrate, the insulation layer and the second insulation layer such that the through-hole conductor is connecting the wiring layer formed on the insulation layer to the wiring layer formed on the second insulation layer through the insulative substrate, the insulation layer and the second insulation layer in the connection portion of the flexible wiring board.

33. The flex-rigid wiring board according to claim 27, further comprising:
a wiring layer comprising a conductor and formed on the insulation layer;
a second insulation layer positioned on an opposite side of the insulation layer over the insulative substrate and the flexible wiring board and exposing at least a portion of the flexible wiring board;
a wiring layer comprising a conductor and formed on the second insulation layer,
wherein the insulation layer has a hole and a conductor formed in the hole in the insulation layer such that the conductor in the hole is connecting the wiring layer on the insulation layer to the first wiring layer in the flexible wiring board in the connection portion of the flexible wiring board, and the second insulation layer has a hole and a conductor formed in the hole in the second insulation layer such that the conductor in the hole of the second insulation layer is connecting the wiring layer on the second insulation layer to the second wiring layer in the flexible wiring board in the connection portion of the flexible wiring board.

34. The flex-rigid wiring board according to claim 27, further comprising a wiring layer comprising a conductor and formed on the insulation layer, wherein the insulation layer has a hole and a conductor filled in the hole formed in the insulation layer such that the conductor in the hole is connecting the wiring layer on the insulation layer to the first wiring layer in the flexible wiring board in the connection portion of the flexible wiring board.

35. The flex-rigid wiring board according to claim 1, wherein the insulative substrate and the insulation layer form a rigid section of the flex-rigid wiring board, and the rigid section has a protruding portion protruding from a boundary surface between the insulation layer and the portion of the flexible wiring board exposed by the insulation layer.

36. The flex-rigid wiring board according to claim 1, further comprising a wiring layer comprising a conductor and formed on the insulation layer, wherein the insulation layer and the flexible wiring board have a through hole penetrating through the insulation layer and the flexible wiring board, and a through-hole conductor formed in the through hole, the flexible wiring board has a wiring layer formed in the flexible wiring board, and the through-hole conductor is connecting the wiring layer on the insulation layer to the wiring layer in the flexible wiring board in the connection portion of the flexible wiring board.

37. The flex-rigid wiring board according to claim 1, further comprising a wiring layer comprising a conductor and formed on the insulation layer, wherein the flexible wiring board has a wiring layer formed in the flexible wiring board, and the insulation layer has a hole and a conductor formed in the hole such that the conductor in the hole is connecting the wiring layer on the insulation layer to the wiring layer in the flexible wiring board in the connection portion of the flexible wiring board, and the conductor in the hole formed in the insulation layer is made of a conductive paste.

38. The flex-rigid wiring board according to claim 1, wherein the insulative substrate and the insulation layer form a plurality of rigid sections of the flex-rigid wiring board, and the rigid sections of the flex-rigid wiring board have a different number of layers from each other.

39. The flex-rigid wiring board according to claim 1, wherein a flex-rigid wiring board has a built-in electronic component in the flex-rigid wiring board.

40. The flex-rigid wiring board according to claim 1, wherein the flex-rigid wiring board has an electronic component mounted on a surface of the flex-rigid wiring board.

41. The flex-rigid wiring board according to claim 1, wherein the insulative substrate and the insulation layer form a rigid section of the flex-rigid wiring board, and only one end of the flexible wiring board is connected to the rigid section of the flex-rigid wiring board.

42. The flex-rigid wiring board according to claim 1, wherein the flexible wiring board has a width which is enlarged toward a boundary between the insulation layer and the portion of the flexible wiring board exposed by the insulation layer.

43. The flex-rigid wiring board according to claim 1, wherein the flexible wiring board has a width which is enlarged in a region where the insulation layer and flexible wiring board are laminated and connected.

44. The flex-rigid wiring board according to claim 1, wherein the flexible wiring board has a wiring layer having the conductive pattern which fans out.

\* \* \* \* \*